(12) United States Patent
Nanami

(10) Patent No.: US 12,439,598 B2
(45) Date of Patent: Oct. 7, 2025

(54) METHOD OF MANUFACTURING SEMICONDUCTOR MEMORY DEVICE AND SEMICONDUCTOR MEMORY DEVICE

(71) Applicant: Kioxia Corporation, Tokyo (JP)

(72) Inventor: Kyosuke Nanami, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 590 days.

(21) Appl. No.: 17/901,642

(22) Filed: Sep. 1, 2022

(65) Prior Publication Data

US 2023/0301094 A1    Sep. 21, 2023

(30) Foreign Application Priority Data

Mar. 18, 2022   (JP) ................... 2022-044482

(51) Int. Cl.
*H10B 43/27*     (2023.01)
*H01L 21/311*    (2006.01)

(52) U.S. Cl.
CPC ........ *H10B 43/27* (2023.02); *H01L 21/31144* (2013.01)

(58) Field of Classification Search
CPC ............. H10B 43/27; H01L 21/31144
See application file for complete search history.

(56) References Cited

U.S. PATENT DOCUMENTS

| | | | |
|---|---|---|---|
| 2014/0057429 A1* | 2/2014 | Oh | H10B 43/50 438/674 |
| 2015/0214103 A1 | 7/2015 | Matsuda | |
| 2019/0214268 A1 | 7/2019 | Sawano et al. | |
| 2019/0221574 A1* | 7/2019 | Shimabukuro | H10B 41/20 |
| 2019/0273089 A1* | 9/2019 | Yamamoto | H01L 21/76829 |
| 2021/0091002 A1 | 3/2021 | Shimizu | |
| 2022/0223469 A1* | 7/2022 | Wang | H10B 41/27 |

FOREIGN PATENT DOCUMENTS

| | | |
|---|---|---|
| JP | 6129756 B2 | 4/2017 |
| JP | 2019121769 A | 7/2019 |
| JP | 2021048348 A | 3/2021 |

* cited by examiner

*Primary Examiner* — Zandra V Smith
*Assistant Examiner* — Andre C Stevenson
(74) *Attorney, Agent, or Firm* — Holtz, Holtz & Volek PC

(57) ABSTRACT

According to one embodiment, a method of manufacturing a semiconductor memory device includes: repeating multiple times of a process of etching away one pair of first and second insulating layers of a stacked body exposed from a second mask layer, among a plurality of first and second insulating layers, with retracting the second mask layer in a first direction toward a first side by slimming; removing the second mask layer undergone multiple times of the slimming; removing a first stopper layer exposed on the first side; and repeating multiple times of a process of etching away one pair of first and second insulating layers of the stacked body exposed from a first mask layer, among the plurality of first and second insulating layers, with retracting the first mask layer in the first direction by slimming.

16 Claims, 28 Drawing Sheets

FIG.19A  FIG.19B  FIG.19C
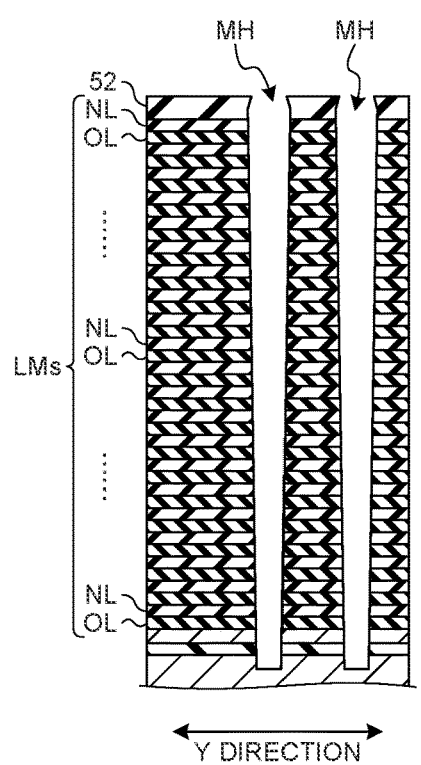 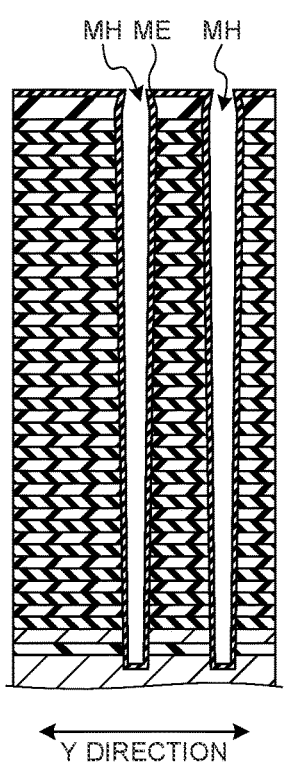 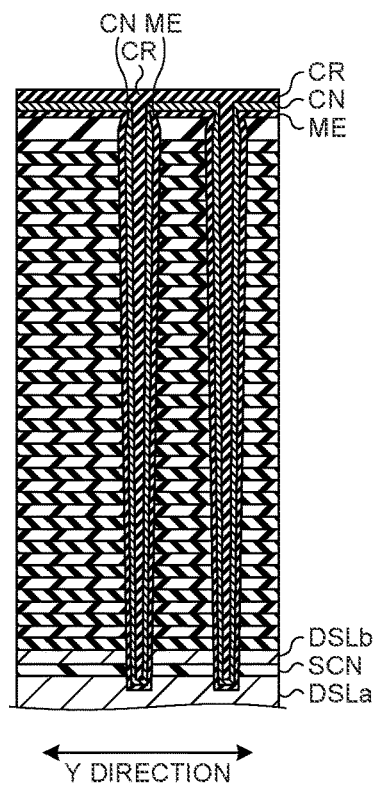
FIG.20A  FIG.20B  FIG.20C
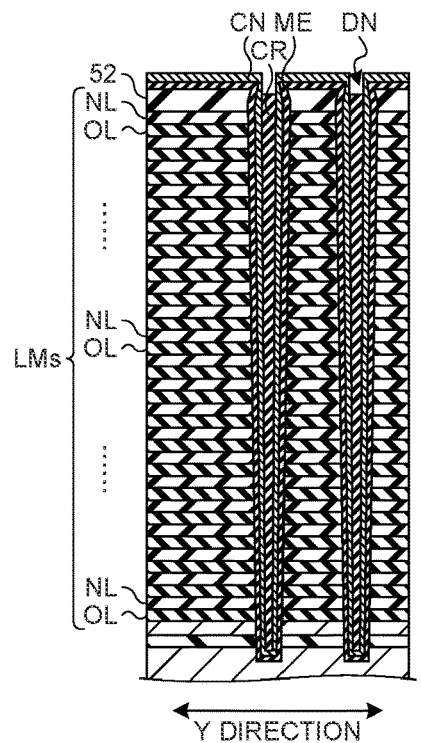 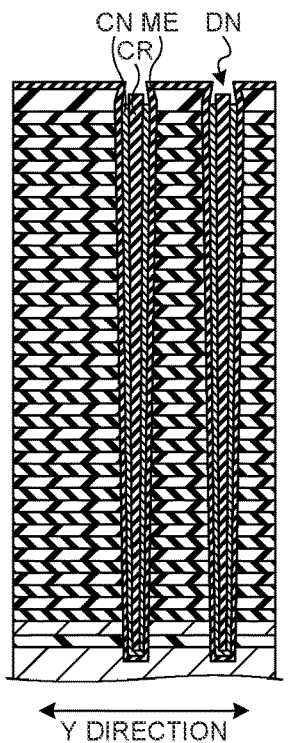 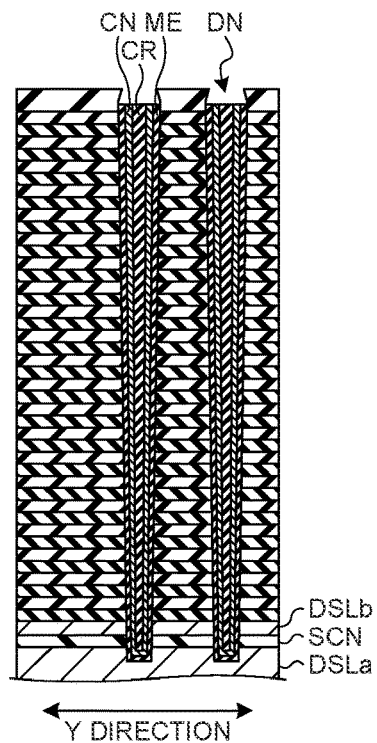

FIG.23A  FIG.23B  FIG.23C
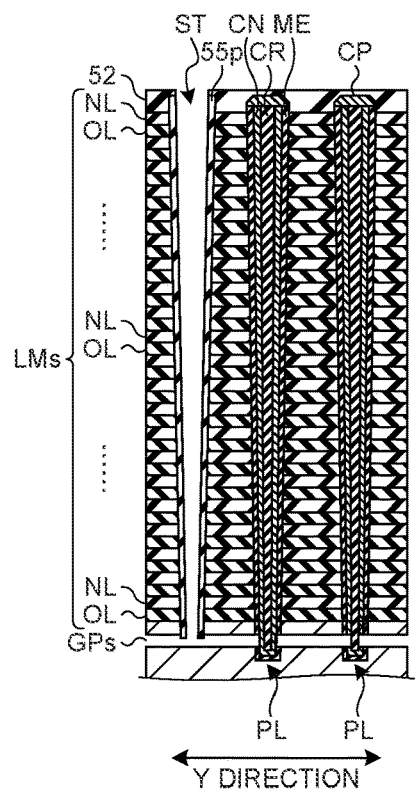
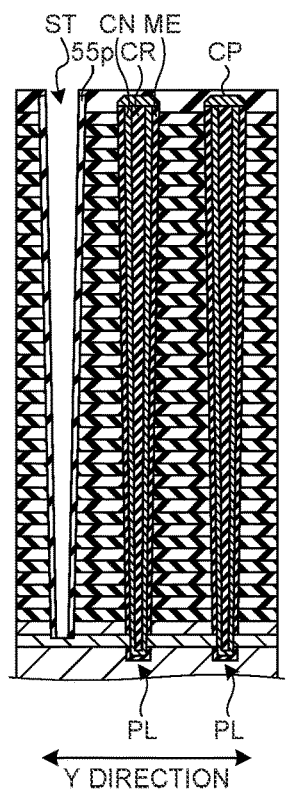
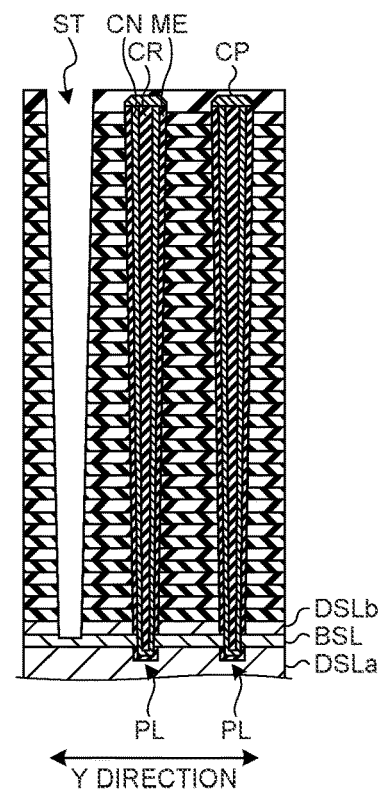
FIG.24A  FIG.24B
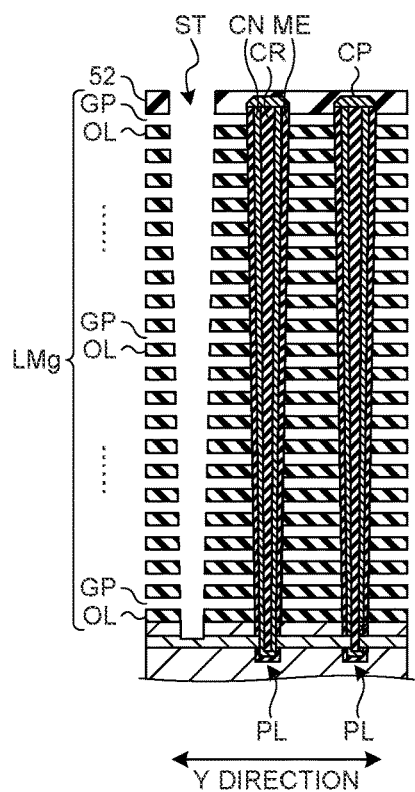
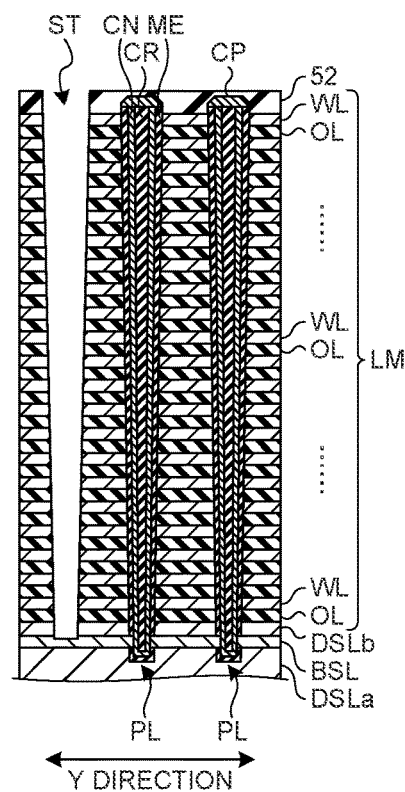

METHOD OF MANUFACTURING SEMICONDUCTOR MEMORY DEVICE AND SEMICONDUCTOR MEMORY DEVICE

CROSS-REFERENCE TO RELATED APPLICATIONS

This application is based upon and claims the benefit of priority from Japanese Patent Application No. 2022-044482, filed on Mar. 18, 2022; the entire contents of which are incorporated herein by reference.

FIELD

Embodiments described herein relate generally to a method of manufacturing a semiconductor memory device and a semiconductor memory device.

BACKGROUND

In three-dimensional nonvolatile memories, memory cells are three-dimensionally arranged in a stacked body having a plurality of conductive layers stacked, for example. The plurality of conductive layers is processed in a staircase shape and each of the conductive layers is connected to a contact, thereby enabling to lead out the plurality of conductive layers.

BRIEF DESCRIPTION OF THE DRAWINGS

FIGS. 19A to 19C are cross-sectional views sequentially illustrating a part of the procedure of a method of manufacturing a semiconductor memory device according to an embodiment;

FIGS. 20A to 20C are cross-sectional views sequentially illustrating a part of the procedure of a method of manufacturing a semiconductor memory device according to an embodiment;

FIGS. 23A to 23C are cross-sectional views sequentially illustrating a part of the procedure of a method of manufacturing a semiconductor memory device according to an embodiment;

FIGS. 24A and 24B are cross-sectional views sequentially illustrating a part of the procedure of a method of manufacturing a semiconductor memory device according to an embodiment;

DETAILED DESCRIPTION

A method of manufacturing a semiconductor memory device includes: forming a stacked body in which each of a plurality of first insulating layers and each of a plurality of second insulating layers are alternately stacked one on another; forming a first mask layer above the stacked body, the first mask layer having a first side; forming a first stopper layer, the first stopper layer covering at least the first side; forming a second mask layer, the second mask layer covering the first mask layer having the first side; repeating multiple times of a process of etching away one pair of first and second insulating layers of the stacked body exposed from the second mask layer among the plurality of first and second insulating layers with retracting the second mask layer in a first direction toward the first side by slimming; removing the second mask layer undergone multiple times of the slimming, and removing the first stopper layer exposed on the first side; and repeating multiple times of a process of etching away one pair of first and second insulating layers of the stacked body exposed from the first mask layer among the plurality of first and second insulating layers with retracting the first mask layer in the first direction by slimming.

The present invention will be explained below in detail with reference to the accompanying drawings. Note that the present invention is not limited to the following embodiments. The constituent elements in the following embodiments include those that can be easily envisaged by those skilled in the art or those that are substantially identical.
(Configuration Example of Semiconductor Memory Device)

Figure 1A:
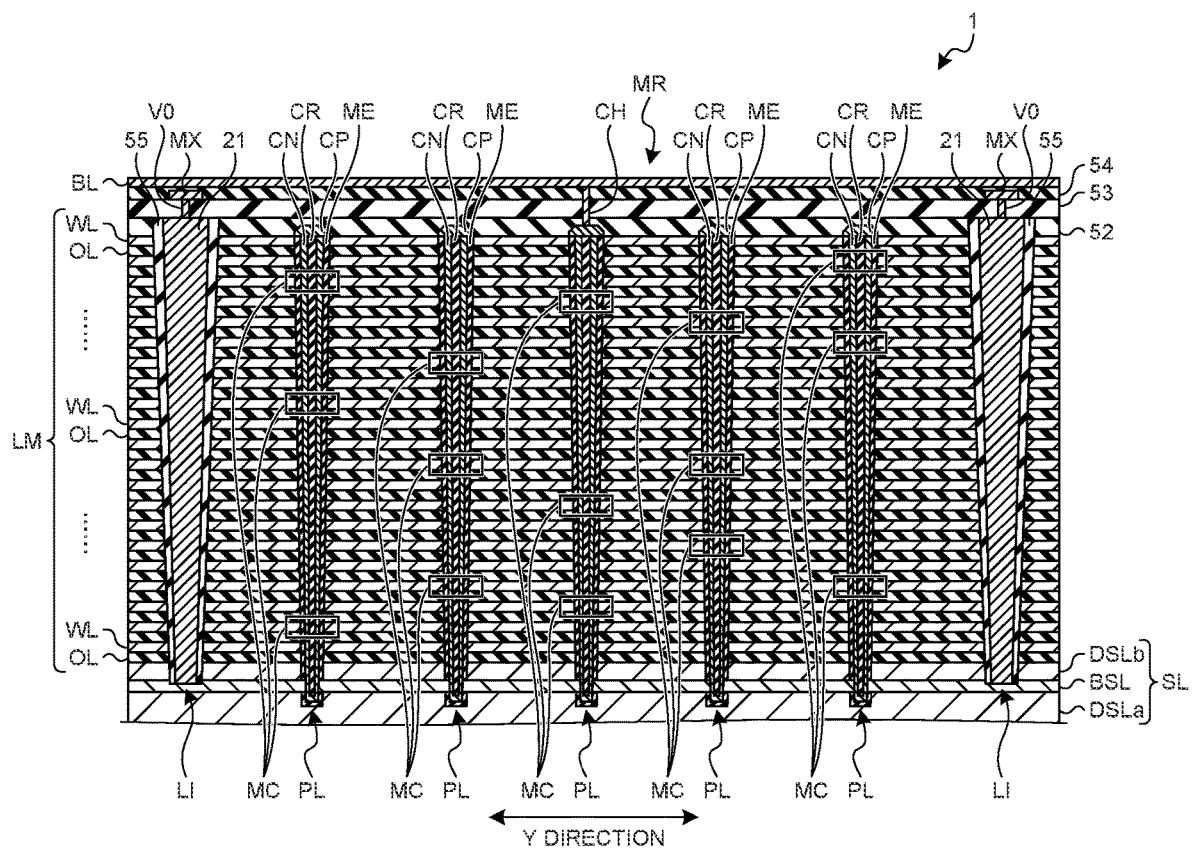
FIGS. 1A and 1B are cross-sectional views illustrating an example of a configuration of a memory region included in a semiconductor memory device according to an embodiment.
Figure 1B:
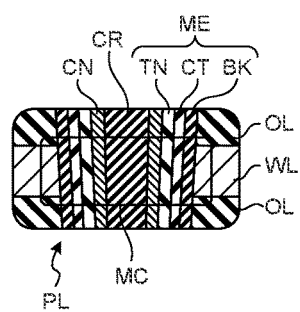

FIGS. 1A and 1B are cross-sectional views illustrating an example of a configuration of a memory region MR included in a semiconductor memory device 1 according to an embodiment. FIG. 1A is a cross-sectional view along a Y direction, including a memory region MR of the semiconductor memory device 1. FIG. 1B is a partially enlarged cross-sectional view of a pillar PL of the semiconductor memory device 1.

Note that, in the present specification, both X direction and Y direction each are a direction along the direction of a surface of a word line WL to be described later, and the X direction and the Y direction are orthogonal to each other. An electrical lead-out direction of the word line WL to be described later may be referred to as a first direction, and the first direction is a direction along the X direction. The direction intersecting the first direction may be referred to as a second direction, and the second direction is a direction along the Y direction. However, since the semiconductor memory device 1 may include a margin of error in manufacturing, the first direction and the second direction are not necessarily orthogonal to each other.

As illustrated in FIG. 1A, the semiconductor memory device 1 includes a source line SL and a stacked body LM.

The source line SL is formed on a part of a semiconductor substrate such as a silicon substrate (not illustrated), or is formed above away from the semiconductor substrate. The source line SL includes a lower source line DSLa, an intermediate source line BSL, and an upper source line DSLb. The intermediate source line BSL is disposed on the lower source line DSLa, and the upper source line DSLb is disposed on the intermediate source line BSL. The lower source line DSLa, the intermediate source line BSL, and the upper source line DSLb each are, for example, a conductive polysilicon layer, or the like.

On the source line SL, there is disposed a stacked body LM in which each layer of a plurality of insulating layers OL and each layer of a plurality of word line WL as conductive layers are alternately stacked one on another. The word line WL is a tungsten layer, a molybdenum layer or the like, for example. The insulating layer OL is a silicon oxide layer or the like, for example. The number of layers of the word line WL can be freely selected. The stacked body LM may further include one or more select gate lines in at least one of an upper layer above the uppermost word line WL and a lower layer below the lowermost word line WL. The stacked body LM also includes a memory region MR and step portions SR and SRd (see FIGS. 2A and 2B).

The upper surface of the stacked body LM is covered with an insulating layer 52 such as a silicon oxide layer. An insulating layer 53 such as a silicon oxide layer is disposed on the insulating layer 52. An insulating layer 54 such as a silicon oxide layer is disposed on the insulating layer 53.

In the stacked body LM, there is arranged a plurality of plate contacts LI extending in the stacked body LM in the stacking direction of the stacked body LM and a direction along the X direction. As a result, the plurality of plate contacts LI divides the stacked body LM in the Y direction. More specifically, each of the plate contacts LI penetrates through the insulating layer 52, the stacked body LM, and the upper source line DSLb, and extends to the intermediate source line BSL.

The plate contact LI includes: an insulating layer 55 covering sidewalls opposing each other in the Y direction; and a conductive layer 21 filled in the inner portion of the plate contact LI sandwiched between the insulating layers 55. The insulating layer 55 is a silicon oxide layer or the like, for example, and the conductive layer 21 is a tungsten layer, a conductive polysilicon layer or the like, for example.

The lower end portion of the conductive layer 21 is electrically connected to the source line SL via the intermediate source line BSL. The upper end portion of the conductive layer 21 is electrically connected, via a plug V0 extending in the insulating layer 53, to an upper layer wiring MX disposed in the insulating layer 54.

With the configuration described above, the plate contact LI serves as a source line contact. However, in place of the plate contact LI, a plate-like portion including an insulating layer or the like may divide the stacked body LM in the Y direction. In this case, the plate-like portion does not have a function as a source line contact.

A plurality of pillars PL is arranged in a region of the stacked body LM sandwiched between the plate contacts LI adjacent in the Y direction. These pillars PL penetrate through the stacked body LM, the upper source line DSLb, and the intermediate source line BSL, and extend to the lower source line DSLa. A region of the stacked body 1M in which the plurality of pillars PL is arranged is referred to as a memory region MR, for example.

In the memory region MR, the plurality of pillars PL is arranged in a distributed manner, for example, in a staggered manner as viewed from the stacking direction of the stacked body LM. Each of the pillars PL has a circular shape, an elliptical shape, or an oblong shape (oval shape), for example, as viewed from the stacking direction of the stacked body LM.

The pillar PL includes: a memory layer ME, a channel layer CN, and a core layer CR, each of which extends in the stacking direction of the stacked body LM; and a cap layer CP that is disposed in the insulating layer 52 and is an upper end portion of each of the memory layer ME, the channel layer CN, and the core layer CR.

As illustrated in FIG. 1B, the memory layer ME has a stacked structure in which a block insulating layer BK, a charge storage layer CT, and a tunnel insulating layer TN are stacked in this order from the outer peripheral side of the pillar PL. The channel layer CN is disposed further inside the tunnel insulating layer TN. The core layer CR is filled further inside the channel layer CN.

Note that the memory layer ME is not disposed at the height position of the intermediate source line BSL, and the channel layer CN exposed is in direct contact with the intermediate source line BSL.

The block insulating layer BK, the tunnel insulating layer TN, and the core layer CR each are a silicon oxide layers or the like, for example. The charge storage layer CT is a silicon nitride layer or the like, for example. The channel layer CN and the cap layer CP each are a semiconductor layer such as an amorphous silicon layer or a polysilicon layer, for example.

The upper end portion of the cap layer CP is electrically connected, via a plug CH extending in the insulating layers 53 and 52, to a bit line BL disposed in the insulating layer 54. The bit line BL extends in a direction intersecting the lead-out direction of the word line WL, that is, in a direction along the Y direction.

The upper end portion of the channel layer CN is connected to the cap layer CP. Moreover the side surface of the channel layer CN is in contact with the intermediate source line BSL, and thus the channel layer CN is electrically connected to source line SL via the intermediate source line BSL.

With the above-described configuration, a memory cell MC is formed at the intersection of the pillar PL and each of the plurality of word lines WL. A predetermined voltage is applied to each of the memory cells MC from the word line WL located at the same height position as that of each of the memory cells MC, thereby carrying out the writing and reading of data to and from these memory cells MC.

When the stacked body LM includes the select gate line, the select gate is formed at the intersection between the select gate line and the pillar PL. When a predetermined voltage is applied from the select gate line, the select gate is turned on or off, and the memory cell MC of the pillar PL to which the select gate belongs becomes in a selected state or a non-selected state.

As described above, the plurality of memory cells MC is arranged three-dimensionally in the memory region MR, whereby the semiconductor memory device 1 of the embodiment is configured as a three-dimensional nonvolatile memory, for example.

Figure 2A:
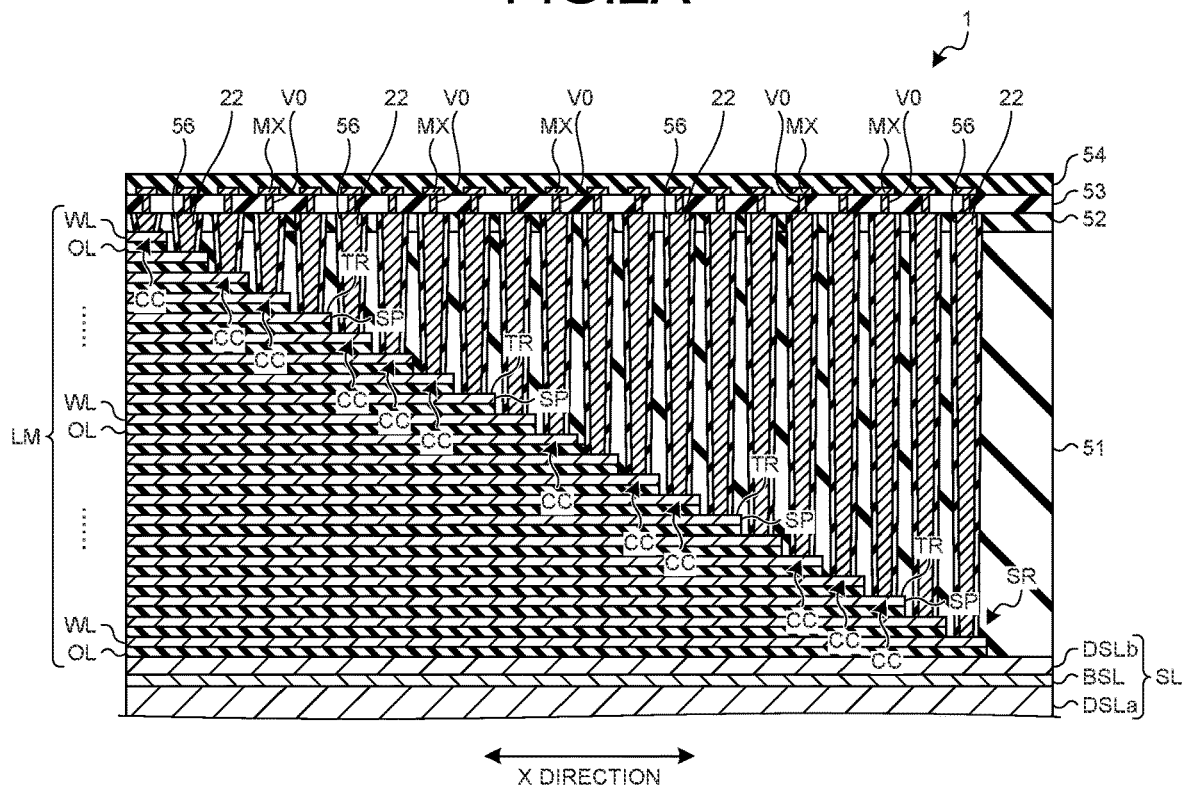
FIGS. 2A and 2B are cross-sectional views illustrating an example of a configuration of a step portion included in a semiconductor memory device according to an embodiment.
Figure 2B:
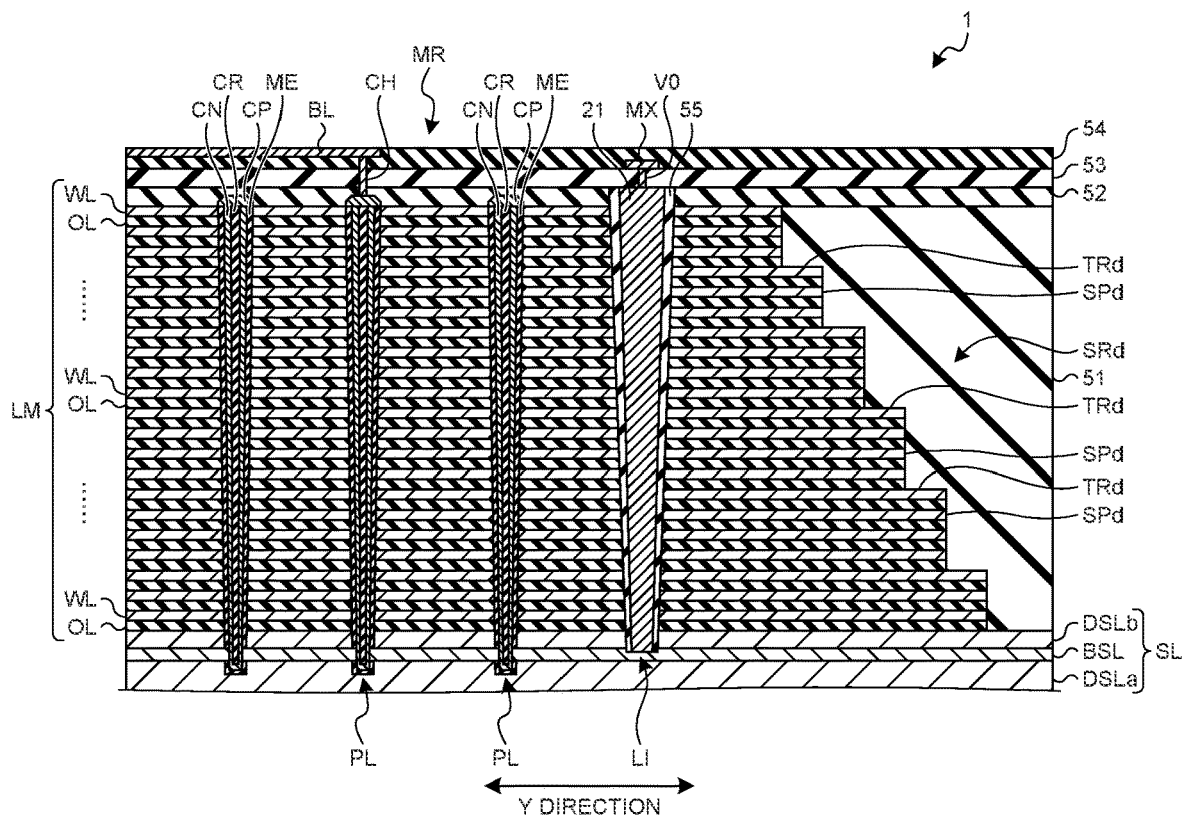

FIGS. 2A and 2B are cross-sectional views illustrating examples of configurations of step portions SR and SRd included in a semiconductor memory device 1 according to an embodiment. FIG. 2A is a cross-sectional view along the X direction, including the step portion SR of the semiconductor memory device 1. FIG. 2B is a cross-sectional view along the Y direction, including the step portion SRd of the semiconductor memory device 1.

As illustrated in FIG. 2A, at least at one end of the stacked body LM in the X direction is disposed a step portion SR in which a plurality of word lines WL and a plurality of insulating layers OL are processed in a staircase shape and terminated. That is, the step portion SR becomes higher toward the memory region MR disposed on the central side of the stacked body LM. The entire step portion SR is covered with an insulating layer 51 such as a silicon oxide layer. The above-described insulating layers 52 to 54 are formed as well on the upper surface of the insulating layer 51.

Each stair of the step portion SR includes a pair of the word line WL and the insulating layer OL. An end surface in the X direction of the word line WL and the insulating layer OL included in each stair of the step portion SR is referred to as a step surface SP as a first step surface. The upper surface of the word line WL included in each stair of the step portion SR is referred to as a terrace surface TR. A contact CC is connected to the terrace surface TR of each of the plurality of word lines WL.

Each contact CC penetrates through the insulating layers 52 and 51 and extends to the word line WL of each stair of the step portion SR. The contact CC includes: an insulating layer 56 covering the side wall of the contact CC; and a conductive layer 22 filled in the inside of the insulating layer 56. The lower end portion of the conductive layer 22 is connected to the terrace surface TR of the corresponding word line WL. The upper end portion of the conductive layer 22 is electrically connected, via a plug V0 extending in the insulating layer 53, to an upper layer wiring MX disposed in the insulating layer 54.

The semiconductor memory device 1 includes a peripheral circuit (not illustrated), and the upper layer wiring MX is electrically connected to the peripheral circuit. The peripheral circuit includes a plurality of transistors and contributes to the electrical operation of the memory cell MC. The above-described voltage is applied, via the peripheral circuit, the upper layer wiring MX, the contact CC, and the word line WL, to the memory cell MC, thereby carrying out the writing and reading of data to and from the memory cell MC.

As illustrated in FIG. 2B, at both ends in the Y direction of the stacked body LM, there are disposed step portions SRd in which a plurality of word lines WL and a plurality of insulating layers OL are processed in a staircase shape and terminated. That is, the step portion SRd becomes higher toward the memory region MR disposed on the center side of the stacked body LM. The entire step portion SRd is also covered with the insulating layer 51. The above-described insulating layers 52 to 54 are formed as well on the upper surface of the insulating layer 51 covering the step portion SRd.

Each stair of the step portion SRd includes multiple pairs of word line WL and insulating layer OL. As a result, the step portion SRd has a gradient steeper than that of the step portion SR at the end in the X direction, and the staircase length, that is, the length from the uppermost stair to the lowermost stair of the step portion SRd is shorter than that of the step portion SR.

An end surface in the Y direction of the word lines WL and the insulating layers OL included in each stair of the step portion SRd is referred to as a step surface SPd as a second step surface. The upper surface of the word line WL included in each stair of the step portion SRd is referred to as a terrace surface TRd. The step portions SRd at both ends in the Y direction each are a dummy step portion that does not contribute to the function of the semiconductor memory device 1, and the above-described contact CC is not connected to the terrace surface TRd of the step portion SRd.

Note that, in the present specification, the side toward which the terrace surfaces TR and TRd of each of the word lines WL of the step portions SR and SRd face is defined as the upper side of the semiconductor memory device 1.

Figure 3A:
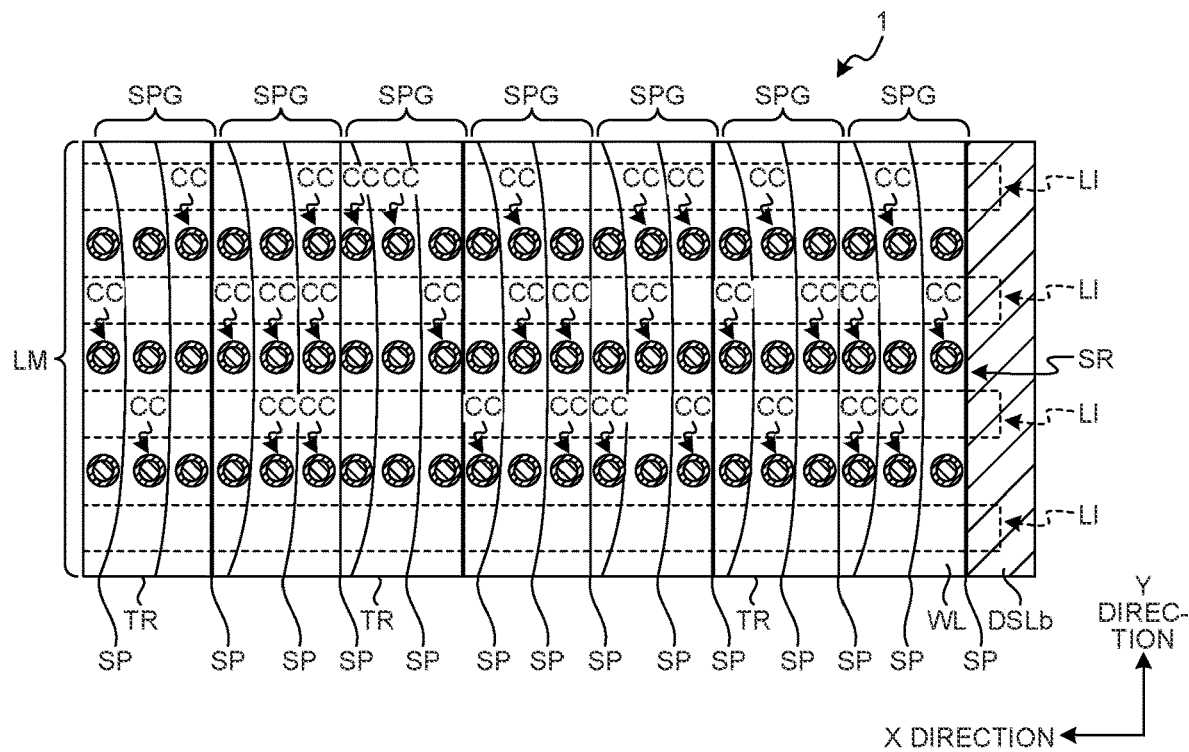
FIGS. 3A and 3B are top views illustrating an example of a configuration of a step portion included in a semiconductor memory device according to an embodiment.
Figure 3B:
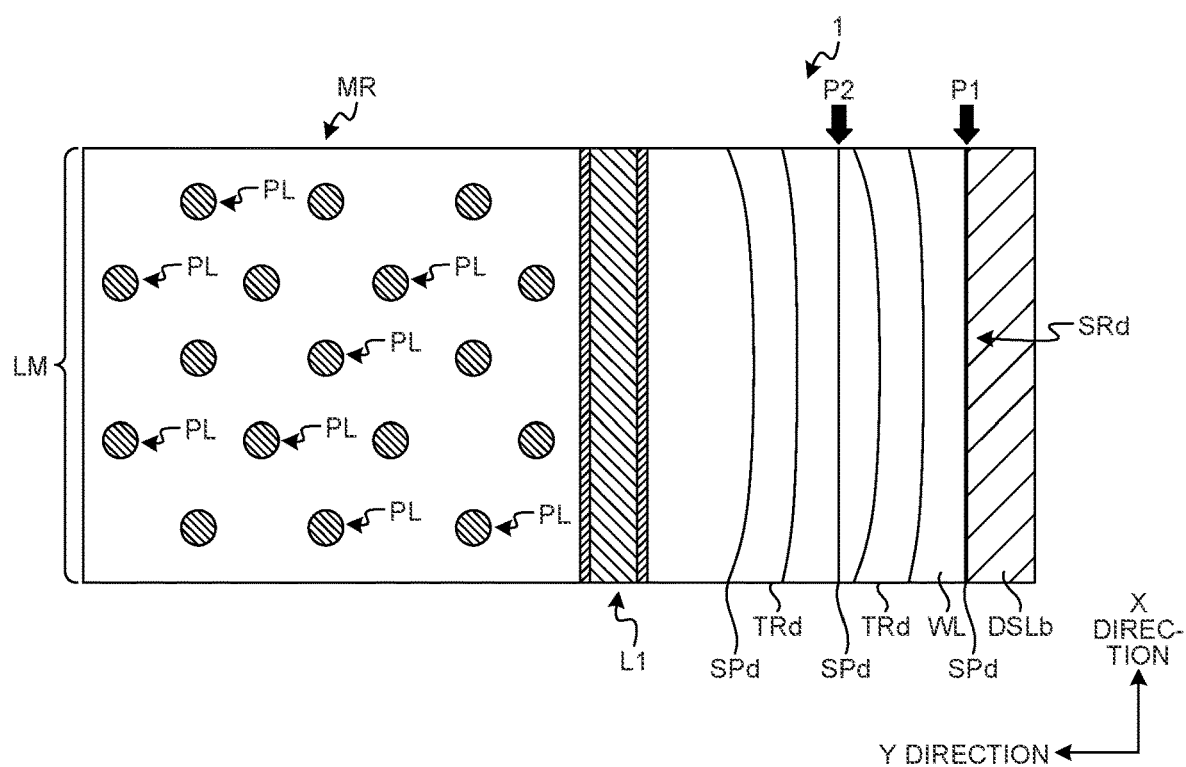

FIGS. 3A and 3B are top views illustrating an example of the configuration of step portions SR and SRd included in a semiconductor memory device 1 according to the embodiment. FIG. 3A is a top view, including the step portion SR of the semiconductor memory device 1. FIG. 3B is a top view, including the step portion SRd of the semiconductor memory device 1.

However, in FIGS. 3A and 3B, the insulating layers 51 to 54 and the like covering the step portions SR and SRd are omitted. In FIG. 3A, in order to make the drawing easy to read, the plate contact LI is indicated by a dashed line, thereby showing the situation of the underlying step portion SR through the plate contact LI.

As illustrated in FIG. 3A, the contact CC is disposed at each stair of the step portion SR in each region of the stacked body LM divided in the Y direction by the plurality of plate contacts LI.

Furthermore, when the step portion SR is viewed from above, it can be seen that the plurality of step surfaces SP including each stair of the step portion SR extends in a direction along the Y direction.

The lowermost step surface SP of the step portion SR extends substantially linearly in a direction along the Y direction. The second lowest step surface SP of the step portion SR has an arcuate shape in which a central region in the Y direction protrudes. The third lowest step surface SP of the step portion SR has a shape in which the central region in the Y direction further protrudes with an increased curvature.

As described above, among the plurality of step surfaces SP of the step portion SR, some step surfaces SP transform from a substantially linearly extending shape to a shape in which the central region protrudes, toward the direction in which the step portion SR becomes higher. In this manner, some step surfaces SP transforming from a substantially linearly extending shape to a shape in which the central region protrudes are referred to as a step surface group SPG.

The step portion SR includes a plurality of step surface groups SPG arranged from the lower layer side to the upper layer side. That is, the plurality of step surfaces SP included in the step portion SR transforms from a substantially linearly extending shape to a shape in which the central region protrudes toward the direction in which the step portion SR becomes higher, and then returns to a substantially linearly extending shape again, and transforms therefrom again to a shape in which the central region protrudes.

As described above, in the plurality of step surfaces SP of the step portion SR, a transformation from a shape extending substantially linearly to a shape in which the central region protrudes is repeated toward a direction in which the step portion SR becomes higher.

As illustrated in FIG. 3B, when the step portion SRd is viewed from above, it can be seen that the plurality of step surfaces SPd including each stair of the step portion SRd extends in a direction along the X direction.

The step surface SPd of the step portion SRd also includes: a step surface SPd as fourth and fifth step surfaces extending substantially linearly in the direction along the X direction; and a step surface SPd as a third step surface having an arcuate shape in which a central region in the X direction protrudes.

The step surfaces SPd each having an arcuate shape are arranged in a distributed manner over the entire step portion SRd stepping-up-and-down in the Y direction. The step surface SPd extending substantially linearly in a direction along the X direction includes: a step surface SPd as a fourth step surface disposed at the point P1 indicated by an arrow in the vicinity of the lowermost stair of the step portion SRd; and a step surface SPd as a fifth step surface disposed at the point P2 indicated by an arrow between the lowermost stair and the uppermost stair of the step portion SRd.

(Method of Manufacturing Semiconductor Memory Device)

Next, an example of a method of manufacturing a semiconductor memory device 1 according to an embodiment will be described with reference to FIGS. 4A to 24B. FIGS. 4A to 24B are cross-sectional views sequentially illustrating a part of the procedure of the method of manufacturing a semiconductor memory device 1 according to an embodiment.

First, FIGS. 4A to 11B illustrate how the step portion SR is formed. FIGS. 4A to 11B are cross-sectional views along the X direction, including the step portion SR in the middle of manufacturing.

Figure 4A:
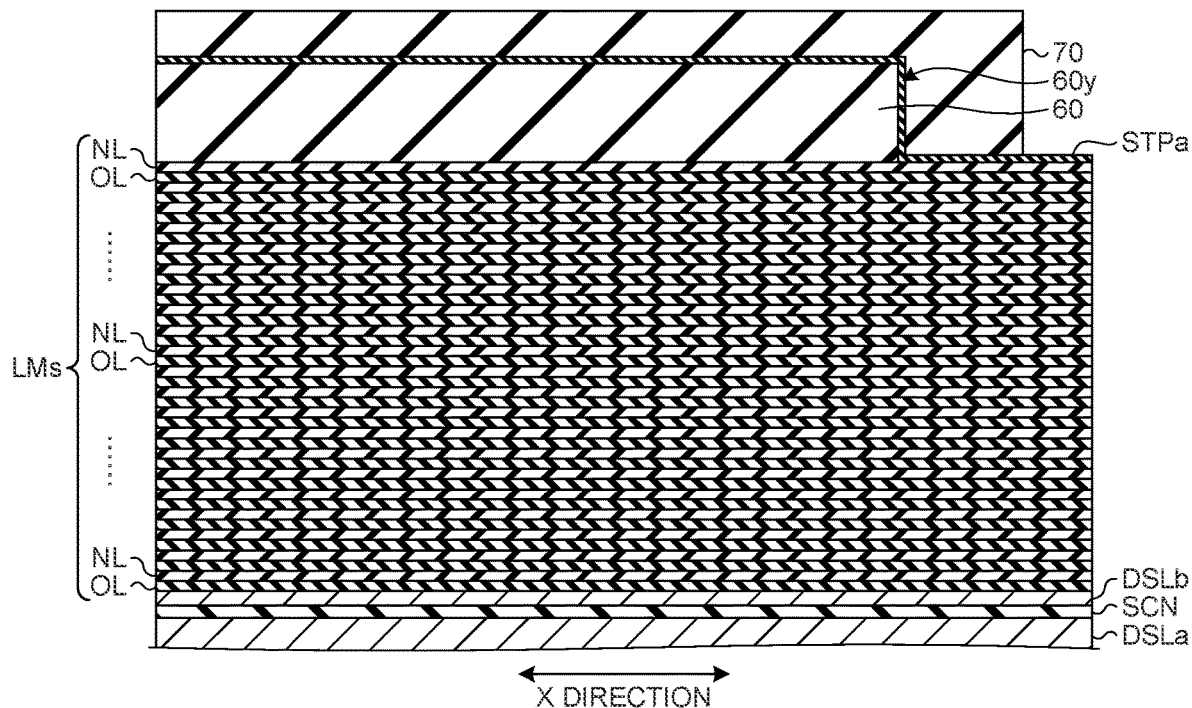
FIGS. 4A and 4B are cross-sectional views sequentially illustrating a part of the procedure of a method of manufacturing a semiconductor memory device according to an embodiment.

As illustrated in FIG. 4A, a lower source line DSLa, an intermediate insulating layer SCN, and an upper source line DSLb are formed in this order. The intermediate insulating layer SCN is a silicon nitride layer or the like, for example, and serves as a sacrificial layer that is later replaced with a polysilicon layer or the like and becomes an intermediate source line BSL.

On the upper source line DSLb, there is formed a stacked body LMs in which each layer of insulating layers NL as a first insulating layer and each layer of insulating layers OL as a second insulating layer are alternately stacked one on another. The insulating layer NL is a silicon nitride layer or the like, for example, and serves as a sacrificial layer that is later replaced with a conductive layer or the like and becomes a word line WL.

On the upper surface of the stacked body LMs, there are formed a resist layer 60, a stopper layer STPa, and a resist layer 70 in this order.

The resist layer 60 as a first mask layer has a rectangular shape including a side 60y as a first side extending in the Y direction, for example, and covers the upper surface of a part of the stacked body LMs.

The stopper layer STPa as a first stopper layer is formed so as to cover the upper surface and the side surface of the resist layer 60 including the side 60y, and to cover the upper surface of the stacked body LMs exposed from the resist layer 60.

The stopper layer STPa is a semiconductor layer such as an amorphous silicon layer or a polysilicon layer, or a metal layer such as an aluminum layer, a tungsten layer, or a platinum layer, for example. Such stopper layer STPa is formed by sputter deposition, low-temperature chemical vapor deposition (CVD) at 90° C. or lower, or the like, for example. Herewith, the resist layer 60 already formed is suppressed from being deteriorated.

The resist layer 70 as a second mask layer is formed so as to cover the upper surface and the side surface of the resist layer 60 including the side 60y with interposing the stopper layer STPa. As a result, the resist layer 70 also has a rectangular shape along the side surface of the resist layer 60 including the side 60y. The stopper layer STPa is in a state of being interposed between the resist layers 60 and 70.

Figure 4B:
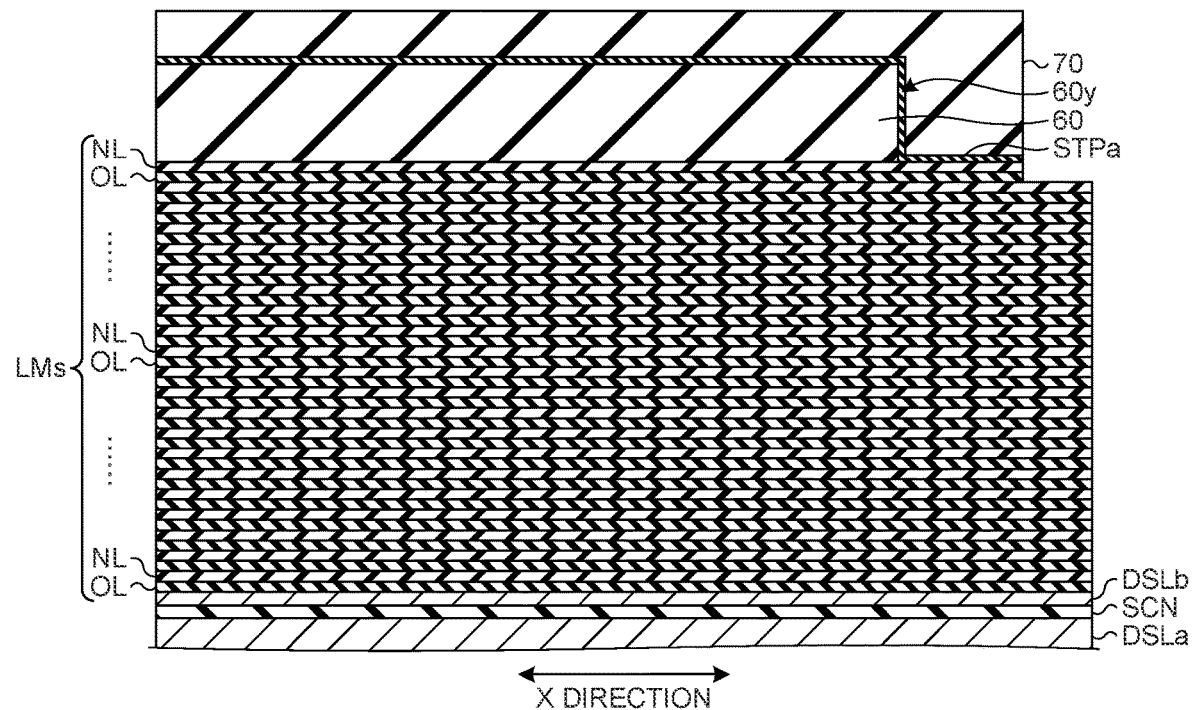

As illustrated in FIG. 4B, the stopper layer STPa on the upper surface of the stacked body LMs exposed from the resist layer 70 is removed. A pair of insulating layers NL and OL on the exposed surface of the stacked body LMs is also removed. That is, a pair of the insulating layers NL and OL of the uppermost layer of the stacked body LMs is removed. At this time, the staircase formed by removing the pair of insulating layers NL and OL, to which the rectangular shape of the resist layer 70 along the side 60y and the like of the resist layer 60 is transferred, becomes to have a step surface extending substantially linearly.

Figure 5A:
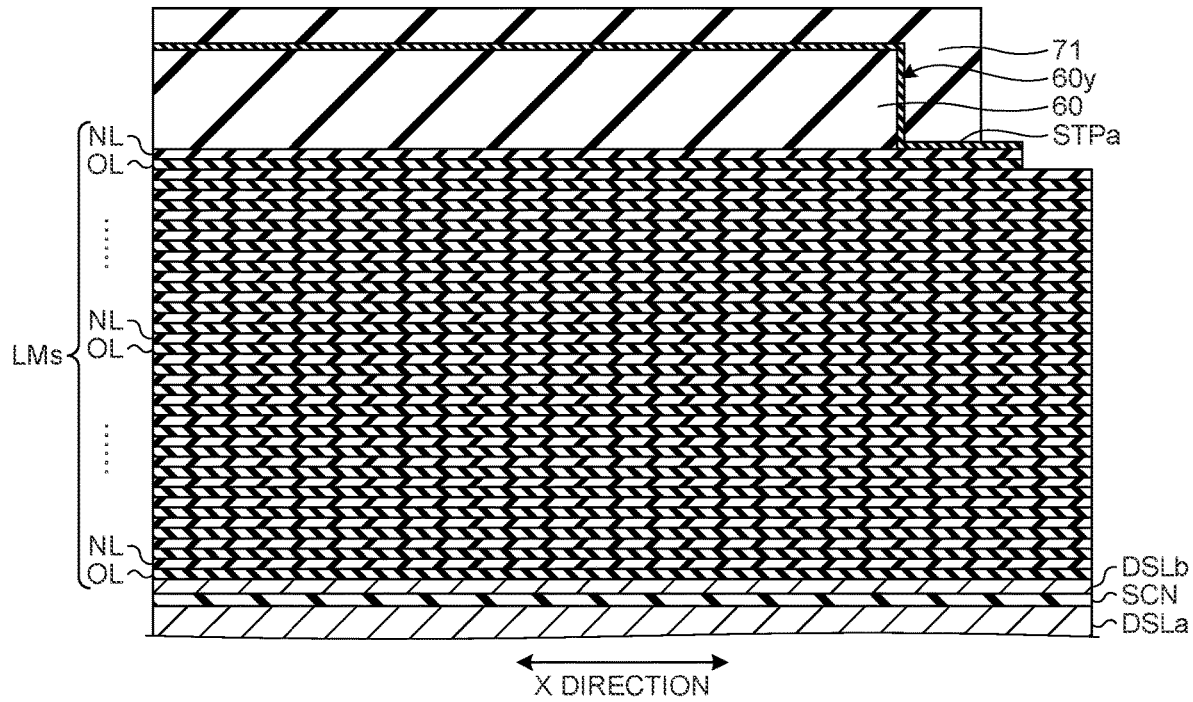
FIGS. 5A and 5B are cross-sectional views sequentially illustrating a part of the procedure of a method of manufacturing a semiconductor memory device according to an embodiment.

As illustrated in FIG. 5A, the resist layer 70 is slimmed to form a resist layer 71, and the upper surface of the stacked body LMs covered with the stopper layer STPa is newly exposed. In the slimming of the resist layer 70, the side surface of the resist layer 70 is retracted by oxygen plasma or the like, for example, thereby forming the resist layer 71 having a smaller area covering the stacked body LMs and a smaller layer thickness than those of the resist layer 70.

Note that the side surface of the resist layer 71 retracted by slimming has an arcuate shape in which a central part in the Y direction slightly protrudes with respect to the side surface of the resist layer 70 extending substantially linearly.

Figure 5B:
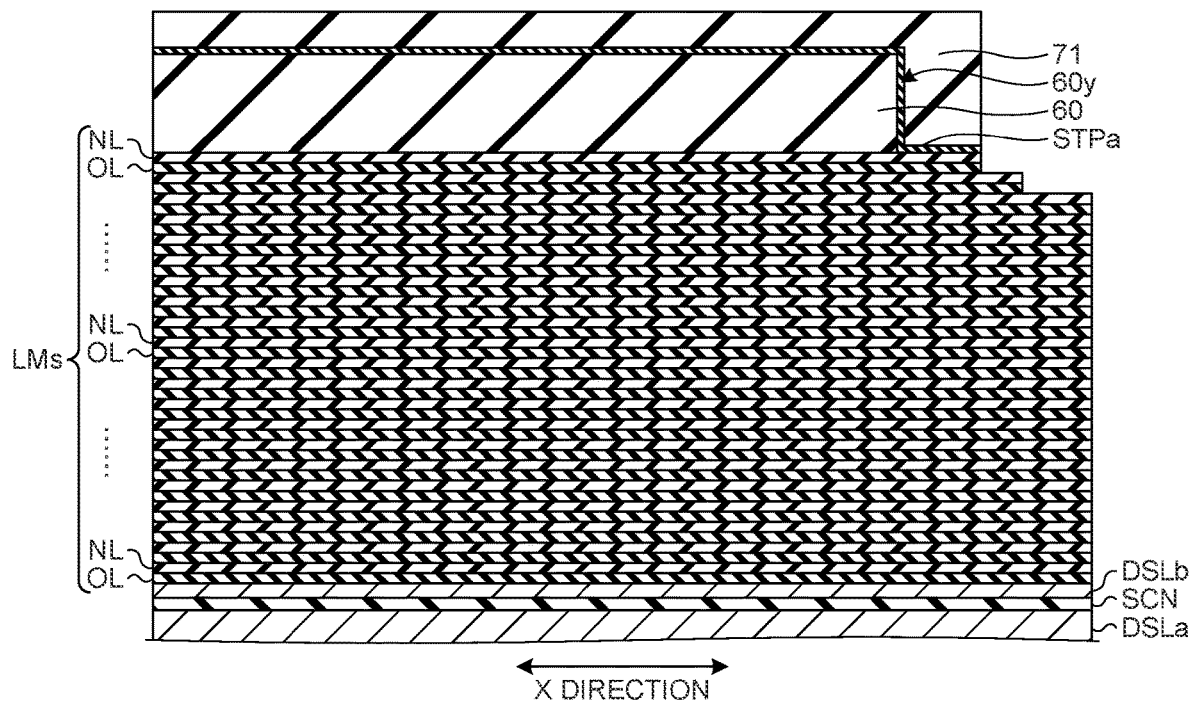

As illustrated in FIG. 5B, the stopper layer STPa is removed from the newly exposed upper surface of the stacked body LMs, and a pair of insulating layers NL and OL on the exposed surface of the stacked body LMs is further removed. As a result, a pair of insulating layers NL and OL of the newly exposed uppermost layer of the stacked body LMs as well as a pair of insulating layers NL and OL of the lower layer of the already removed uppermost layer are removed.

At this time, in the staircase formed by removing the pair of insulating layers NL and OL of the lower layer of the uppermost layer, the step surface extending substantially linearly is preserved. In contrast, the staircase formed by removing the pair of insulating layers NL and OL of the uppermost layer becomes to have a step surface in which the central part in the Y direction slightly protrudes as the arcuate shape of the resist layer 71 is transferred.

Figure 6A:
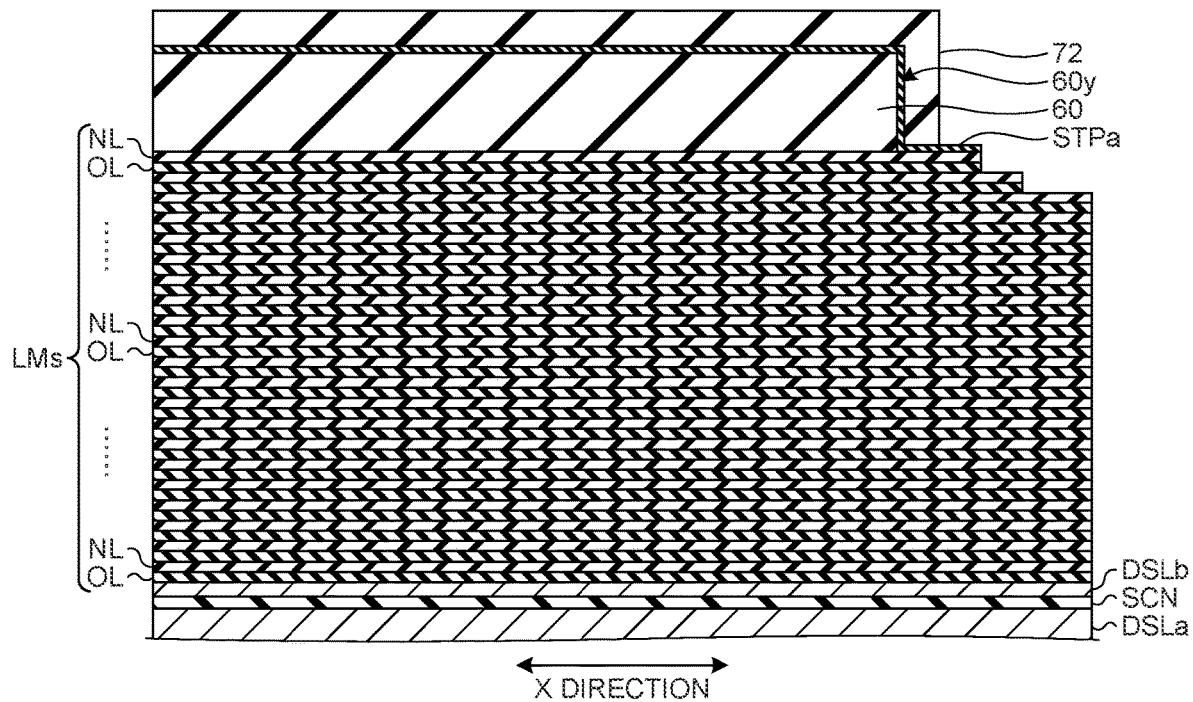
FIGS. 6A and 6B are cross-sectional views sequentially illustrating a part of the procedure of a method of manufacturing a semiconductor memory device according to an embodiment.

As illustrated in FIG. 6A, the resist layer 71 is further slimmed to form a resist layer 72, and the upper surface of the stacked body LMs covered with the stopper layer STPa is newly exposed. At this time, the amount of protrusion of the side surface of the resist layer 72 becomes larger, and the curvature of the arcuate shape increases.

Figure 6B:
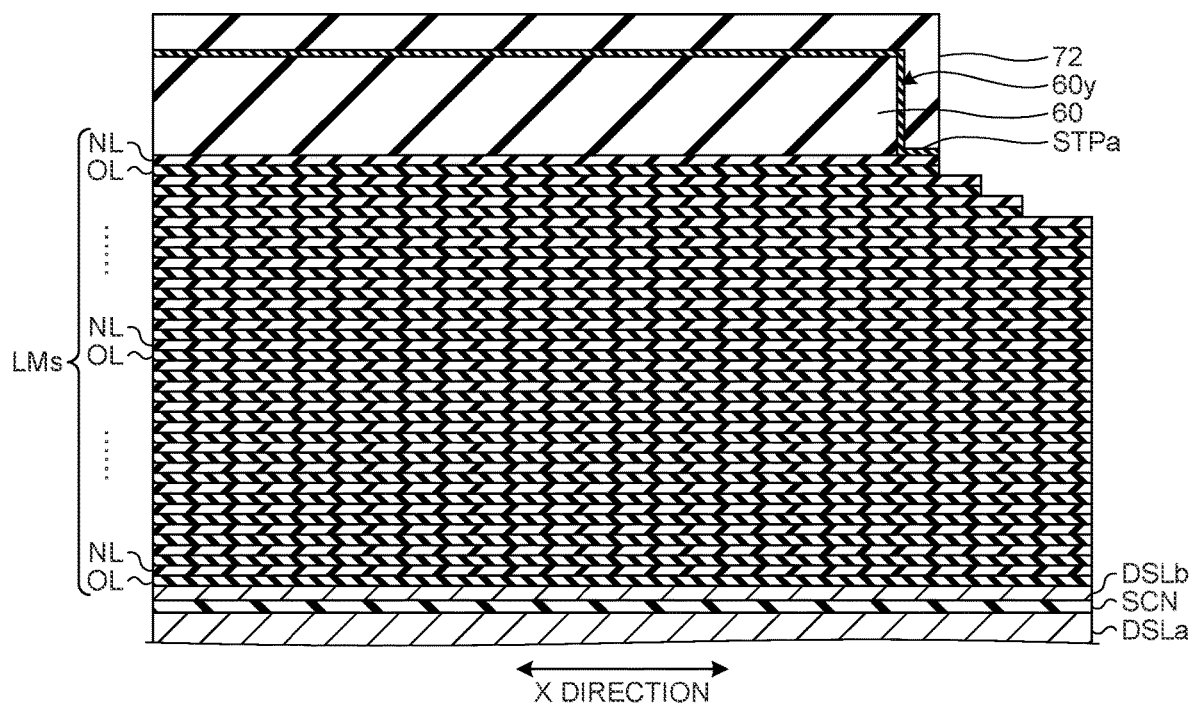

As illustrated in FIG. 6B, the stopper layer STPa is removed from the newly exposed upper surface of the stacked body LMs, and a pair of insulating layers NL and OL on the exposed surface of the stacked body LMs is further removed. As a result, the pairs of insulating layers NL and OL of the uppermost layer, of the lower layer of the uppermost layer, and of the further lower layer thereof in each exposed surface of the stacked body LMs are removed.

In the staircase formed by removing the pairs of insulating layers NL and OL of the lower layer of the uppermost layer, and of the further lower layer thereof, a step surface of a shape in which the central part in the Y direction slightly protrudes and a step surface of a substantially linear shape are preserved, respectively.

In contrast, the staircase formed by removing the pair of insulating layers NL and OL of the uppermost layer has a step surface in which the central part in the Y direction further protrudes as the arcuate shape of the resist layer 72 is transferred.

In this manner, the process of etching away a pair of insulating layers NL and OL of the stacked body LMs each exposed from the resist layers 70, 71, and 72 with retracting the resist layer 70 by slimming is repeated multiple times. As a result, in the staircase formed by removing the pair of insulating layers NL and OL, the plurality of step surfaces transforms from a substantially linearly extending shape to a shape in which the central region protrudes toward the direction in which these staircases become higher.

Figure 7A:
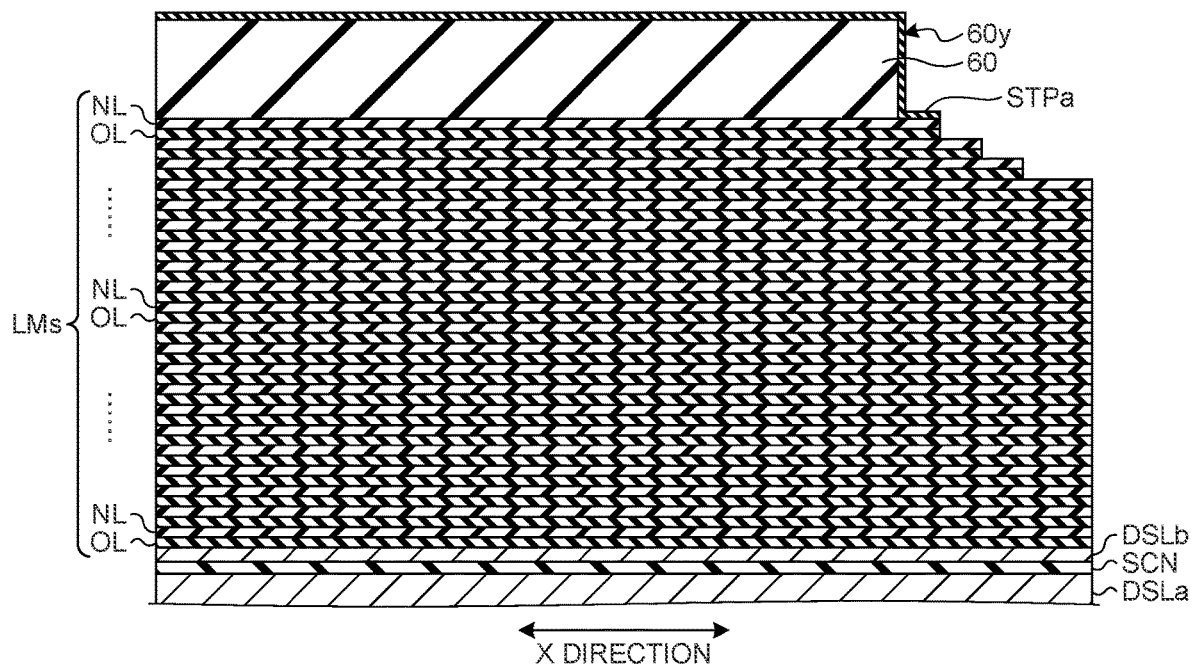
FIGS. 7A and 7B are cross-sectional views sequentially illustrating a part of the procedure of a method of manufacturing a semiconductor memory device according to an embodiment.

As illustrated in FIG. 7A, the resist layer 72 is further slimmed to newly expose the upper surface of the stacked body LMs covered with the stopper layer STPa. At this time, the resist layer 72 is entirely removed, thereby exposing the stopper layer STPa interposed between the resist layers 60 and 72.

Figure 7B:
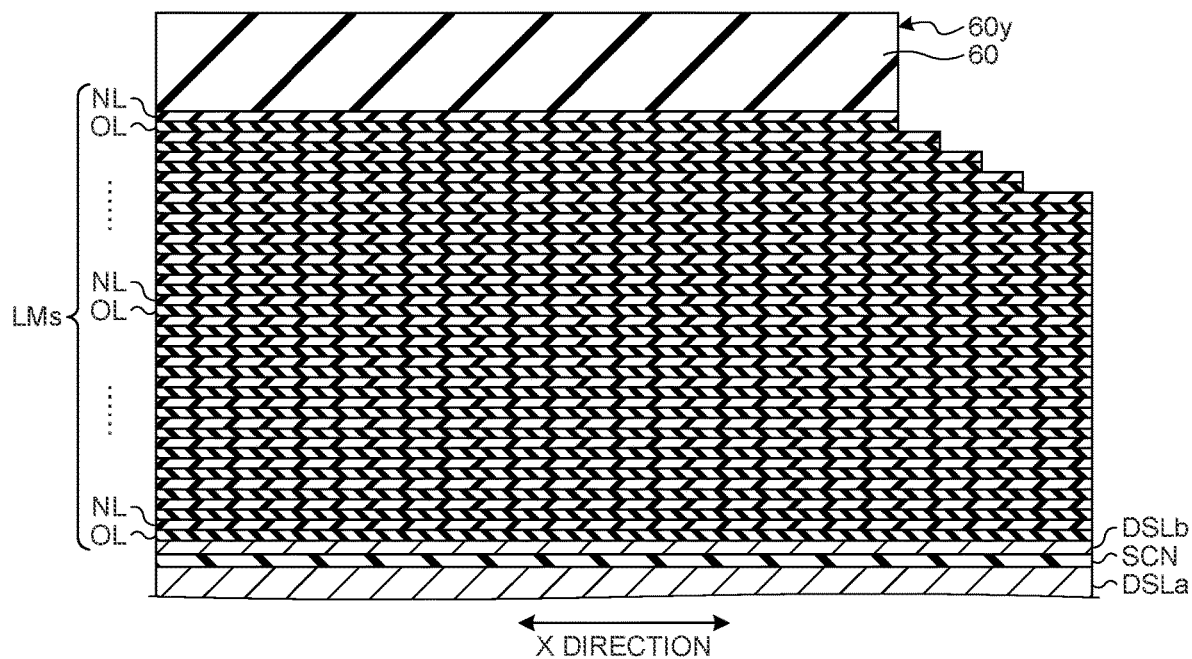

As illustrated in FIG. 7B, the exposed stopper layer STPa is completely removed. As a result, the stopper layer STPa is removed from the newly exposed upper surface of the stacked body LMs and also removed from the upper surface and the side surface of the resist layer 60.

The side surface of the resist layer 60 including the side 60y exposed by removing the stopper layer STPa preserves a substantially linear shape at the time when the resist layer 60 is formed. That is, the stopper layer STPa is interposed between the resist layers 60 and 70 in advance, whereby the arcuate shape by slimming is once reset.

In this state, a pair of insulating layers NL and OL is removed on each exposed surface of the stacked body LM exposed from the resist layer 60. At this time, the staircase formed by removing the pair of insulating layers NL and OL of the newly exposed uppermost layer has a step surface extending substantially linearly as the shape of the rectangular resist layer 60 is transferred.

As described above, as the arcuate shape by slimming is reset at the stopper layer STPa, the shape of the step surface in which the central part in the Y direction gradually protrudes toward the direction in which the staircase becomes higher is also once reset.

Figure 8A:
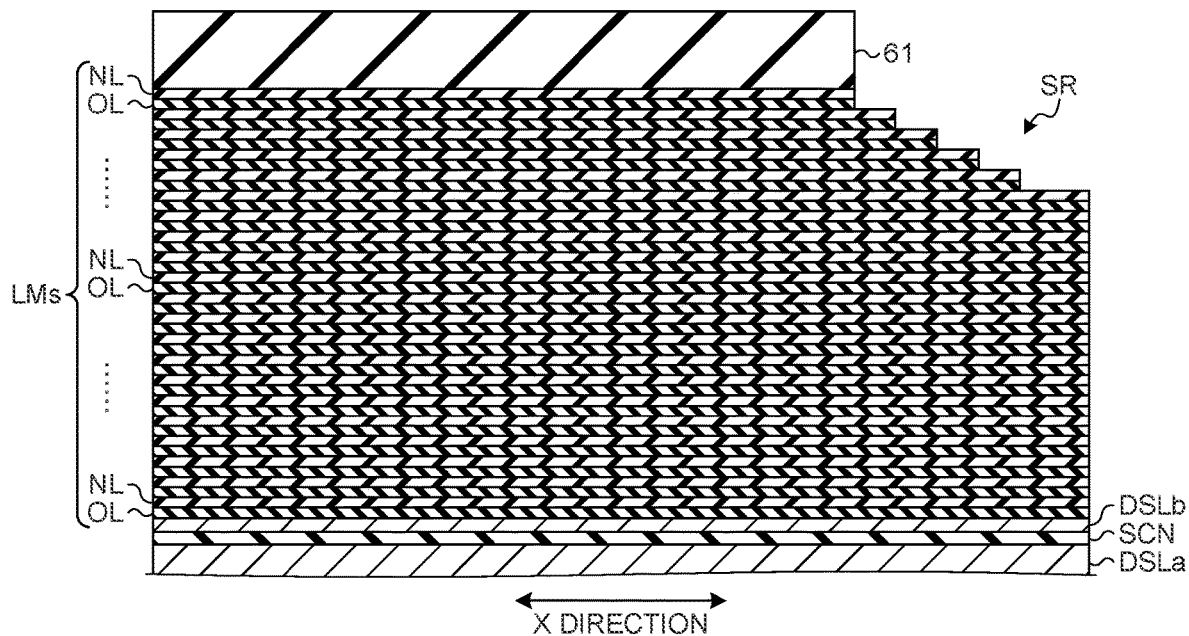
FIGS. 8A and 8B are cross-sectional views sequentially illustrating a part of the procedure of a method of manufacturing a semiconductor memory device according to an embodiment.

As illustrated in FIG. 8A, the resist layer 60 is slimmed to form a resist layer 61, whereby the upper surface of the stacked body LMs is newly exposed, and a pair of insulating layers NL and OL on the exposed surface of the stacked body LMs is removed.

Figure 8B:
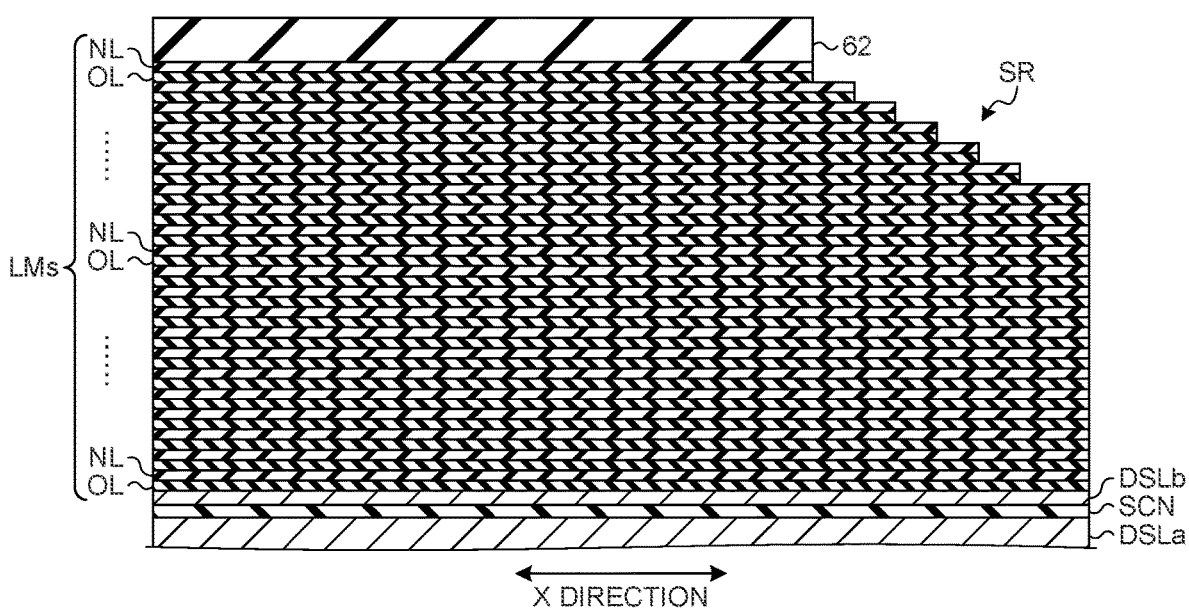

As illustrated in FIG. 8B, the resist layer 61 is further slimmed to form a resist layer 62, whereby the upper surface of the stacked body LMs is newly exposed, and a pair of insulating layers NL and OL on the exposed surface of the stacked body LMs is removed.

In this manner, the process of etching away a pair of insulating layers NL and OL of the stacked body LMs each exposed from the resist layers 60, 61, and 62 with retracting the resist layer 60 by slimming is repeated multiple times. As a result, the staircase is successively formed with respect to the step portion SR a part of which has been formed by the slimming of the resist layer 70 described above.

Furthermore, in the successively formed staircase, the plurality of step surfaces transforms from a substantially linearly extending shape to a shape in which the central region protrudes toward a direction in which these staircases become higher.

Thereafter, the remaining resist layer 62 is removed by ashing with oxygen plasma or the like.

Figure 9A:
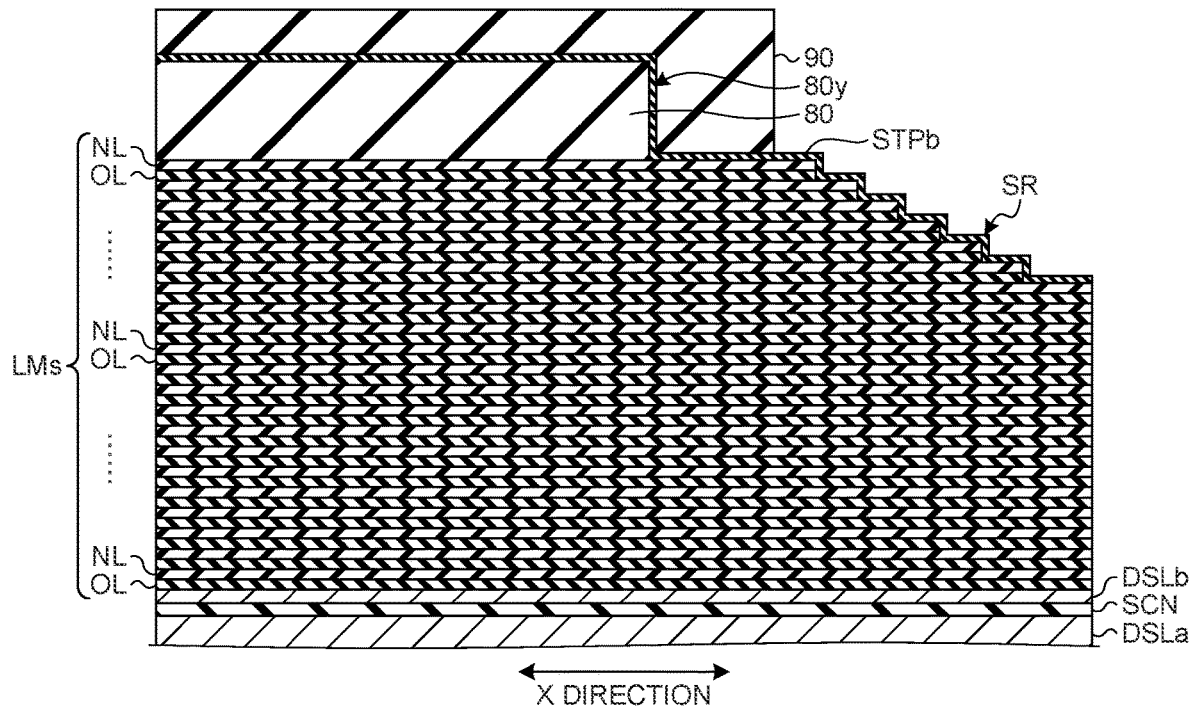
FIGS. 9A and 9B are cross-sectional views sequentially illustrating a part of the procedure of a method of manufacturing a semiconductor memory device according to an embodiment.

As illustrated in FIG. 9A, a resist layer 80, a stopper layer STPb, and a resist layer 90 are formed in this order on the upper surface of the stacked body LMs.

The resist layer 80 as a third resist layer has a rectangular shape including a side 80y as a second side extending in the Y direction, for example, and partially covers the upper surface of the stacked body LMs.

The stopper layer STPb as a second stopper layer is formed so as to cover the upper surface and the side surface of the resist layer 80 including the side 80y, and to cover the upper surface and the staircase of the stacked body LMs exposed from the resist layer 80. The stopper layer STPb is also a semiconductor layer such as an amorphous silicon layer or a polysilicon layer, or a metal layer such as an aluminum layer, a tungsten layer, or a platinum layer, and is formed by sputter deposition, low-temperature CVD at 90° C. or lower, or the like.

The resist layer 90 as a fourth mask layer is formed so as to cover the upper surface and the side surface of the resist layer 80 including the side 80y with interposing the stopper layer STPb. As a result, the resist layer 90 also has a rectangular shape along the side surface of the resist layer 80 including the side 80y. At this time, the resist layer 90 is formed such that the side surface of the resist layer 90 facing the side 80y is disposed at a position slightly retracted from the uppermost stair of the step portion SR in the process of forming. Note that the stopper layer STPb is in a state of being interposed between the resist layers 80 and 90.

Thereafter, as in the case of the resist layer 70 described above, the process of etching away a pair of insulating layers NL and OL of the sequentially exposed stacked body LMs with retracting the resist layer 90 by slimming is repeated multiple times. As a result, in the staircase successively formed on a part of the step portion SR which have been formed already, the plurality of step surfaces transforms from a substantially linearly extending shape to a shape in which the central region protrudes toward a direction in which these staircases become higher.

As described above, also by the newly formed resist layer 90 in place of the resist layer 62, the shape of the step surface in which the central part in the Y direction gradually protrudes toward the direction in which the staircase becomes higher is once reset.

Figure 9B:
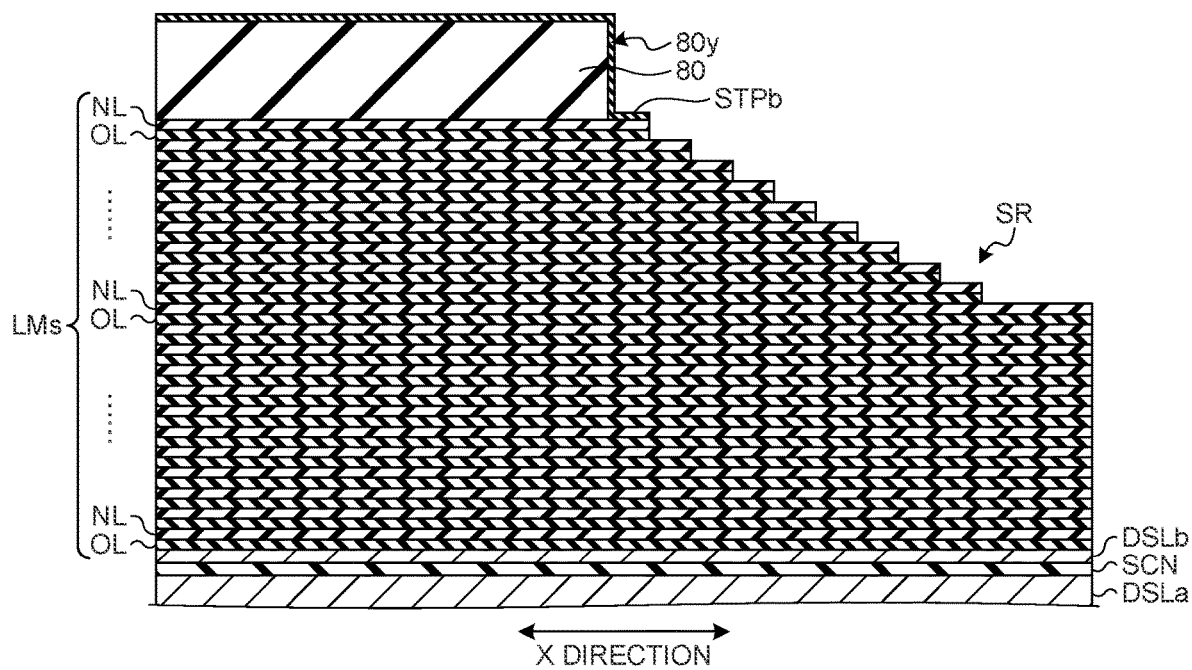

As illustrated in FIG. 9B, when the slimming of the resist layer 90 is repeated multiple times, the resist layer 90 which has gradually become to have an arcuate shape is completely removed, thereby exposing the stopper layer STPb interposed between the resist layers 80 and 90. As a result, the arcuate shape by the slimming is once reset.

Thereafter, as in the case of the resist layer 60 described above, the process of removing the stopper layer STPb covering the resist layer 80 and the stacked body LMs and etching away a pair of insulating layers NL and OL of the sequentially exposed stacked body LMs with retracting the resist layer 80 by slimming is repeated multiple times. As a result, a further staircase is successively formed with respect to a part of the step portion SR which has been formed so far.

Furthermore, in the successively formed staircase, the plurality of step surfaces transforms from a substantially linearly extending shape to a shape in which the central region protrudes toward a direction in which these staircases become higher. This forms the above-described shape of the step portion SR in which the plurality of step surfaces repeats a transformation from a shape substantially linearly extending to a shape in which the central region protrudes toward the direction in which the step portion SR becomes higher, as described above.

Thereafter, the slimming is repeated multiple times, and then the resist layer 80 is removed by ashing with use of oxygen plasma or the like, for example.

Figure 10A:
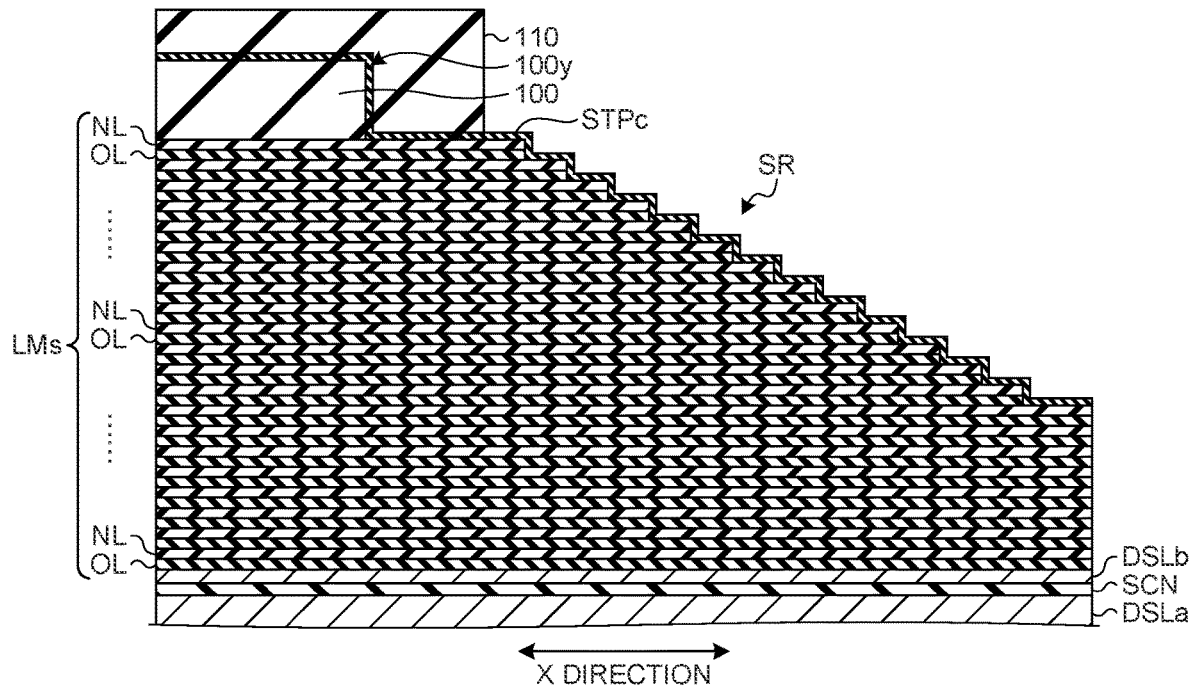
FIGS. 10A and 10B are cross-sectional views sequentially illustrating a part of the procedure of a method of manufacturing a semiconductor memory device according to an embodiment.

As illustrated in FIG. 10A, a resist layer 100, a stopper layer STPc, and a resist layer 110 are formed in this order on the upper surface of the stacked body LMs.

The resist layer 100 has a rectangular shape including a side 100y extending in the Y direction, for example, and partially covers the upper surface of the stacked body LMs.

The stopper layer STPc is formed so as to cover the upper surface and the side surface of the resist layer 100 including the side 100y, and to cover the upper surface and the staircase of the stacked body LMs exposed from the resist layer 100. The stopper layer STPc is also a semiconductor layer such as an amorphous silicon layer or a polysilicon layer, or a metal layer such as an aluminum layer, a tungsten layer, or a platinum layer, and is formed by sputter deposition, low-temperature CVD at 90° C. or lower, or the like.

The resist layer 110 is formed so as to cover the upper surface and the side surface of the resist layer 100 including the side 100y with interposing the stopper layer STPc. As a result, the resist layer 110 also has a rectangular shape along the side surface of the resist layer 100 including the side 100y. At this time, the resist layer 110 is formed such that the side surface of the resist layer 110 facing the side 100y is disposed at a position slightly retracted from the uppermost stair of the step portion SR in the process of forming. Note that the stopper layer STPc is in a state of being interposed between the resist layers 100 and 110.

Thereafter, as in the case of the resist layer 90 described above, the process of etching away a pair of insulating layers NL and OL of the sequentially exposed stacked body LMs with retracting the resist layer 110 by slimming is repeated multiple times. As a result, in the staircase successively formed on a part of the step portion SR which have been formed already, the plurality of step surfaces transforms from a substantially linearly extending shape to a shape in which the central region protrudes toward a direction in which these staircases become higher.

Figure 10B:
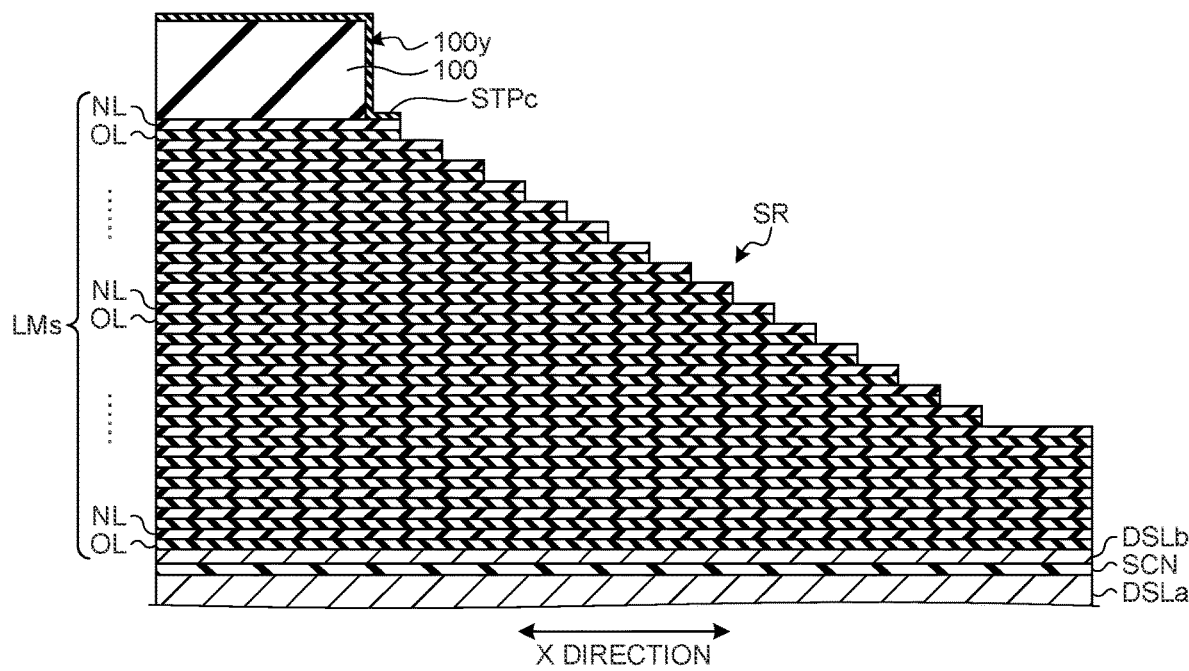

As illustrated in FIG. 10B, when the slimming of the resist layer 110 is repeated multiple times, the resist layer 110 is completely removed, thereby exposing the stopper layer STPc interposed between the resist layers 100 and 110. As a result, the arcuate shape by the slimming is once reset.

Thereafter, as in the case of the resist layer 80 described above, a process of removing the stopper layer STPc covering the resist layer 100 and the stacked body LMs and etching away a pair of insulating layers NL and OL of the sequentially exposed stacked body LMs with retracting the resist layer 100 by slimming is repeated multiple times.

As a result, a further staircase is successively formed with respect to a part of the step portion SR which has been formed so far. In addition, as described above, toward the direction in which the step portion SR becomes higher, the above-described shape of the step portion SR in which the plurality of step surfaces repeats a transformation from a substantially linearly extending shape to a shape in which the central region protrudes is further formed.

Thereafter, after the slimming is repeated multiple times, the resist layer 100 is removed by ashing with use of oxygen plasma or the like, for example.

Figure 11A:
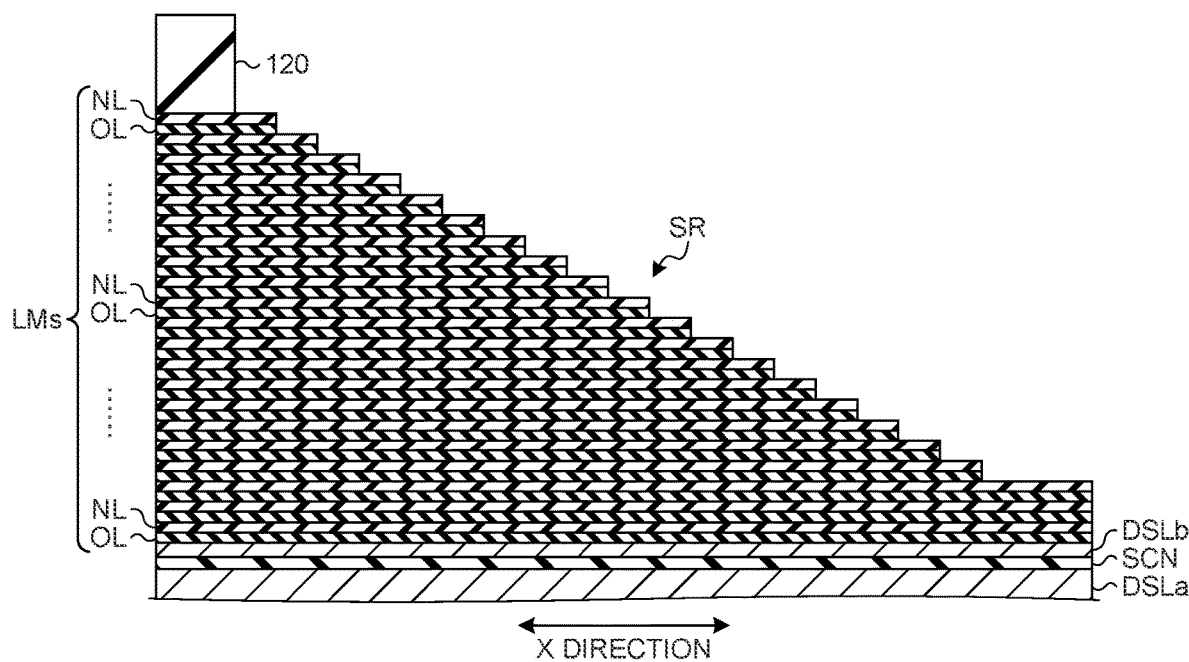
FIGS. 11A and 11B are cross-sectional views sequentially illustrating a part of the procedure of a method of manufacturing a semiconductor memory device according to an embodiment.

As illustrated in FIG. 11A, a resist layer 120 is formed on the upper surface of the stacked body LMs. At this time, the resist layer 120 is formed such that one side surface of the resist layer 120 is disposed at a position slightly retracted from the uppermost stair of the step portion SR in the process of forming.

Thereafter, a process of etching away a pair of insulating layers NL and OL of the sequentially exposed stacked body LMs with retracting the resist layer 120 by slimming is repeated multiple times. As a result, toward the direction in which the step portion SR becomes higher, the above-described shape of the step portion SR in which the plurality of step surfaces repeats a transformation from a substantially linearly extending shape to a shape in which the central region protrudes is further formed.

Figure 11B:
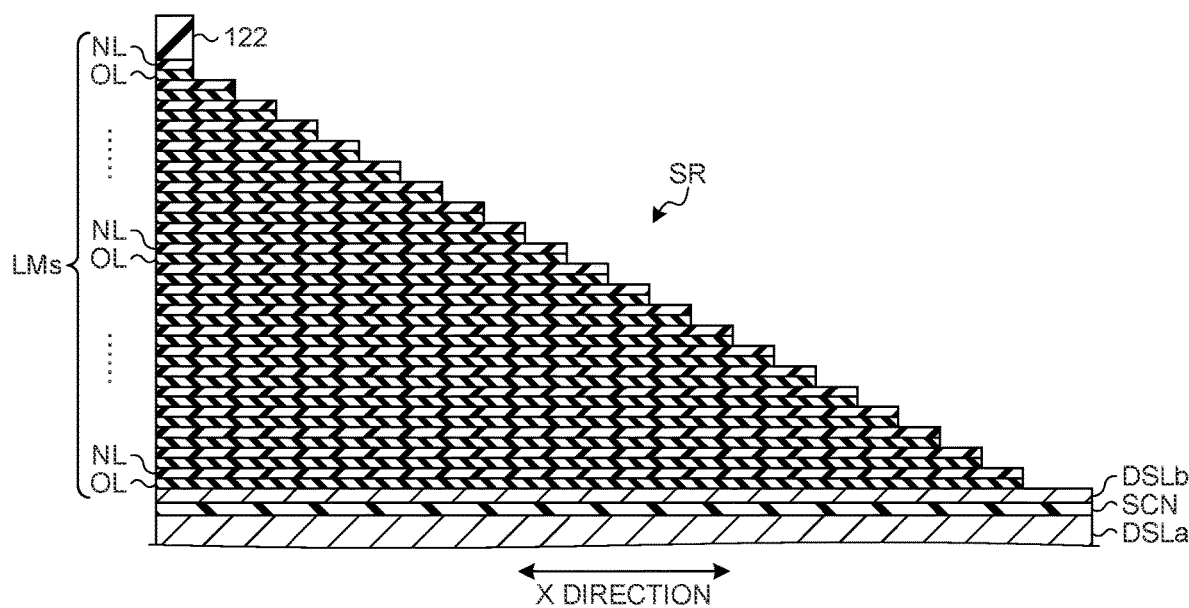

As illustrated in FIG. 11B, when the process of etching away the insulating layers NL and OL is performed until the insulating layers NL and OL of the lowermost layer of the stacked body LMs, the entire step portion SR is formed in the stacked body LMs. In addition, the stacked body LMs becomes to have a rectangular shape having ends on both sides in the X direction and on both sides in the Y direction.

Thereafter, the resist layer 122 formed by multiple times of slimming of the resist layer 120 is removed by ashing with use of oxygen plasma or the like, for example.

As described above, at each time the resist layers 70, 90, 110, and 120 each are newly formed, the staircase in which the plurality of step surfaces transforms from the substantially linearly extending shape to the shape in which the central region protrudes is successively formed on the upper layer side of one another, thereby forming the step portion SR having the step surface SP having the above-described shape illustrated in FIG. 3A.

Note that in the examples set forth in FIGS. 4A to 11B, at the time of newly forming the resist layers 90, 110, and 120, the slimming is started while the end in the X direction of each of the resist layers 90, 110, and 120 is disposed in the vicinity of the uppermost stair of the already formed staircase.

However, the method of forming the step portion SR is not limited thereto. For example, the slimming may be started while the end in the X direction of the resist layer to be newly formed is disposed on the exposed surface of the stacked body LMs exposed at the lowermost stair of the already formed staircase at a position away from the central region of the stacked body LMs. In this case, the already formed staircase and an extensive exposed surface of the stacked body LMs are in a state of being covered with a new resist layer. By starting slimming from this state, the newly formed staircase is formed toward the lowermost stair of the already formed staircase.

According to such method, a new staircase can be formed without exposing the already formed staircase to plasma processing, and hence a step portion SR having a desired shape can be more easily achieved.

Next, FIGS. 12A to 18B illustrate how the step portion SRd is formed. FIGS. 12A to 18B are cross-sectional views along the Y direction, including the step portion SRd in process of manufacturing.

Figure 12A:
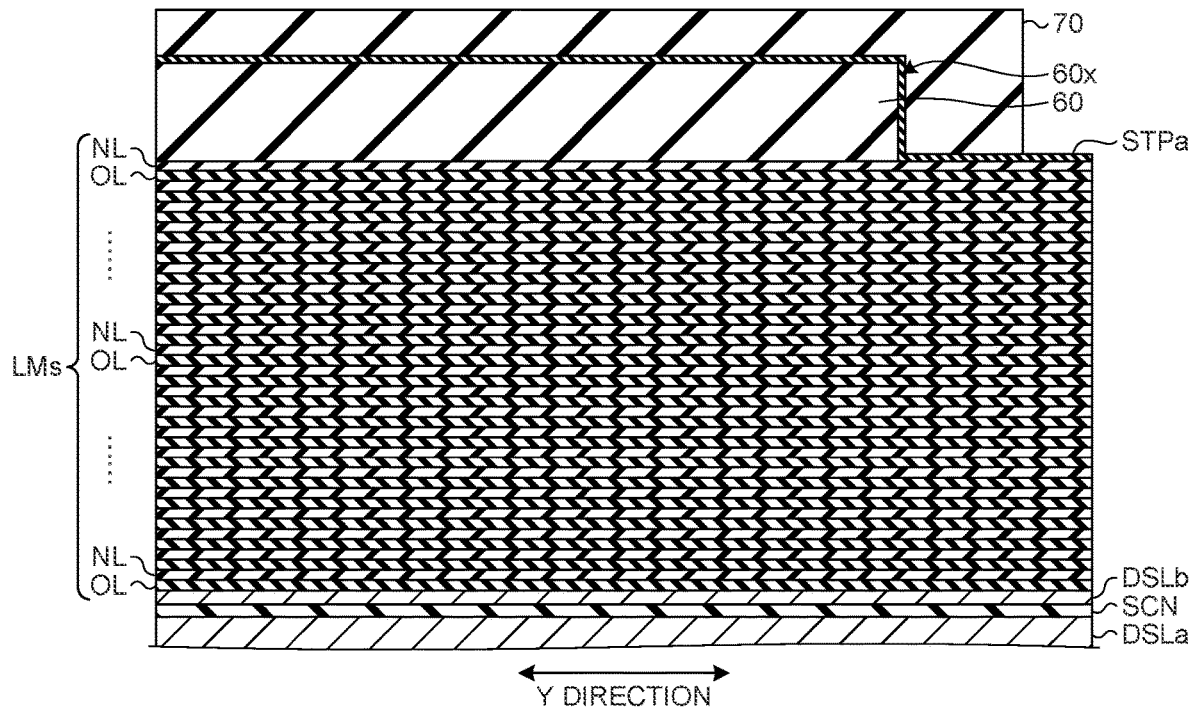
FIGS. 12A and 12B are cross-sectional views sequentially illustrating a part of the procedure of a method of manufacturing a semiconductor memory device according to an embodiment.

As illustrated in FIG. 12A, also in a region where the step portion SRd is to be formed later, a resist layer 60, a stopper layer STPa, and a resist layer 70 are formed in this order on the upper surface of the stacked body LMs by the above-described process of FIG. 4A.

As described above, the resist layer 60 that has the side 60$y$ extending in the Y direction and covers the upper surface of a part of the stacked body LMs also has a side 60$x$ as a third side extending in the X direction. The stopper layer STPa also covers the side surface of the resist layer 60 including the side 60$x$. The resist layer 70 also covers the side surface of the resist layer 60 including the side 60$x$.

Figure 12B:
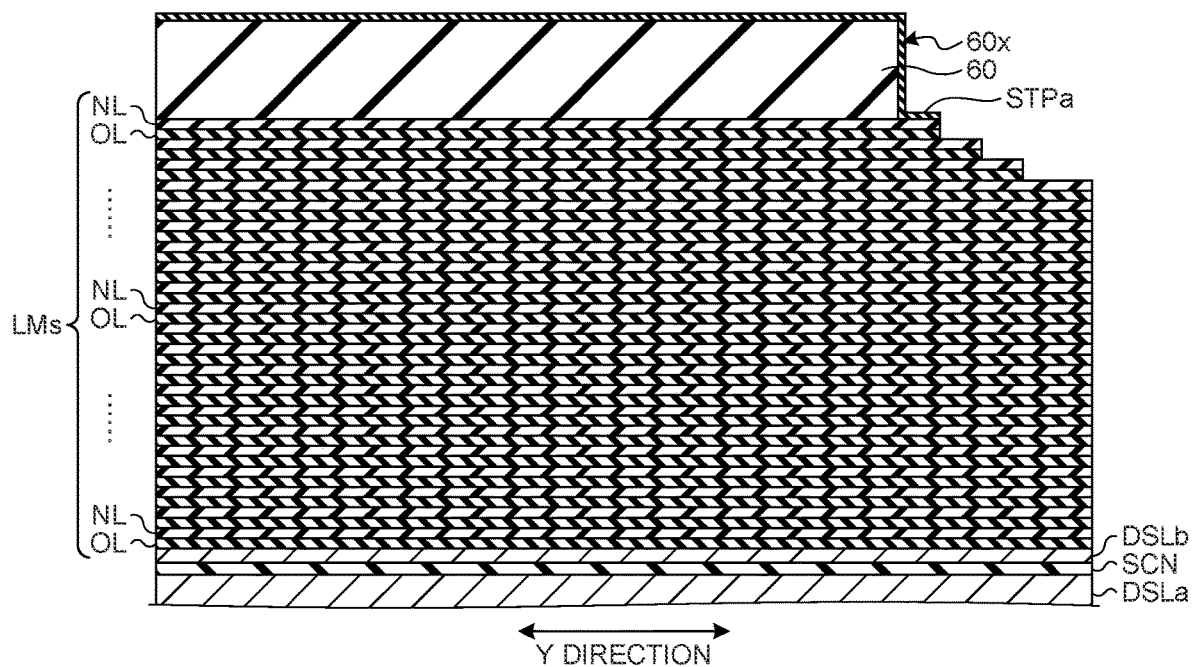

As illustrated in FIG. 12B, by the above-described processes of FIGS. 4B to 7A, also on the side of the side surface of the resist layer 70 extending in the X direction, a process of etching away a pair of insulating layers NL and OL of the sequentially exposed stacked body LMs with retracting the resist layer 70 by slimming is repeated multiple times. At this time, by the multiple times of slimming, the side surface of the resist layer 70 extending in the X direction also becomes to have an arcuate shape in which the central part in the X direction protrudes.

As a result, also on the side of the side surface of the resist layer 70 extending in the X direction, the plurality of step surfaces of the staircase formed by removing the pair of insulating layers NL and OL transforms from a substantially linearly extending shape to a shape in which the central region protrudes toward the direction in which these staircases become higher.

As in the above-described process of FIG. 7A, the resist layer 70 is completely removed by the repetition of multiple times of slimming, thereby exposing the stopper layer STPa also on the side surface of the resist layer 60 including the side 60$x$. As a result, the arcuate shape by slimming is once reset at the stopper layer STPa also on the side of the side surface of the resist layer 70 extending in the X direction.

Figure 13A:
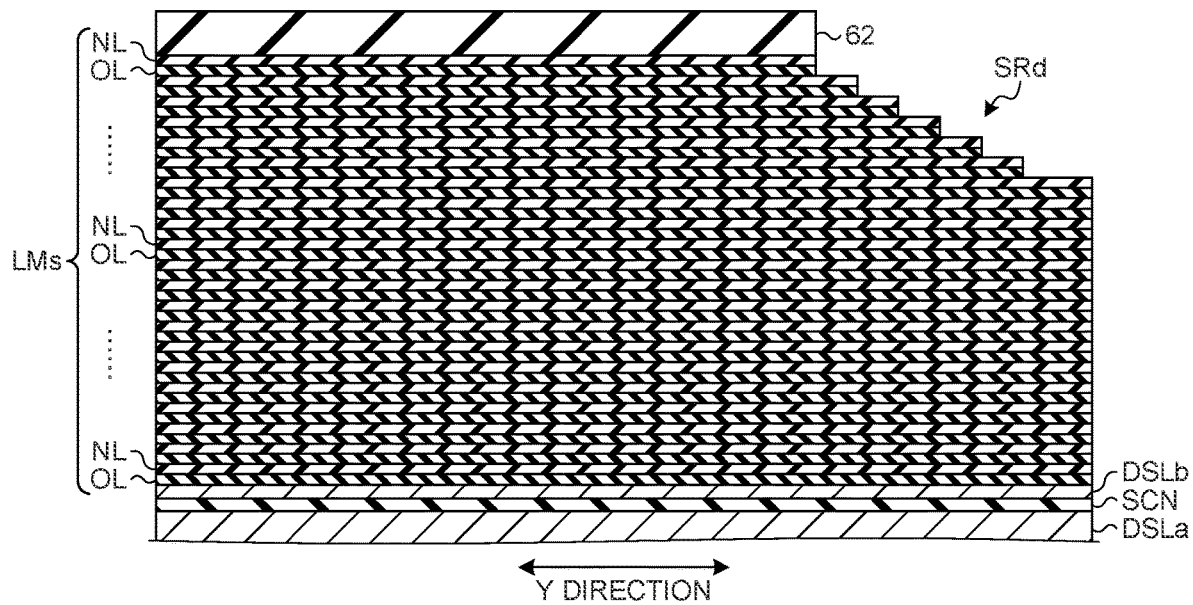
FIGS. 13A and 13B are cross-sectional views sequentially illustrating a part of the procedure of a method of manufacturing a semiconductor memory device according to an embodiment.

As illustrated in FIG. 13A, by the above-described processes of FIGS. 7B to 8B, also on the side of the side 60$x$ of the resist layer 60 extending in the X direction, a process of etching away a pair of insulating layers NL and OL of the sequentially exposed stacked body LMs with retracting the resist layer 60 by slimming is repeated multiple times. At this time, by the multiple times of slimming, the side surface of the resist layer 60 extending in the X direction also has an arcuate shape in which the central part in the X direction protrudes.

As a result, also on the side of the side surface of the resist layer 60 extending in the X direction, the plurality of step surfaces of the staircase formed by removing the pair of insulating layers NL and OL transforms from a substantially linearly extending shape to a shape in which the central region protrudes toward the direction in which these staircases become higher.

Thereafter, as described above, the remaining resist layer 62 is removed by ashing with use of oxygen plasma or the like.

Figure 13B:
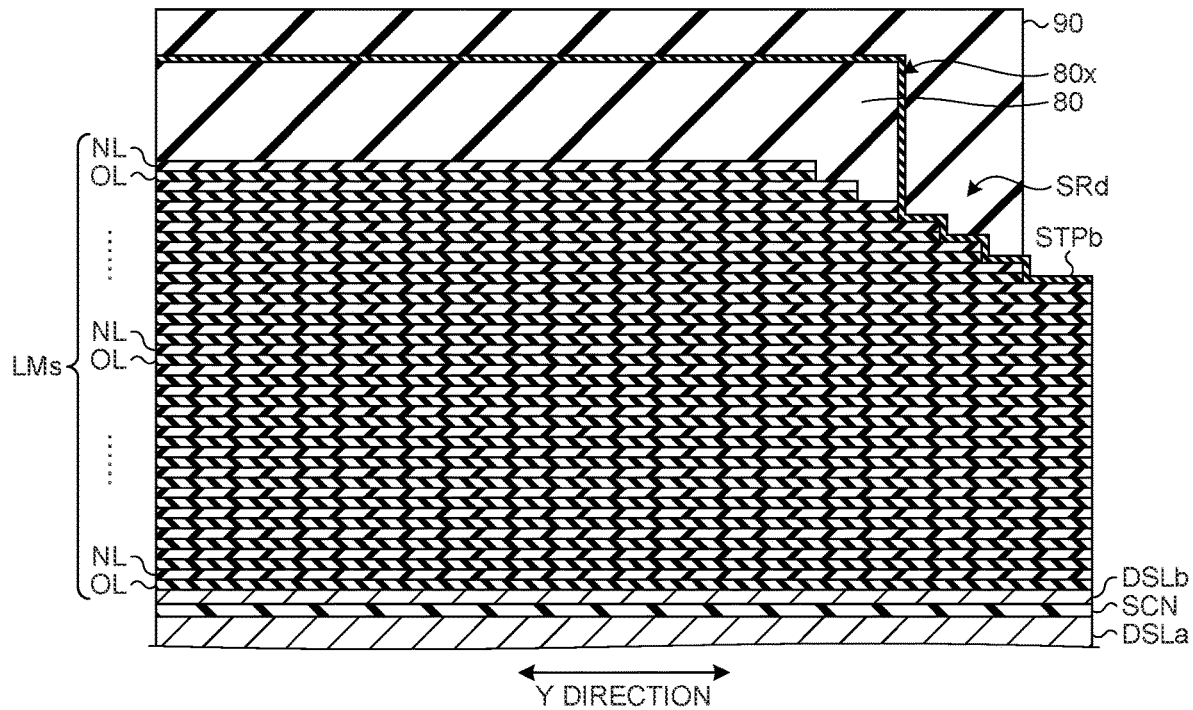

As illustrated in FIG. 13B, also in a region where the step portion SRd is to be formed later, a resist layer 80, a stopper layer STPb, and a resist layer 90 are formed in this order on the upper surface of the stacked body LMs by the above-described process of FIG. 9A.

As described above, the resist layer 80 that has a side 80$y$ extending in the Y direction and covers the upper surface of a part of the stacked body LMs has also a side 80$x$ as a fourth side extending in the X direction. However, in the region where the step portion SRd is formed, the resist layer 80 is formed on the stacked body LMs such that the side 80$x$ is disposed at a position substantially equal to the position where the above-described side 60$x$ of the resist layer 60 is disposed. As a result, the resist layer 80 covers a part of the staircase that has already been formed.

The stopper layer STPb covers also the side surface of the resist layer 80 including the side 80$x$. As described above, the stopper layer STPb is in a state of being interposed between the resist layers 80 and 90.

The resist layer 90 covers also the side surface of the resist layer 80 including the side 80$x$. However, in the region where the step portion SRd is formed, the resist layer 90 is formed on the stacked body LMs such that the side surface covering the side 80$x$ is disposed at a position substantially equal to the position where the above-described side surface of the resist layer 70 extending in the X direction before slimming is disposed. As a result, the resist layer 90 covers the entire staircases that have already been formed. In addition, the arcuate shape by slimming is once reset by the newly formed resist layer 90.

Figure 14A:
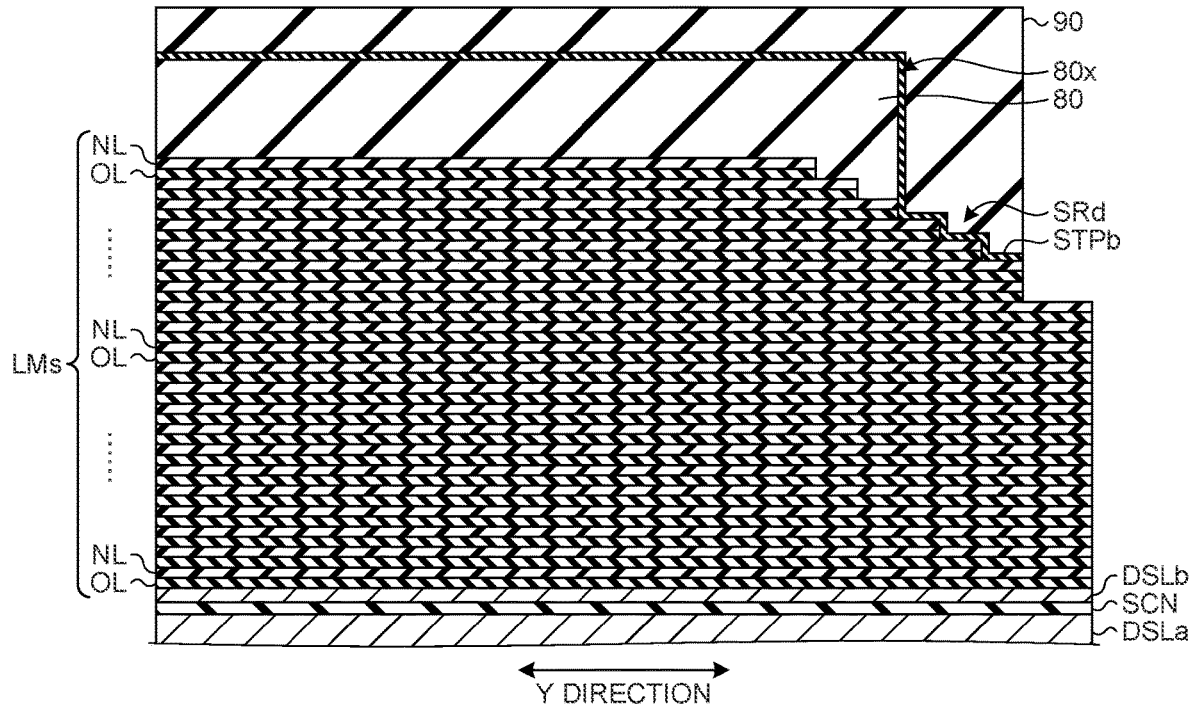
FIGS. 14A and 14B are cross-sectional views sequentially illustrating a part of the procedure of a method of manufacturing a semiconductor memory device according to an embodiment.

As illustrated in FIG. 14A, the stopper layer STPb on the upper surface of the stacked body LMs exposed from the resist layer 90 is removed, and also the pair of insulating layers NL and OL on the exposed surface of the stacked body LMs is removed. At this time, the staircase resulted by removing the insulating layers NL and OL is formed at a position overlapping the lowermost stair of the already formed staircase. As a result, the lowermost staircase includes two pairs of insulating layers NL and OL.

Figure 14B:
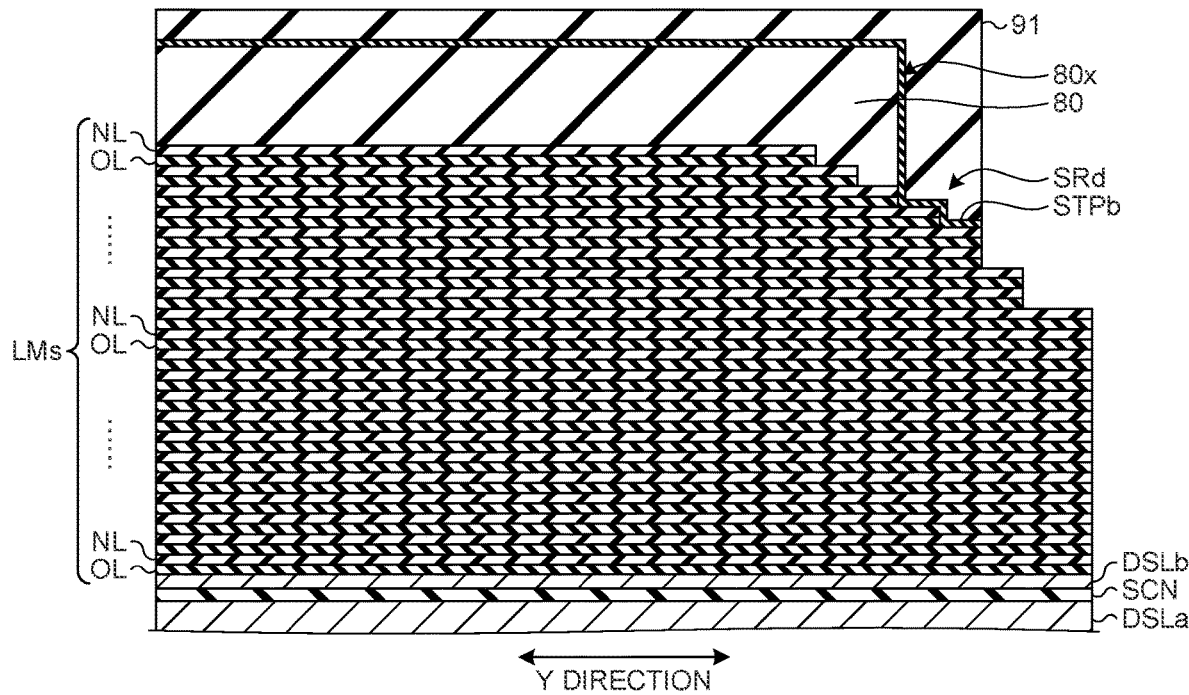

As illustrated in FIG. 14B, the resist layer 90 is slimmed to form a resist layer 91, the stopper layer STPb exposed from the resist layer 91 is removed, and furthermore a pair of insulating layers NL and OL on the exposed surface of the stacked body LMs is removed. At this time, the staircase resulted by removing the insulating layers NL and OL is formed at a position overlapping the lowermost stair and the second lowest stair of the already formed staircase. As a result, the lowermost and the second lowest staircases each include two pairs of insulating layers NL and OL.

Figure 15A:
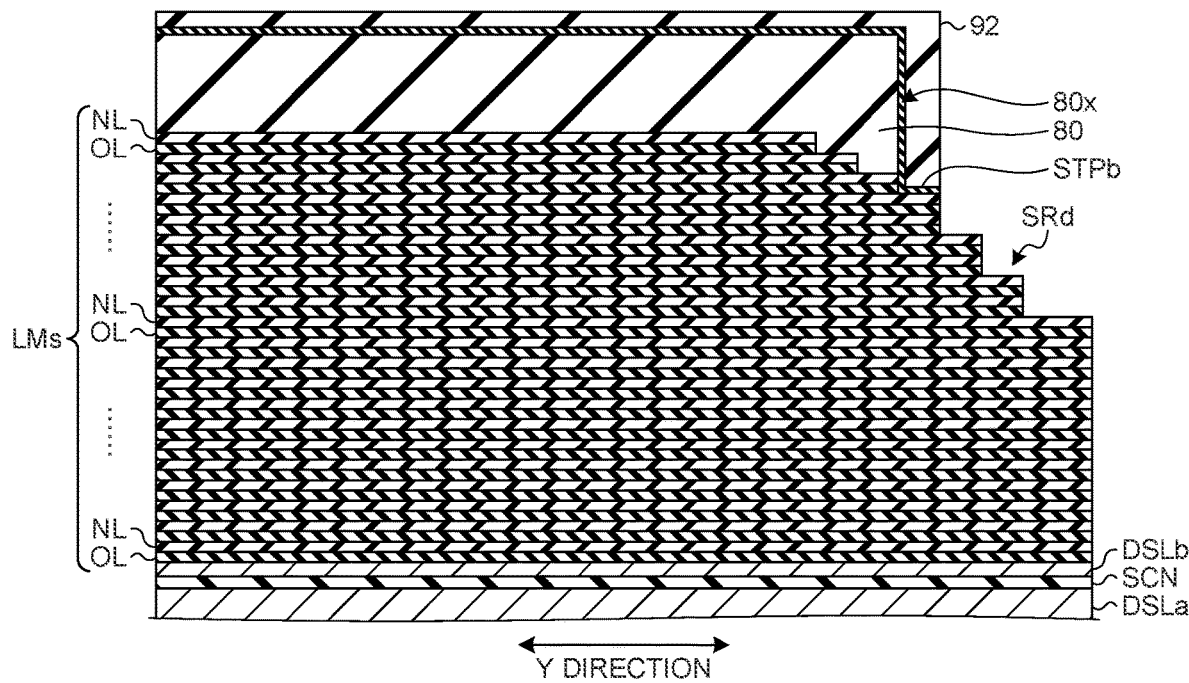
FIGS. 15A and 15B are cross-sectional views sequentially illustrating a part of the procedure of a method of manufacturing a semiconductor memory device according to an embodiment.

As illustrated in FIG. 15A, the resist layer 91 is further slimmed to form a resist layer 92, the stopper layer STPb exposed from the resist layer 92 is removed, and furthermore a pair of insulating layers NL and OL on the exposed surface of the stacked body LMs is removed. As a result, the lowermost, the second lowest and third lowest staircases each include two pairs of insulating layers NL and OL.

In these processes, also in the staircase formed to overlap the already formed staircase, the plurality of step surfaces transforms from a substantially linearly extending shape to a shape in which the central region protrudes toward a direction in which these staircases become higher.

Figure 15B:
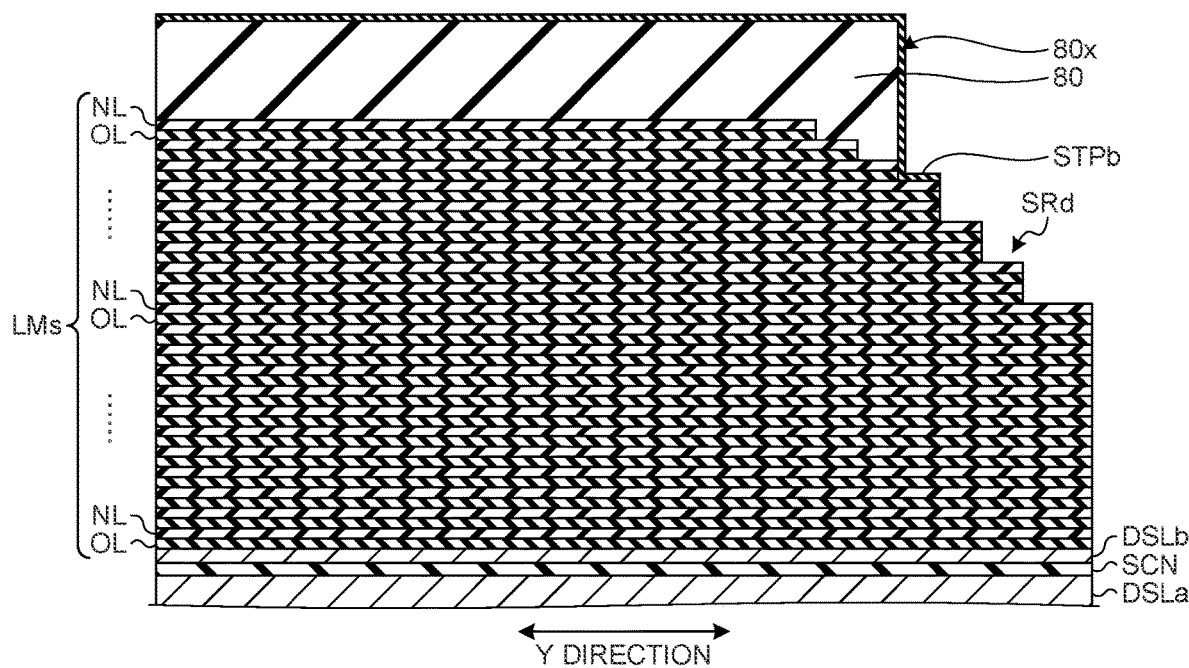

As illustrated in FIG. 15B, the resist layer 92 is removed by further slimming, thereby exposing the stopper layer STPb interposed between the resist layers 80 and 92. As a result, the arcuate shape by slimming is once reset at the stopper layer STPb.

Figure 16A:
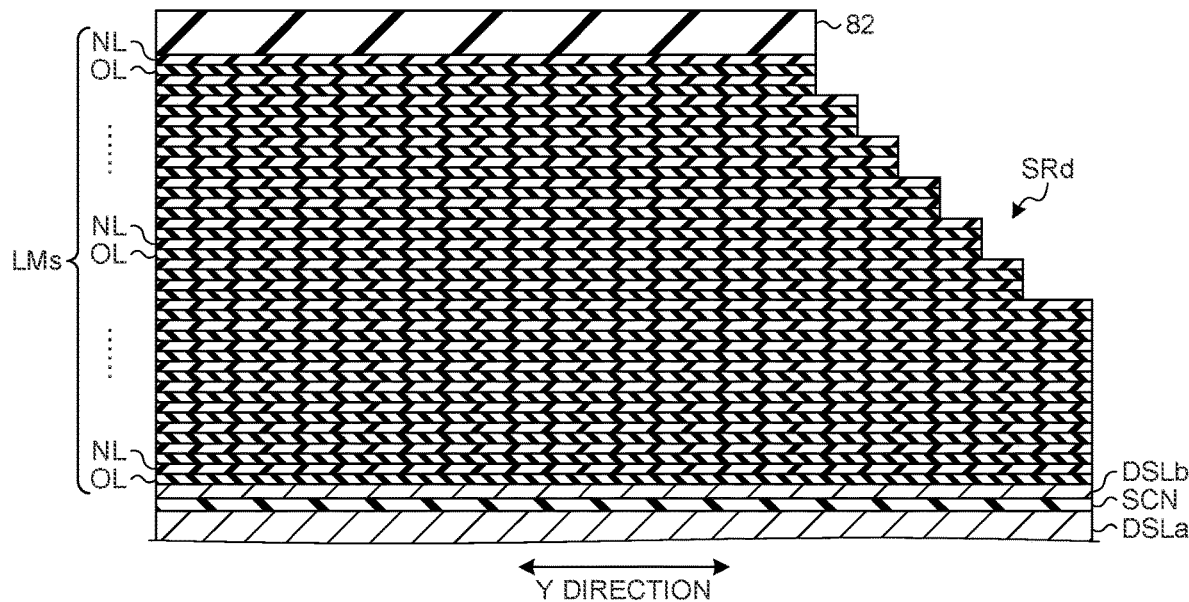
FIGS. 16A and 16B are cross-sectional views sequentially illustrating a part of the procedure of a method of manufacturing a semiconductor memory device according to an embodiment.

As illustrated in FIG. 16A, also on the side of the side 80x extending in the X direction of the resist layer 80, a process of etching away a pair of insulating layers NL and OL of the sequentially exposed stacked body LMs with retracting the resist layer 80 by slimming is repeated multiple times. At this time, by the multiple times of slimming, the side surface of the resist layer 80 extending in the X direction also has an arcuate shape in which the central part in the X direction protrudes.

As a result, each stair of the staircase includes three pairs of insulating layers NL and OL. Note that, also on the side of the side surface extending in the X direction of the resist layer 80, in the staircase formed to overlap the already formed staircase, the plurality of step surfaces transforms from a substantially linearly extending shape to a shape in which the central region protrudes toward a direction in which these staircases become higher.

Thereafter, the resist layer 82 formed by multiple times of slimming of the resist layer 80 is removed by ashing with use of oxygen plasma or the like.

Figure 16B:
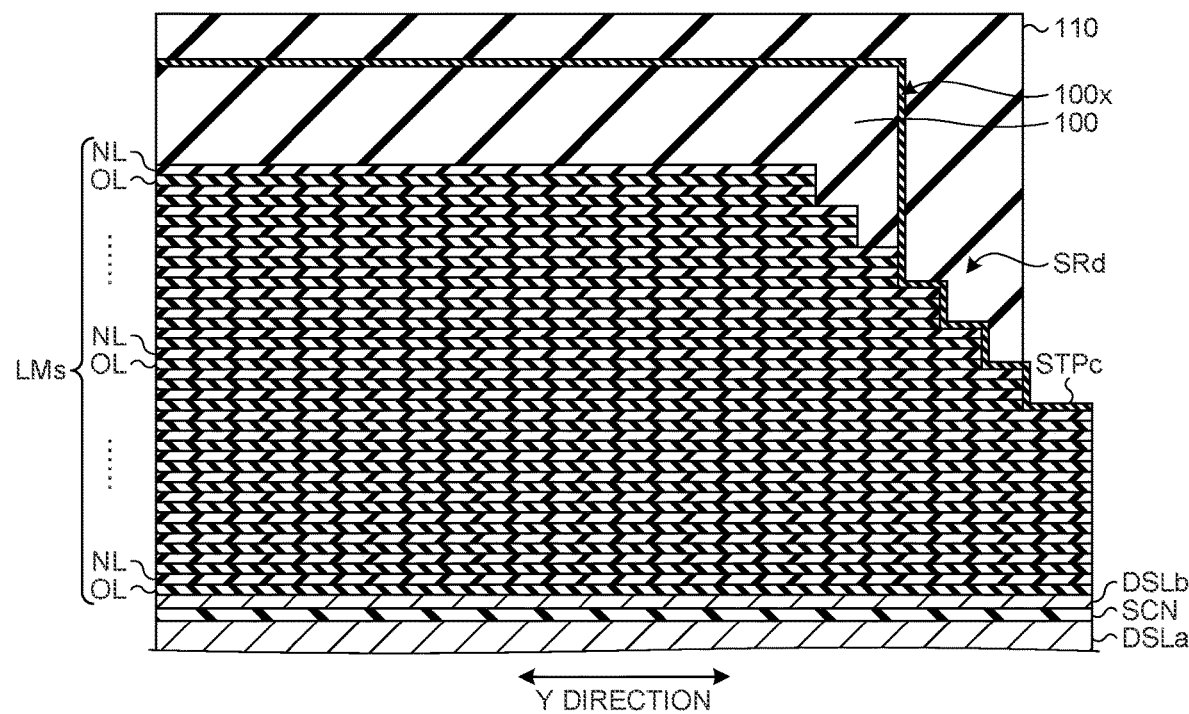

As illustrated in FIG. 16B, by the above-described process of FIG. 10A, also in a region where the step portion SRd is to be formed later, the resist layer 100, the stopper layer STPc, and the resist layer 110 are formed in this order on the upper surface of the stacked body LMs.

As described above, the resist layer 100 that has the side 100y extending in the Y direction and covers the upper surface of a part of the stacked body LMs has also a side 100x extending in the X direction. However, in the region where the step portion SRd is formed, the resist layer 100 is formed on the stacked body LMs such that the side 100x is disposed at the position substantially equal to the above-described side 80x of the resist layer 80. As a result, the resist layer 100 covers a part of the staircase that has already been formed.

The stopper layer STPc covers also the side surface of the resist layer 100 including the side 100x. As described above, the stopper layer STPb is in a state of being interposed between the resist layers 100 and 110.

The resist layer 110 covers also the side surface of the resist layer 100 including the side 100x. However, in the region where the step portion SRd is formed, the resist layer 110 is formed on the stacked body LMs such that the side surface covering the side 100x is disposed at a position substantially equal to the above-described side surface of the resist layer 90 before slimming extending in the X direction. As a result, the resist layer 110 covers the entire staircases that have already been formed. In addition, the arcuate shape by slimming is once reset by the newly formed resist layer 110.

Figure 17A:
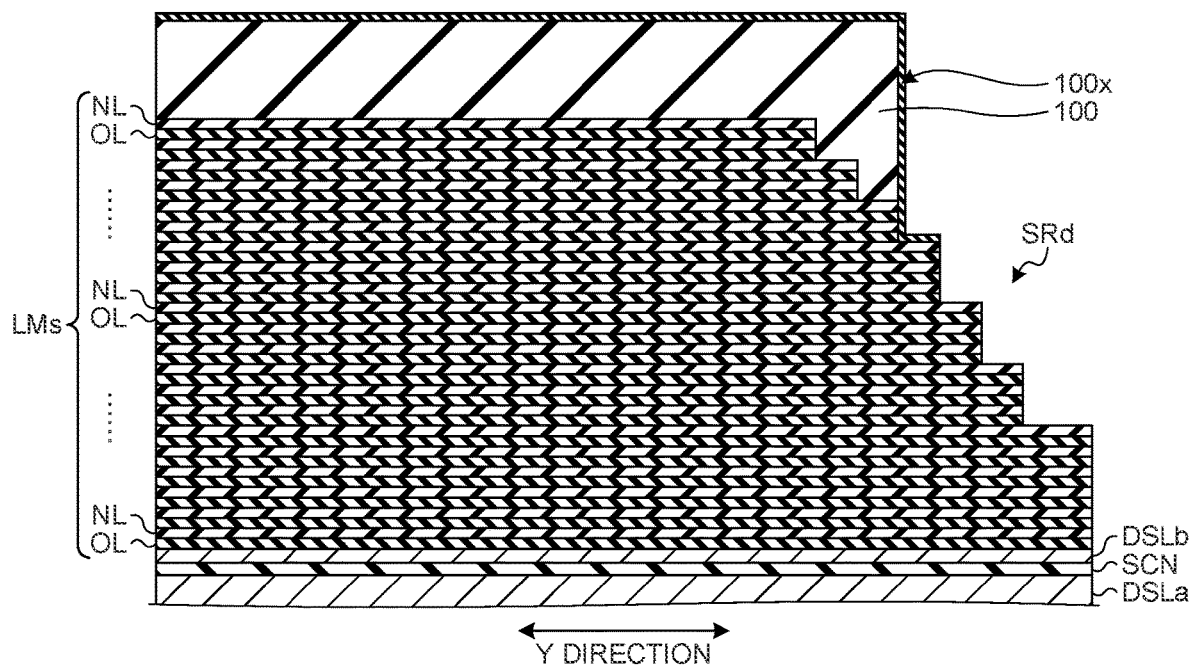
FIGS. 17A and 17B are cross-sectional views sequentially illustrating a part of the procedure of a method of manufacturing a semiconductor memory device according to an embodiment.

As illustrated in FIG. 17A, a process of etching away a pair of insulating layers NL and OL of the stacked body LMs that are sequentially exposed with retracting the resist layer 100 by slimming is repeated multiple times. As a result, a staircase is newly formed so as to overlap a part of the step portion SRd that has been formed so far.

Also at this time, in the staircase formed to overlap the already formed step portion SRd, the plurality of step surfaces transforms from a substantially linearly extending shape to a shape in which the central region protrudes toward a direction in which these staircases become higher.

Furthermore, the resist layer 110 is removed by multiple times of slimming, thereby exposing the stopper layer STPc interposed between the resist layers 100 and 110. As a result, the arcuate shape by the slimming is once reset at the stopper layer STPc.

Figure 17B:
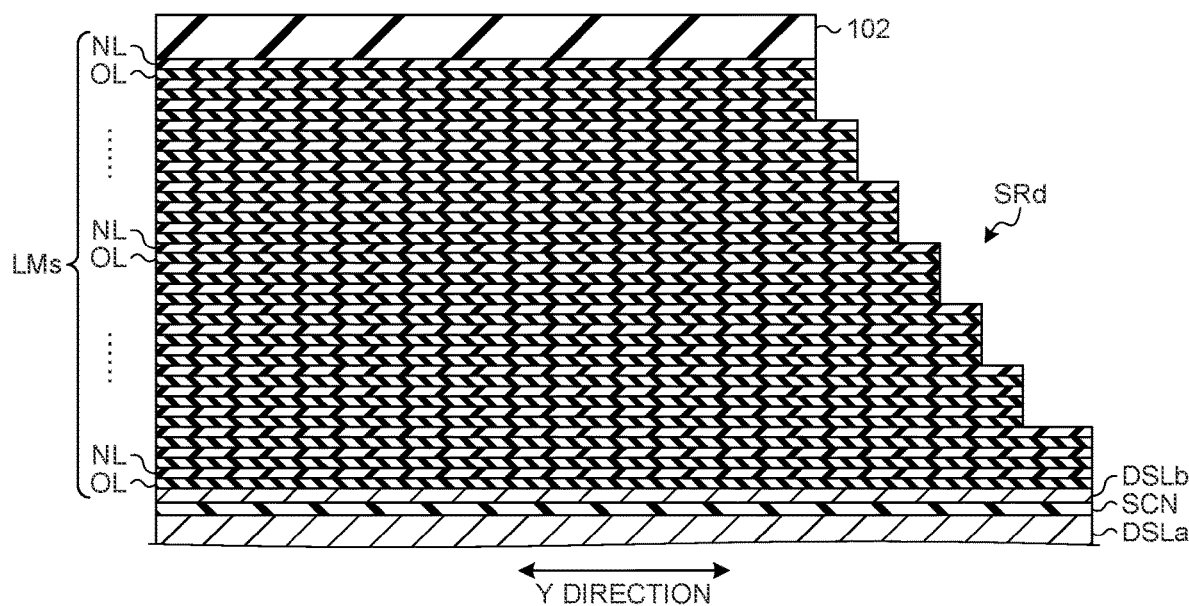

As illustrated in FIG. 17B, a process of etching away a pair of insulating layers NL and OL of the sequentially exposed stacked body LMs with retracting the resist layer 100 by slimming is repeated multiple times. At this time, by the multiple times of slimming, the side surface of the resist layer 100 extending in the X direction also has an arcuate shape in which the central part in the X direction protrudes.

As a result, each stair of the staircase includes three pairs of insulating layers NL and OL. In addition, also on the side of the side surface of the resist layer 100 extending in the X direction, in the staircase formed to overlap the already formed staircase, the plurality of step surfaces transforms from a substantially linearly extending shape to a shape in which the central region protrudes toward a direction in which these staircases become higher.

Thereafter, the resist layer 100 formed by multiple times of slimming of the resist layer 102 is removed by ashing with use of oxygen plasma or the like.

Figure 18A:
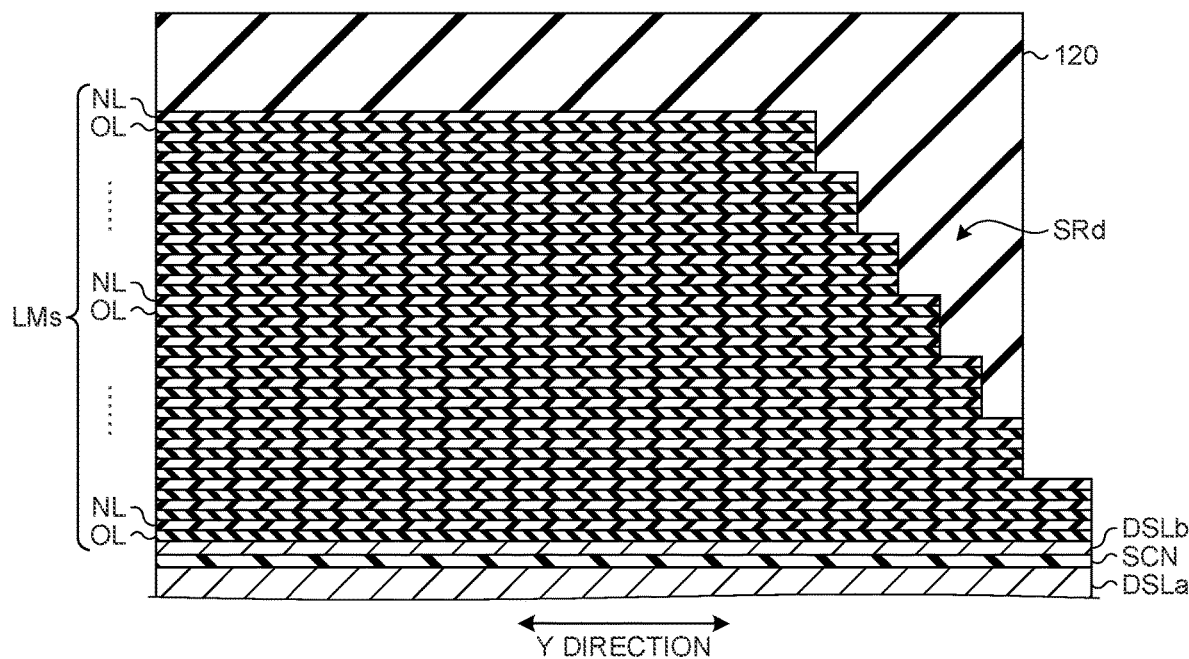
FIGS. 18A and 18B are cross-sectional views sequentially illustrating a part of the procedure of a method of manufacturing a semiconductor memory device according to an embodiment.

As illustrated in FIG. 18A, by the above-described process of FIG. 11A, the resist layer 120 is formed on the upper surface of the stacked body LMs also in the formation region of the step portion SRd.

As described above, the resist layer 120 covering a part of the upper surface of the stacked body LMs has a side surface extending in the X direction. However, in the formation region of the step portion SRd, the resist layer 120 is formed on the stacked body LMs such that the side surface extending in the X direction is disposed at a position substantially equal to the position of the above-described side wall of the resist layers 70 and 90 covering the sides 60x and 80x. As a result, the resist layer 120 covers the entire staircases that have already been formed.

Note that, the arcuate shape by slimming is once reset by the newly formed resist layer 120.

Figure 18B:
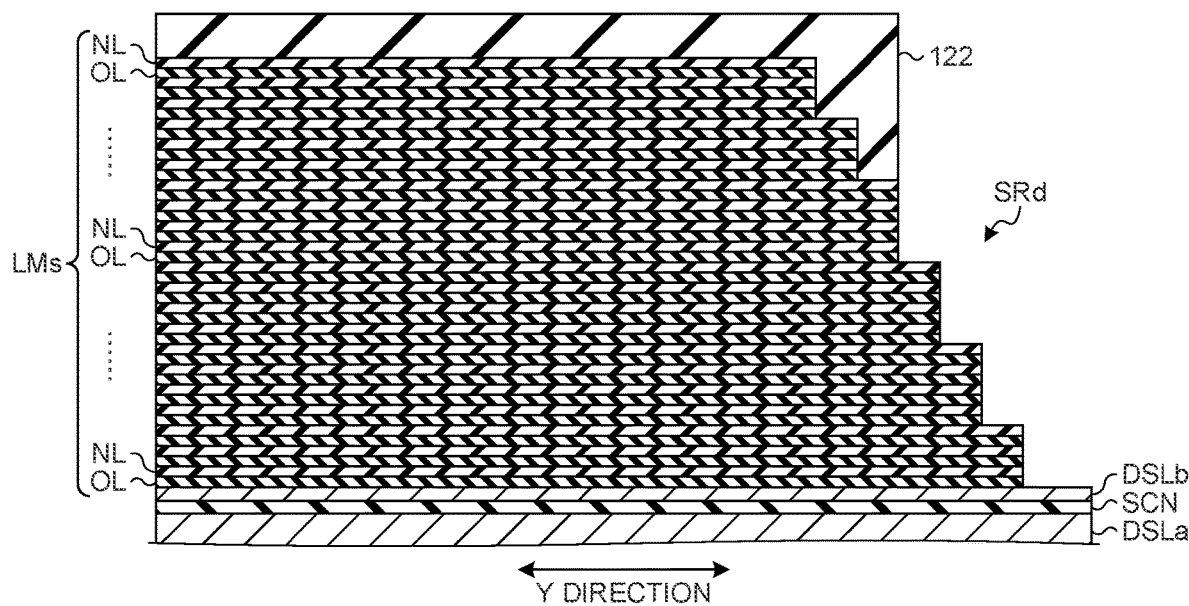

As illustrated in FIG. 18B, a process of etching away a pair of insulating layers NL and OL of the stacked body LMs that are sequentially exposed with retracting the resist layer 120 by slimming is repeated multiple times. As a result, a staircase is newly formed so as to overlap a part of the step portion SRd that has been formed so far. Note that, the process of etching away the insulating layers NL and OL is performed until the insulating layers NL and OL of the lowermost layer of the stacked body LMs, and the entire step portion SRd is formed in the stacked body LMs.

Also at this time, in the staircase formed to overlap the already formed step portion SRd, the plurality of step surfaces transforms from a substantially linearly extending shape to a shape in which the central region protrudes toward a direction in which these staircases become higher.

Thereafter, as described above, the remaining resist layer 122 is removed by ashing with use of oxygen plasma or the like.

As described above, at each time the resist layers 70, 90, 110, and 120 each are newly formed, the staircase in which the plurality of step surfaces transforms from the substantially linearly extending shape to the shape in which the central region protrudes is formed so as to overlap one another, whereby the step portion SRd including the step surface SPd having the above-described shape illustrated in FIG. 3B is formed.

That is, in FIG. 3B, among the plurality of step surfaces SPd extending substantially linearly in a direction along the X direction, the step surface SPd disposed at the point P1 illustrated in the vicinity of the lowermost stair of the step portion SRd is a step surface SPd formed by transferring the side surfaces of the newly formed resist layers 70, 90, 110, and 120 before slimming.

Note that, in FIG. 3B, among the plurality of step surfaces SPd extending substantially linearly in a direction along the X direction, the step surface SPd disposed at the point P2 illustrated between the lowermost stair and the uppermost stair of the step portion SRd is a step surface SPd formed by transferring the side surfaces of the resist layers 60, 80, and 100 after the removal of the stopper layers STPa, STPb, and STPc.

Thereafter, the insulating layer 51 covering the step portions SR and SRd is formed. Moreover, the insulating layer 52 that covers an unprocessed upper surface of the stacked body LMs and covers the insulating layer 51 on the step portions SR and SRd is formed.

Next, FIGS. 19A to 21C illustrate how the pillars PL are formed. FIGS. 19A to 21C are cross-sectional views along the Y direction of a region that becomes a memory region MR later.

As illustrated in FIG. 19A, also in the region that becomes memory region MR later, a lower source line DSLa, an intermediate insulating layer SCN, and an upper source line DSLb are formed in this order. Note that, a stacked body LMs in which each of a plurality of insulating layers NL and each of a plurality of insulating layers OL are alternately stacked one on another is formed on the upper source line DSLb. An insulating layer 52 is formed on the upper surface of the stacked body LMs.

In such a state, a plurality of memory holes MH that penetrates through the insulating layer 52, the stacked body LMs, the upper source line DSLb, and the intermediate insulating layer SCN, and extends to the lower source line DSLa is formed.

As illustrated in FIG. 19B, in the memory hole MH, there is formed a memory layer ME in which a block insulating layer BK, a charge storage layer CT, and a tunnel insulating layer TN are stacked in this order from the outer peripheral side of the memory hole MH. The memory layer ME is formed also on the upper surface of the insulating layer 52. As described above, the block insulating layer BK and the tunnel insulating layer TN each are a silicon oxide layer or the like, for example, and the charge storage layer CT is a silicon nitride layer or the like, for example.

As illustrated in FIG. 19C, a channel layer CN such as a polysilicon layer or an amorphous silicon layer is formed inside the memory layer ME. The channel layer CN is formed also on the upper surface of the insulating layer 52 with interposing the memory layer ME.

Furthermore, a core layer CR such as a silicon oxide layer is filled further inside the channel layer CN. The core layer CR is formed also on the upper surface of the insulating layer 52 with interposing the memory layer ME and the channel layer CN.

As illustrated in FIG. 20A, the upper surface of the insulating layer 52 and the core layer CR in the memory hole MH are etched back. At this time, using an underlying channel layer CN as a stopper layer, the core layer CR is etched at maintaining an appropriate selectivity thereof in relation to the channel layer CN, whereby the core layer CR portion in the memory hole MH is recessed, and a dent DN is formed at the upper end portion of the memory hole MH. Moreover, the core layer CR on the upper surface of the insulating layer 52 is removed, and the channel layer CN is exposed.

As illustrated in FIG. 20B, the upper surface of the insulating layer 52 and the channel layer CN in the memory hole MH are etched back. At this time, using an underlying memory layer ME as a stopper layer, the channel layer CN is etched at maintaining an appropriate selectivity ratio thereof in relation to the memory layer ME, whereby the channel layer CN portion in the memory hole MH is retracted downward, and the dent DN at the upper end portion of the memory hole MH is enlarged. The upper end portion of the core layer CR protrudes at the central region of the dent DN. Moreover, the channel layer CN on the upper surface of the insulating layer 52 is removed, and the memory layer ME is exposed.

As illustrated in FIG. 20C, the upper surface of the insulating layer 52 and the memory layer ME in the memory hole MH are etched back. At this time, the amount of etching is adjusted so as not to remove the underlying insulating layer 52. As a result, the memory layer ME region in the memory hole MH is retracted downward, and the dent DN at the upper end portion of the memory hole MH is further enlarged. The upper end portion of the core layer CR protruding at the central part of the dent DN is also removed, and the bottom surface of the dent DN becomes substantially flat. Moreover, the memory layer ME on the insulating layer 52 is removed, and the insulating layer 52 is exposed.

Note that the processes in FIGS. 20A to 20C are controlled such that the bottom surface of the dent DN after the process in FIG. 20C stays within the height position of the insulating layer 52 and does not attain the insulating layer NL of the uppermost layer.

Figures 21A, 21B, 21C:
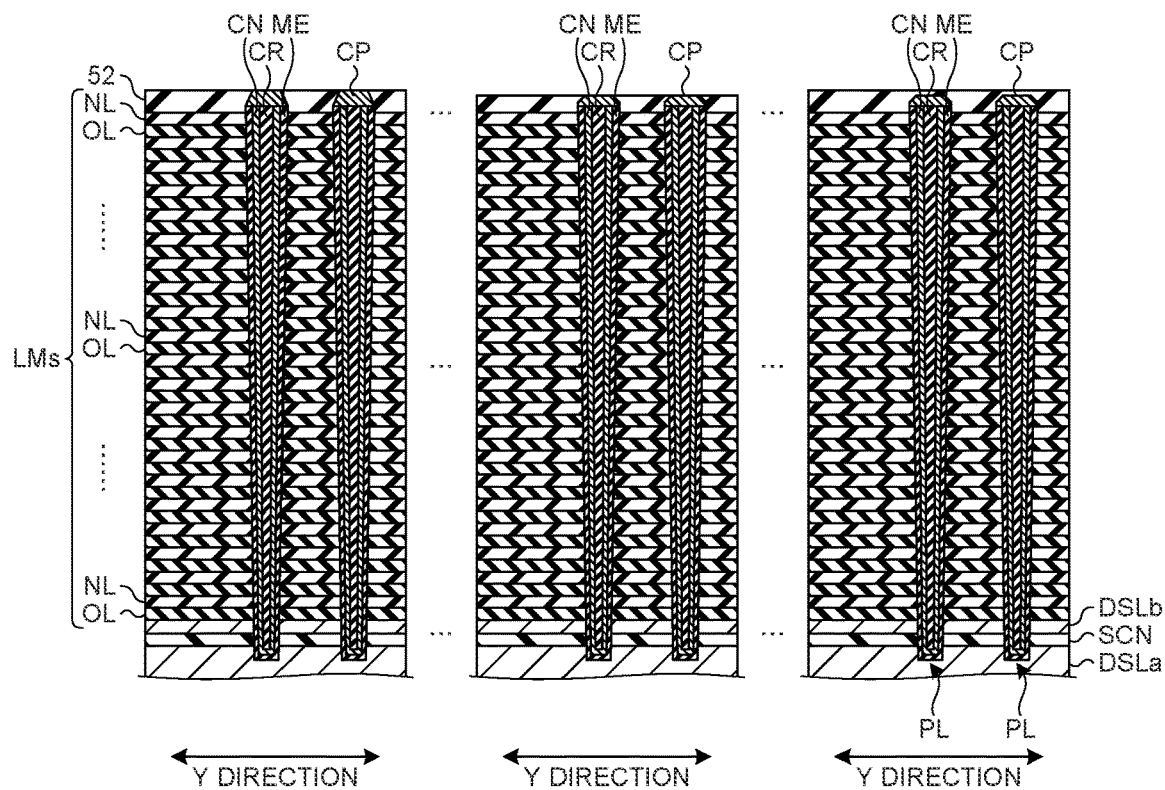
FIGS. 21A to 21C are cross-sectional views sequentially illustrating a part of the procedure of a method of manufacturing a semiconductor memory device according to an embodiment.

As illustrated in FIG. 21A, the inside of the dent DN is filled with a polysilicon layer, an amorphous silicon layer, or the like to form a cap layer CP.

As illustrated in FIG. 21B, the insulating layer 52, together with the upper surface of the cap layer CP, is etched back. As a result, the thicknesses of the insulating layer 52 and the cap layer CP decrease.

As illustrated in FIG. 21C, the thickness of the insulating layers 52 decreased by etch-back is increased. As a result, the upper surface of the cap layer CP is covered with the insulating layer 52, and a pillar PL is formed in a region which will be the memory region MR later.

However, at this stage, the channel layer CN of the pillar PL is entirely covered with the memory layer ME, and is not in contact with the intermediate insulating layer SCN which will be the intermediate source line BSL later.

Next, FIGS. 22A to 24B illustrate how the intermediate source line BSL and the word line WL are formed. FIGS. 22A to 24B illustrate cross sections along the Y direction of a region which will be the memory region MR later, as with FIGS. 19A to 21C described above.

Figures 22A, 22B, 22C:
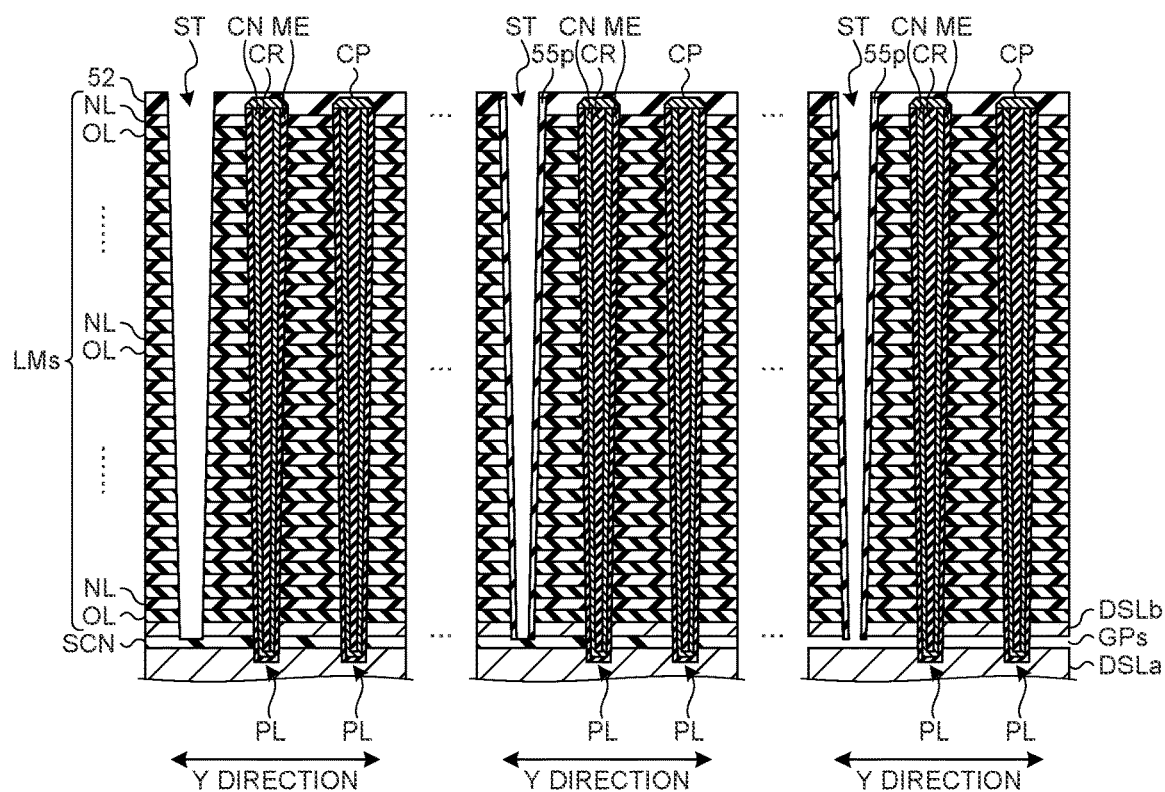
FIGS. 22A to 22C are cross-sectional views sequentially illustrating a part of the procedure of a method of manufacturing a semiconductor memory device according to an embodiment.

As illustrated in FIG. 22A, a slit ST that penetrates through the insulating layer 52, the stacked body LMs, and the upper source line DSLb, and extends to the intermediate insulating layer SCN is formed. The slit ST extends in the stacked body LMs also in a direction along the X direction.

As illustrated in FIG. 22B, an insulating layer 55p is formed on the side walls, facing each other in the Y direction, of the slit ST.

As illustrated in FIG. 22C, a removing liquid such as hot phosphoric acid that dissolves the silicon nitride layer such as the intermediate insulating layer SCN is allowed to flow through the slit ST whose side wall is protected by the insulating layer 55p, thereby removing the intermediate insulating layer SCN sandwiched between the lower source line DSLa and the upper source line DSLb.

As a result, a gap layer GPs is formed between the lower source line DSLa and the upper source line DSLb. Moreover, a part of the memory layer ME in the outer peripheral portion of the pillar PL is exposed in the gap layer GPs. At this time, the side wall of the slit ST is protected with the insulating layer 55p, thereby suppressing the insulating layer NL go so far in the stacked body LMs from being removed.

As illustrated in FIG. 23A, a chemical liquid is appropriately allowed to flow into the gap layer GPs through the slit ST, thereby sequentially removing the block insulating layer BK, the charge storage layer CT, and the tunnel insulating layer TN, each of which is exposed in the gap layer GPs. As a result, the memory layer ME is removed from a part of the side wall of the pillar PL, and a part of the channel layer CN on the inner side is exposed in the gap layer GPs.

As illustrated in FIG. 23B, a source gas such as amorphous silicon is allowed to flow from the slit ST whose side wall is protected with the insulating layer 55p, and the gap layer GPs is filled with amorphous silicon or the like. Moreover, the entire configuration including the stacked body is heat treated thereby transforming the amorphous silicon filled in the gap layer GPs into polycrystalline, so that the intermediate source line BSL containing polysilicon or the like is formed.

As a result, the source line SL is connected via the intermediate source line BSL to the side surface of a part of the channel layer CN of the pillar PL.

As illustrated in FIG. 23C, the insulating layer 55p on the side wall of the slit ST is once removed.

As illustrated in FIG. 24A, a removing liquid such as hot phosphoric acid, for example, is allowed to flow into the stacked body LMs from the slit ST from which the insulating layers 55p on the side walls have been removed, thereby removing the insulating layers NL of the stacked body LMs. As a result, there is formed a stacked body LMg including a plurality of gap layers GP from which the insulating layers NL between the insulating layers OL are removed.

Note that the stacked body LMg including the plurality of gap layers GP has a fragile structure. Such a fragile stacked body LMg is supported by, for example, a plurality of pillars PL. This suppresses the remaining insulating layer OL from bending and the stacked body LMg from distorting or collapsing.

As illustrated in FIG. 24B, a source gas of a conductive material such as tungsten or molybdenum, for example, is allowed to flow into the stacked body LMg from the slit ST, and the gap layer GP of the stacked body LMg is filled with the conductive material to form a plurality of word lines WL. As a result, there is formed a stacked body LM in which each of the plurality of word lines WL and each of the plurality of insulating layers OL are alternately stacked one on another.

As described above, the process of forming the intermediate source line BSL from the intermediate insulating layer SCN and the process of forming the word line WL from the insulating layer NL each are also referred to as a replacement process.

Thereafter, a contact CC is formed in the step portion SR. That is, a plurality of contact holes penetrating through the insulating layers 52 and 51 and extending to each of the word lines WL included in each stair of the step portion SR is formed all at once, and the insulating layer 56 and the conductive layer 22 (see FIG. 2A) are formed in the contact holes.

Note that, a plate contact LI which will be a source line contact is formed. That is, the insulating layer 55 is formed on the side wall of the slit ST, and the conductive layer 21 is filled in the insulating layer 55. However, the insulating layer 55 and the like may be filled without forming the conductive layer 21 in the slit ST, thereby forming a plate-like portion that does not serve as a source line contact.

Note that, the insulating layer 53 is formed on the insulating layer 52, and a plug V0 that penetrates through the insulating layer 53 and to be connected to each of the plate contact LI and the contact CC is formed. Moreover, a plug CH that penetrates through the insulating layers 53 and 52 and to be connected to the pillar PL is formed. Furthermore, the insulating layer 54 is formed on the insulating layer 53, and the upper layer wiring MX, a bit line BL, and the like to be connected to each of the plugs V0 and CH are formed.

Note that the plugs V0 and CH, the upper layer wiring MX, the bit line BL, and the like may be formed all at once by using a dual damascene method or the like, for example.

As in the manner described above, the semiconductor memory device 1 according to the embodiment is manufactured.

Comparative Example

In a semiconductor memory device such as a three-dimensional nonvolatile memory, there may be a case where a step portion in which a plurality of word lines is processed in a staircase shape in order to lead out a plurality of word lines stacked in a stacked body. The step portion is formed, for example, by multiple repetitions of slimming of resist layers and of etching of the stacked body before replacement.

However, the amount of retraction of the side surface of the resist layer by slimming is different between the vicinity of the center and the vicinity of the end of the side surface. That is, the amount of retraction is small in the vicinity of the center, and the amount of retraction is large in the vicinity of the end of the side surface of the resist layer. For this reason, when the slimming is repeated multiple times, the side surface of the resist layer becomes to have an arcuate shape in which the central part protrudes.

Figure 25A:
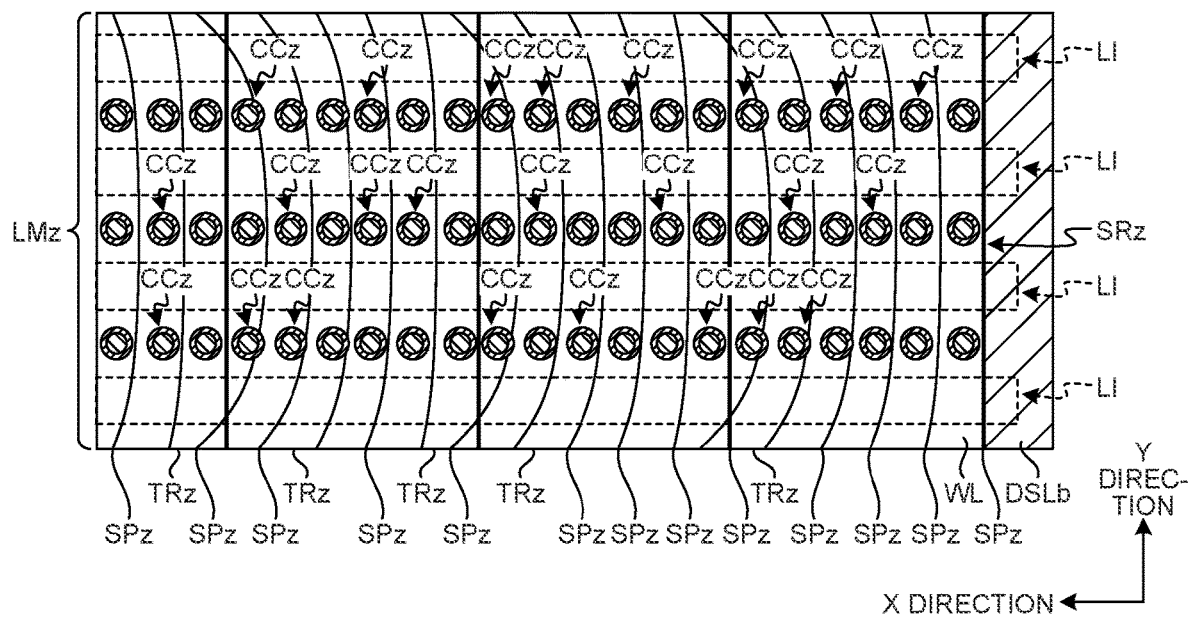
FIGS. 25A and 25B are cross-sectional views sequentially illustrating a part of the procedure of a method of manufacturing a semiconductor memory device according to a comparative example.
Figure 25B:
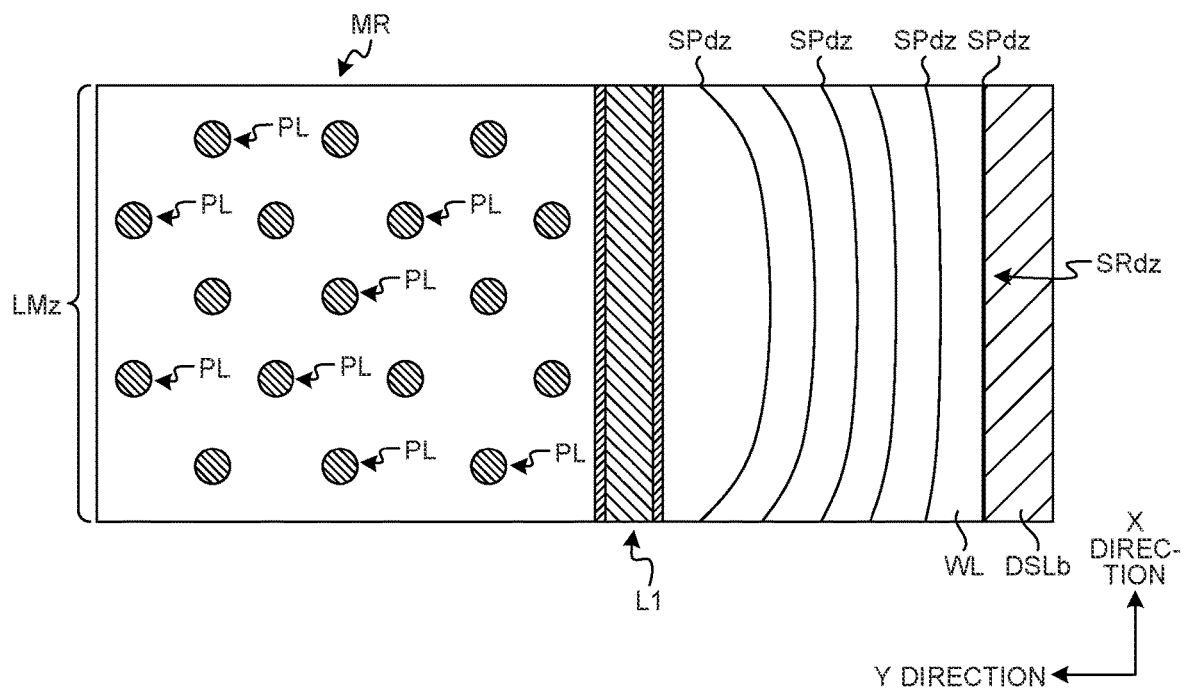

Such an arcuate shape is transferred to a plurality of word lines as well, and the step surfaces of these word lines also transform to an arcuate shape in which the central part protrudes toward a direction in which the step portion becomes higher. FIGS. 25A and 25B illustrate a configuration example of a semiconductor memory device of a comparative example having a step portion formed as described above.

FIGS. 25A and 25B are XY cross-sectional views illustrating an example of configuration of step portions SRz and SRdz included in the semiconductor memory device according to the comparative example.

As illustrated in FIG. 25A, the step portion SRz of the comparative example has a plurality of step surfaces SPz transforming from a substantially linearly extending shape to a shape in which a central region protrudes toward a direction in which the step portion SRz becomes higher. Such transformation of the plurality of step surfaces SPz is repeated multiple times from the lower layer side to the upper layer side of the step portion SRz.

Here, the transformation of the plurality of step surfaces SPz from the substantially linearly extending shape to the shape in which the central region protrudes is reset only at a timing when the subsequent resist layer is newly formed after one resist layer having undergone multiple times of slimming.

For this reason, in the step portion SRz in the vicinity of both end portions in the Y direction of the stacked body LMz, the arcuate shape of the step surface SPz becomes considerable, and some contacts CCz are disposed at positions out of the terrace surface TRz of the word line WL to be connected. As a result, a connection failure between the contact CCz and the word line WL or a short circuit between the upper and lower word lines WL is liable to occur.

As illustrated in FIG. 25B, the semiconductor memory device of the comparative example also includes a dummy step portion SRdz to which the contact CCz is not connected. The step portion SRdz of the comparative example also includes a plurality of step surfaces SPdz transforming from a substantially linearly extending shape to a shape in which the central region protrudes toward a direction in which the step portion SRdz becomes higher.

Here, at the time when the subsequent resist layer is newly formed after one resist layer having undergone multiple times of slimming, in the dummy step portion SRdz, the side surface of the next resist layer facing toward the step portion SRdz is disposed at a position substantially equal to the position where the side surface of the previous resist layer before slimming is disposed. As a result, at every time a new resist layer is formed, staircases repeatedly formed by slimming of these resist layers are formed so as to overlap one another.

For this reason, in the step portion SRdz of the comparative example, the step surface SPdz extending substantially linearly in a direction along the X direction is disposed in the vicinity of the lowermost stair of the step portion SRdz. In contrast, unlike the step portion SRd of the above-described embodiment, in the step portion SRdz of the comparative example, the step surface SPdz extending substantially linearly in a direction along the X direction is not disposed at a position between the lowermost stair and the uppermost stair of the step portion SRd.

According to the method of manufacturing the semiconductor memory device 1 of the embodiment, the resist layer 60 having the side 60y is formed above the stacked body LMs, the stopper layer STPa covering the side 60y is formed, the resist layer 70 covering the resist layer 60 including the side 60y is formed, and a process of etching away the pair of insulating layers NL and OL of the stacked body LMs exposed from the resist layers 60 and 70 with retracting the resist layers 60 and 70 in the X direction by slimming is repeated multiple times.

As a result, the step portion SR can be formed while appropriately resetting the shapes of the plurality of step surfaces SP that transforms from the substantially linearly extending shape to the shape in which the central region protrudes toward a direction in which the step portion SR becomes higher. Therefore, it is possible to suppress the coming out of the contact CC from the terrace surface TR of the word line WL to be connected so that the plurality of word lines WL and the plurality of contacts CC can be more reliably connected.

According to the method of manufacturing the semiconductor memory device 1 of the embodiment, at the time of forming the resist layer 90, the resist layer 90 is formed so as to cover the step portion SRd, and the process of etching away the pair of insulating layers NL and OL of the stacked body LMs exposed from the resist layer 90 with retracting the resist layer 90 also in the Y direction by slimming is repeated multiple times.

As a result, a plurality of pairs of the insulating layers NL and OL is processed in a staircase shape to overlap the already formed step portion SRd. Therefore, the staircase length of the step portion SRd can be made shorter than that of the step portion SR, for example. As described above, unlike the step portion SR having a function of leading out the word line WL, the dummy step portion SRd is an invalid region in the semiconductor memory device 1. By shortening the staircase length of such step portion SRd, the semiconductor memory device 1 can be downsized or the memory region MR can be enlarged so that a higher performance semiconductor memory device 1 can be achieved.

Unlike the step portion SRdz of the comparative example, the step portion SRd formed as described above includes: a substantially linearly extending step surface SPd arranged in the vicinity of the lowermost stair of the step portion SRd; and a substantially linearly extending step surface SPd arranged between the lowermost stair and the uppermost stair of the step portion SRd. Therefore, the fact that step portion SRd has such shape can be an evidence that the semiconductor memory device 1 is manufactured by the above-described manufacturing method in which the stopper layers STPAa to STPc are used.

According to the method of manufacturing the semiconductor memory device 1 of the embodiment, the stopper layers STPa to STPc each are, for example, a semiconductor layer such as an amorphous silicon layer or a polysilicon layer; or a metal layer such as an aluminum layer, a tungsten layer, or a platinum layer. As a result, the stopper layers STPa to STPc can be left without being removed by oxygen plasma or the like, and the arcuate shapes of the side surfaces of the resist layers 70, 90, and 110 can be reset.

First Modification

Next, a semiconductor memory device according to a first modification of the embodiment will be described with reference to FIGS. 26A to 29B. The semiconductor memory device according to the first modification is different from the semiconductor memory device according to the above-described embodiment in that the positions of the side surfaces of the resist layers 70a, 90a, and 110a are shifted at every time when the resist layers 70a, 90a, and 110a each are newly formed when forming a dummy step portion SRda.

FIGS. 26A to 28B are cross-sectional views sequentially illustrating a part of the procedure of the method of forming the step portion SRda included in the semiconductor memory device according to the first modification of the embodiment.

Also at the time of forming the dummy step portion SRda of the semiconductor memory device of the first modification, the same processes as those in FIGS. 12A to 13A of the above-described embodiment are performed.

Figure 26A:
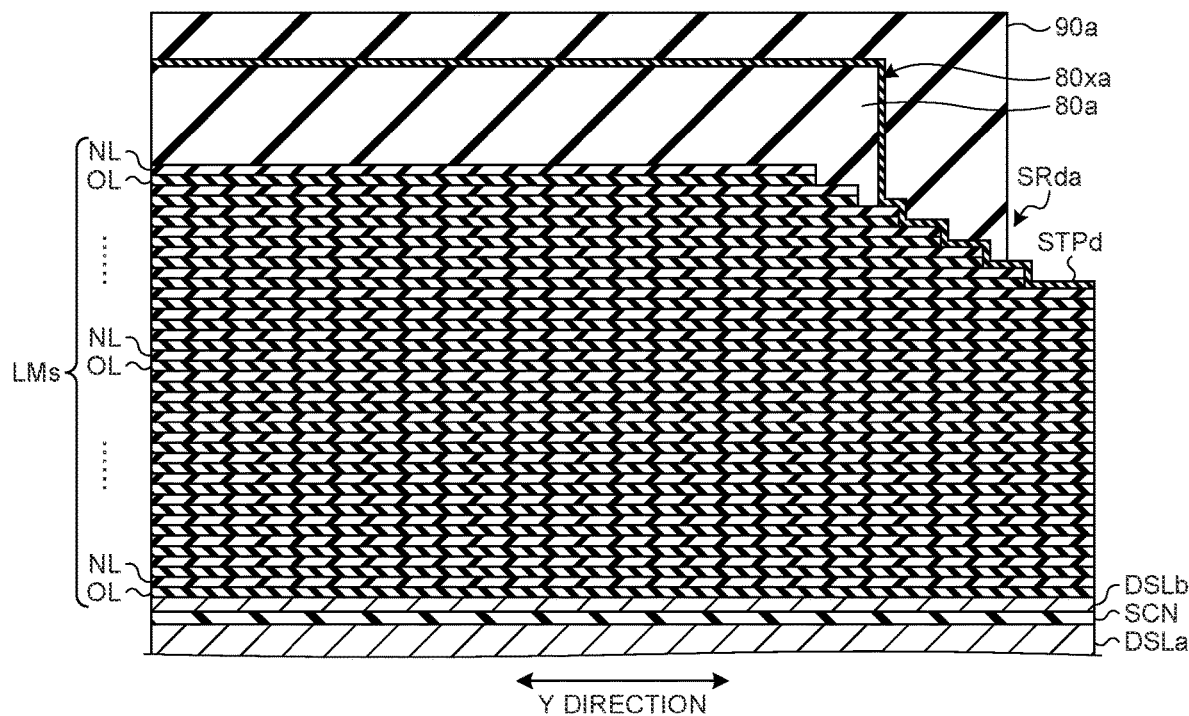
FIGS. 26A and 26B are cross-sectional views sequentially illustrating a part of the procedure of a method of forming a step portion included in a semiconductor memory device according to a first modification of the embodiment.

As illustrated in FIG. 26A, a resist layer 80a, a stopper layer STPd, and a resist layer 90a are newly formed in this order on the upper surface of the stacked body LMs after subjected to the process in FIG. 13A. That is, the process illustrated in FIG. 26A is a process corresponding to that in FIG. 13B of the above-described embodiment.

The resist layer 80a as a third resist layer has a side 80xa as a fourth side extending in the X direction. Here, at the time of forming the resist layer 80a, on the side of the dummy step portion SRda, the positioning of the resist layer 80a is conducted without precise alignment. For this reason, there may be a case in which the side 80xa of the resist layer 80a is disposed at a position out of the position where the above-described side 60x of the resist layer 60 is disposed.

In the example of FIG. 26A, the side 80xa of the resist layer 80a is disposed at a position slightly shifted toward the inside of the stacked body LMs from the position where the above-described side 60x of the resist layer 60 is disposed.

The stopper layer STPd as a second stopper layer is formed so as to cover the side surface of the resist layer 80a including the side 80xa and to cover the staircase of the stacked body LMs exposed from the resist layer 80a. The stopper layer STPd is also a semiconductor layer such as an amorphous silicon layer or a polysilicon layer, or a metal layer such as an aluminum layer, a tungsten layer, or a platinum layer, and is formed by sputter deposition, low-temperature CVD at 90° C. or lower, or the like.

The resist layer 90a as a fourth mask layer is formed so as to cover the side surface of the resist layer 80a including the side 80xa with interposing the stopper layer STPd. In the example of FIG. 26A, the resist layer 90a is also disposed at a position slightly shifted toward the inside of the stacked body LMs from the position where the above-described side surface of the resist layer 70 extending in the X direction before slimming is disposed.

Figure 26B:
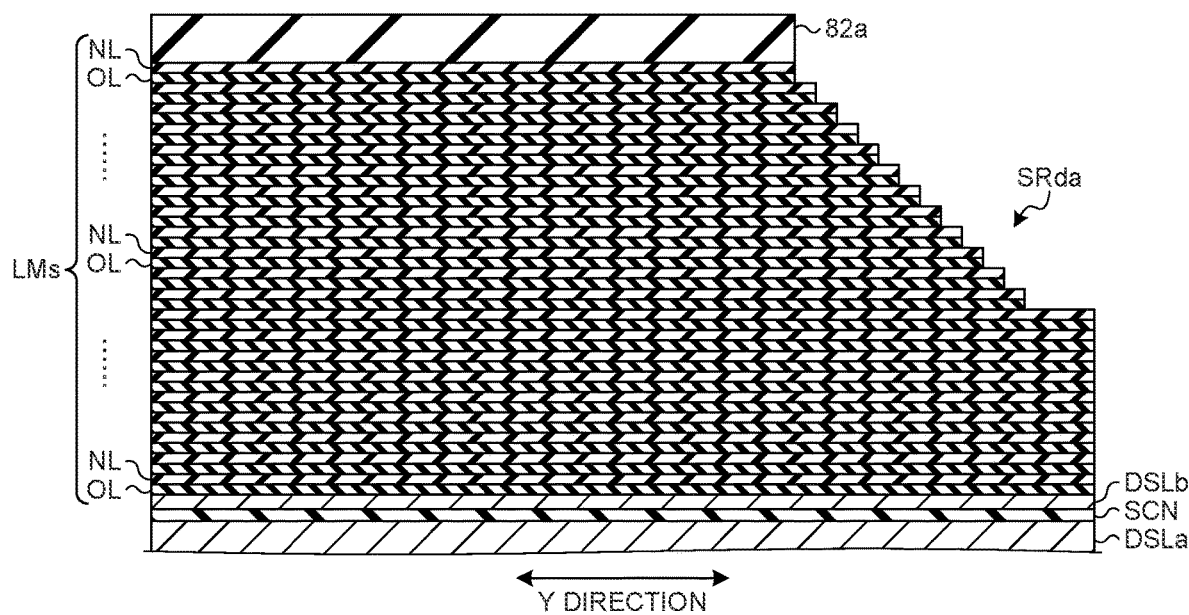

As illustrated in FIG. 26B, multiple pairs of insulating layers NL and OL are etched away with sequentially slimming the resist layers 90a and 80a the positions of whose side surfaces being slightly shifted toward the inside of the stacked body LMs, and a staircase is newly formed to overlap the already formed staircase. As a result, the step portion SRda has a terrace surface narrower than that of the step portion SRd of the above-described embodiment.

Thereafter, the resist layer 82a formed by slimming of the resist layer 80a is removed by ashing with use of oxygen plasma or the like, for example.

Figure 27A:
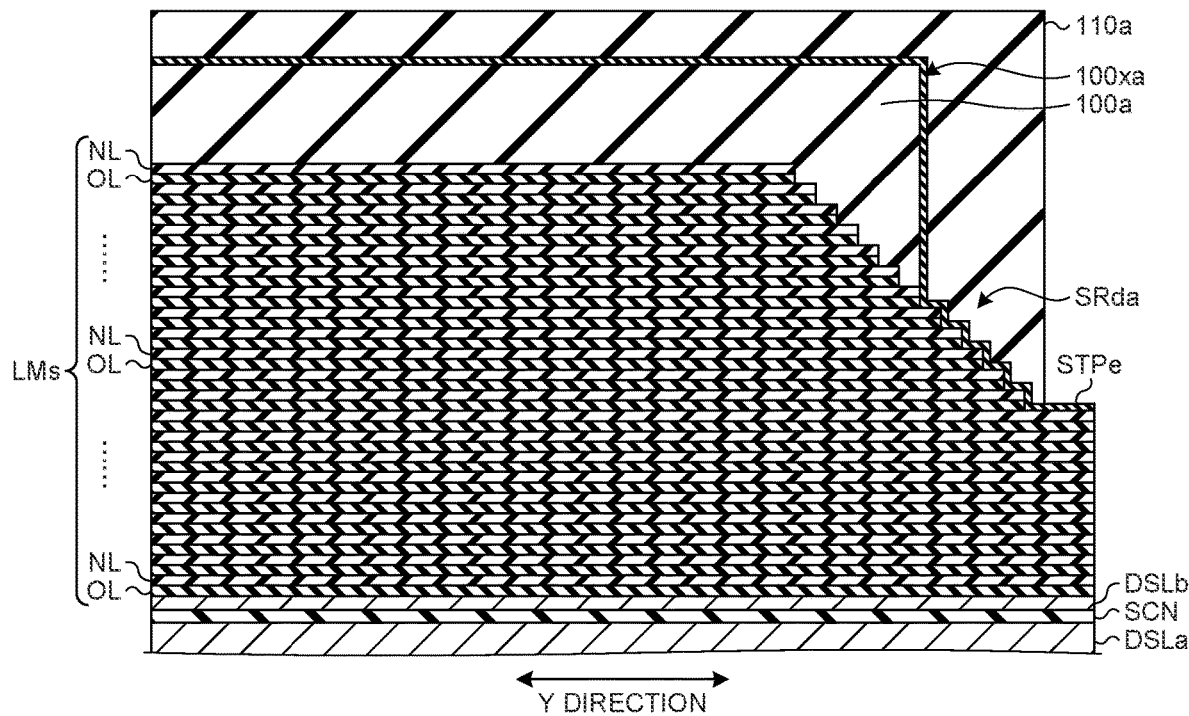
FIGS. 27A and 27B are cross-sectional views sequentially illustrating a part of the procedure of a method of forming a step portion included in a semiconductor memory device according to the first modification of the embodiment.

As illustrated in FIG. 27A, a resist layer 100a, a stopper layer STPe, and a resist layer 110a are newly formed in this order. That is, the process illustrated in FIG. 27A is a process corresponding to that in FIG. 16B of the above-described embodiment.

The resist layer 100a has a side 100xa extending in the X direction. Here, at the time of forming the resist layer 100a, on the side of the dummy step portion SRda, the positioning of the resist layer 100a is conducted without precise alignment. For this reason, there may be a case where the side 100xa of the resist layer 100a is disposed at a position out of any of the positions where the above-described sides 60x of the resist layer 60 and 80xa of the resist layer 80a described above are disposed.

In the example of FIG. 27A, the side 100xa of the resist layer 100a is disposed at a position slightly shifted from the position where the above-described side 60x of the resist layer 60 is disposed toward the outside of the stacked body LMs.

The stopper layer STPe is formed so as to cover the side surface of the resist layer 100a including the side 100xa and to cover the staircase of the stacked body LMs exposed from the resist layer 100a. The stopper layer STPde is also a semiconductor layer such as an amorphous silicon layer or a polysilicon layer, or a metal layer such as an aluminum layer, a tungsten layer, or a platinum layer, and is formed by sputter deposition, low-temperature CVD at 90° C. or lower, or the like.

The resist layer 110a is formed so as to cover the side surface of the resist layer 100a including the side 100xa with interposing the stopper layer STPe. In the example of FIG. 27A, the resist layer 110a is also disposed at a position slightly shifted toward the outside of the stacked body LMs from the position where the above-described side surface of the resist layer 70 extending in the X direction before slimming is disposed.

Figure 27B:
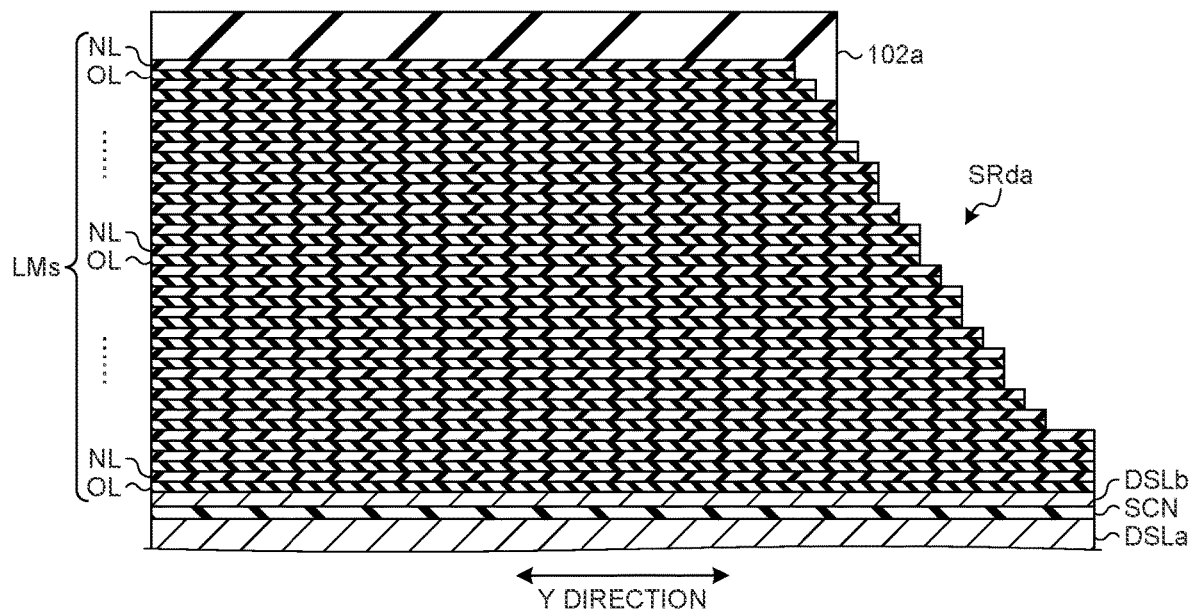

As illustrated in FIG. 27B, multiple pairs of insulating layers NL and OL are etched away with sequentially slimming the resist layers 110a and 100a the positions of whose side surfaces being slightly shifted to the outside of the stacked body LMs, and a staircase is newly formed so as to overlap the already formed staircase.

As a result, the step portion SRda has a shape in which a staircase including one pair of insulating layers NL and OL and a staircase including two pairs of insulating layers NL and OL are alternately repeated.

Thereafter, the resist layer 102a formed by multiple times of slimming of the resist layer 100a is removed by ashing with use of oxygen plasma or the like, for example.

Figure 28A:
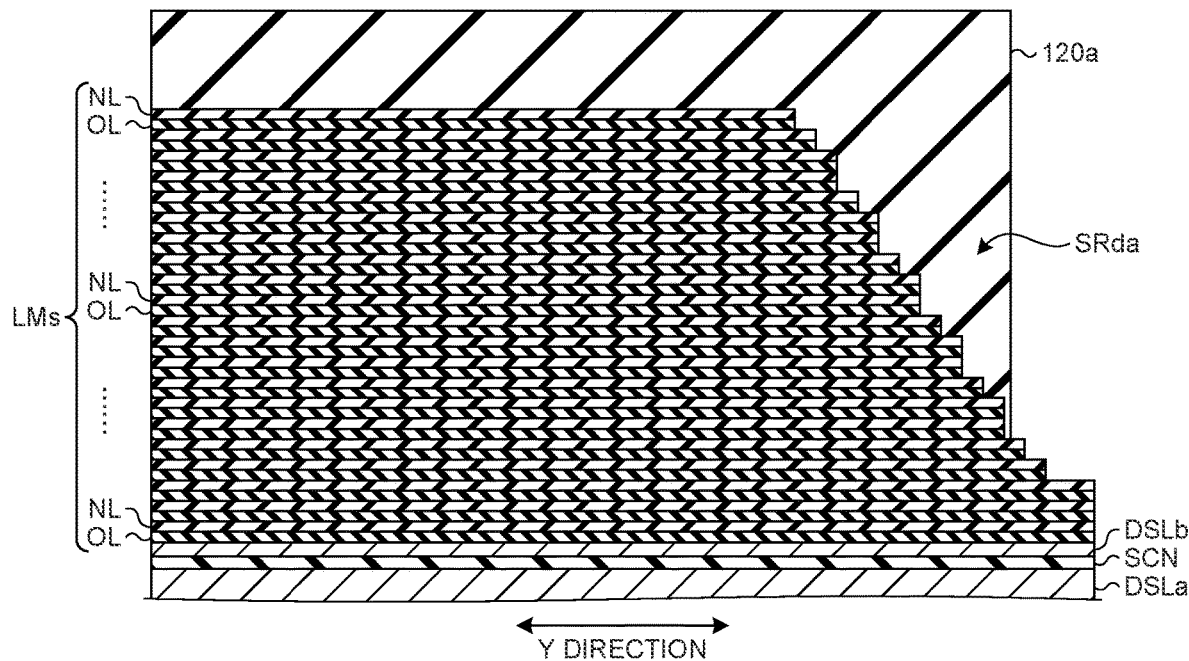
FIGS. 28A and 28B are cross-sectional views sequentially illustrating a part of the procedure of the method of forming the step portion included in a semiconductor memory device according to the first modification of the embodiment.

As illustrated in FIG. 28A, a resist layer 120a is newly formed. That is, the process illustrated in FIG. 28A is a process corresponding to that in FIG. 18A of the above-described embodiment.

The resist layer 120a has a side surface extending in the X direction. Here, also at the time of forming the resist layer 120a, on the side of the dummy step portion SRda, the positioning of the resist layer 120a is conducted without precise alignment. For this reason, there may be a case where the side surface of the resist layer 120a is disposed at a position out of any of the position where the above-described sides 60x, 80xa, and 100xa of the resist layers 60, 80a, and 100a, respectively, described above are disposed.

In the example of FIG. 28A, the side surface of the resist layer 120a is disposed at a position, between the placement position of the side 60x of the resist layer 60 and the placement position of the side 80xa of the resist layer 80a, that is slightly shifted from the position where the above-described side 60x of the resist layer 60 is disposed toward the inside of the stacked body LMs.

Figure 28B:
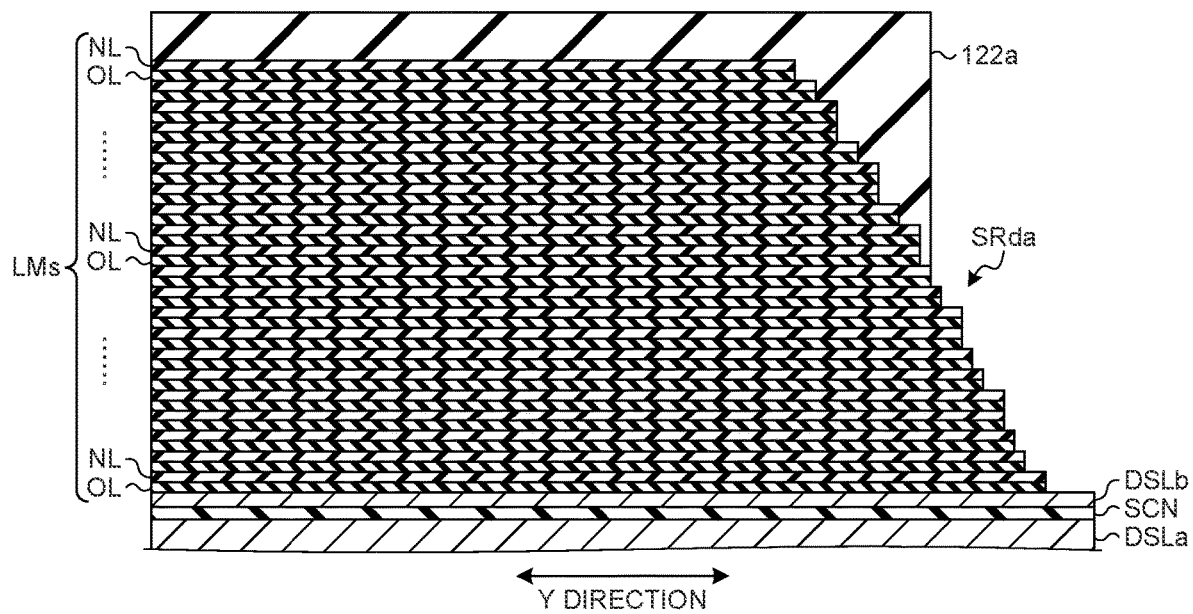

As illustrated in FIG. 28B, multiple pairs of insulating layers NL and OL are etched away with sequentially slimming the resist layer 120a the positions of whose side surfaces being slightly shifted toward the inside of the stacked body LMs, and a staircase is newly formed so as to overlap the already formed staircase.

As a result, the process of etching away the insulating layers NL and OL is performed until the insulating layers NL and OL of the lowermost layer of the stacked body LMs, and the entire step portion SRda is formed in the stacked body LMs.

Thereafter, the resist layer 122a formed by multiple times of slimming of the resist layer 120a is removed by ashing with use of oxygen plasma or the like, for example.

Figure 29A:
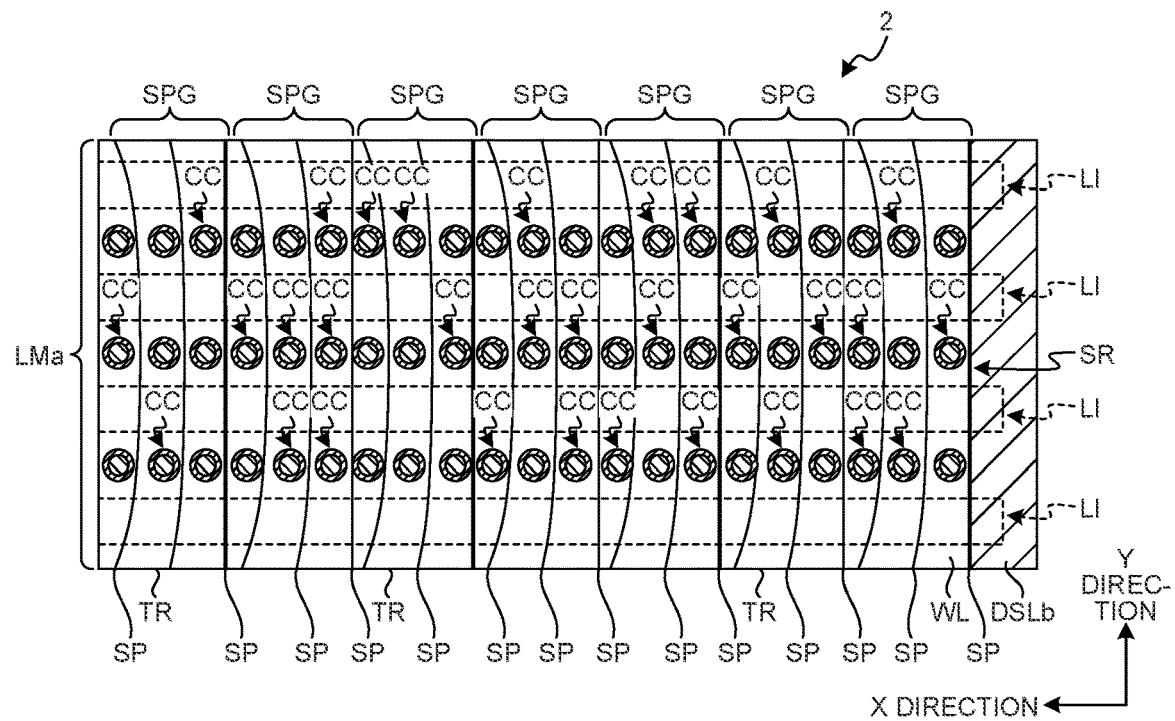
FIGS. 29A and 29B are top views illustrating an example of a configuration of a step portion included in a semiconductor memory device according to the first modification of the embodiment.
Figure 29B:
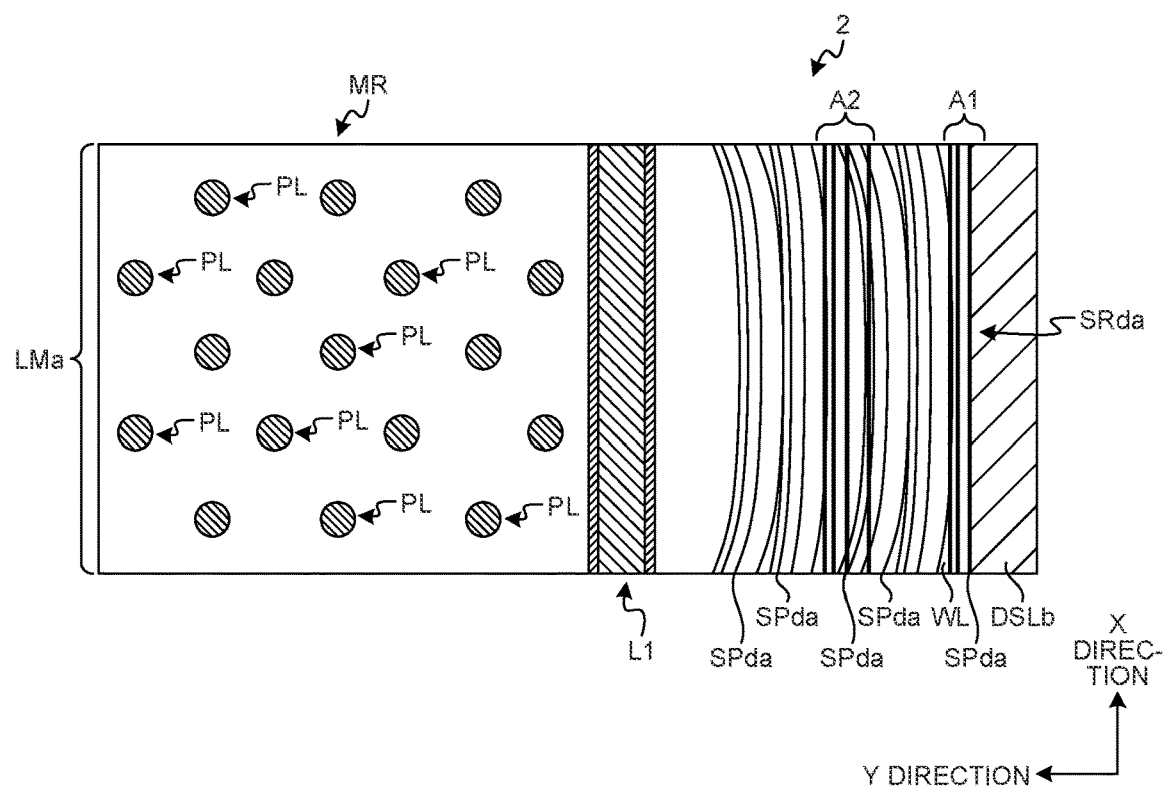

FIGS. 29A and 29B illustrate the step portion SRda formed as described above and in a state where the plurality of word lines WL and the plurality of insulating layers OL are stacked by a subsequent replacement process.

FIGS. 29A and 29B are top views illustrating an example of configurations of step portions SR and SRda included in a semiconductor memory device 2 according to the first modification of the embodiment. FIG. 29A is a top view including the step portion SR of the semiconductor memory device 2. FIG. 29B is a top view including the step portion SRda of the semiconductor memory device 2.

As illustrated in FIGS. 29A and 29B, the semiconductor memory device 2 includes a stacked body LMa in a state where the plurality of word lines WL and the plurality of insulating layers OL are stacked by the replacement process in the manufacturing process including the above-described processes of FIGS. 26A to 28B. In the stacked body LMa, there are formed: a step portion SR having a function of leading out the word line WL; and the above-described dummy step portion SRda.

As illustrated in FIG. 29A, the step portion SR of the semiconductor memory device 2 also has a configuration similar to that of the step portion SR illustrated in FIG. 3A of the above-described embodiment. That is, a step surface group SPG including the plurality of step surfaces SP each of which transforms from a substantially linearly extending shape to a shape in which the central region protrudes is repeatedly arranged from the lower layer side to the upper layer side of the step portion SR.

As illustrated in FIG. 29B, the step surface SPda of the step portion SRda also includes: a step surface SPda as fourth and fifth step surfaces extending substantially linearly in a direction along the X direction; and a step surface SPda as a third step surface having an arcuate shape in which the central region in the X direction protrudes.

The step surfaces SPda each having an arcuate shape are arranged in a distributed manner over the entire step portion SRda extending in the Y direction. The step surface SPda extending substantially linearly in a direction along the X direction includes: a step surface SPda as a fourth step surface displaced in a region A1 illustrated in the vicinity of the lowermost stair of the step portion SRda; and a step surface SPda as a fifth step surface a plurality of which is disposed in each region A2 illustrated between the lowermost stair and the uppermost stair of the step portion SRda.

As described above, at each time when the resist layers 70, 90a, 110a, and 120a each are newly formed, a staircase where the plurality of step surfaces SPda transforms from a substantially linearly extending shape to a shape in which the central region protrudes is formed so as to overlap one another with being slightly shifted back and forth, whereby the step portion SRda including the step surfaces SPda having the shape illustrated in FIG. 29B is formed.

That is, among the plurality of step surfaces SPda extending substantially linearly in a direction along the X direction, some step surfaces SPda disposed in the region A1 illustrated in the vicinity of the lowermost stair of the step portion SRda each are a step surface SPda formed by transferring the side surfaces of the newly formed resist layers 70, 90a, 110a, and 120a before slimming.

Among the plurality of step surfaces SPda extending substantially linearly in a direction along the X direction, some step surfaces SPda disposed in the region A2 illustrated between the lowermost stair and the uppermost stair of the step portion SRda each are a step surface SPda formed by transferring the side surfaces of the resist layers 60, 80a, and 100a after removal of the stopper layers STPa, STPd, and STPe.

As described above, even in a case where the resist layers 70, 90a, 110a, and 120a are formed in a state of being shifted from each other, unlike the step portion SRz of the above-described comparative example, the step portion SRda has several step surfaces SPda that extend substantially linearly and are arranged between the lowermost stair and the uppermost stair of the step portion SRda.

According to the method of manufacturing the semiconductor memory device 2 of the first modification, an effect similar to that of the method of manufacturing the semiconductor memory device 1 of the above-described embodiment is achieved.

Second Modification

Next, a semiconductor memory device according to a second modification of the embodiment will be described with reference to FIGS. 30A and 30B. The semiconductor memory device of the second modification is different from that in the above-described embodiment in that an unnecessary portion is removed in advance when forming a stopper layer.

Figure 30A:
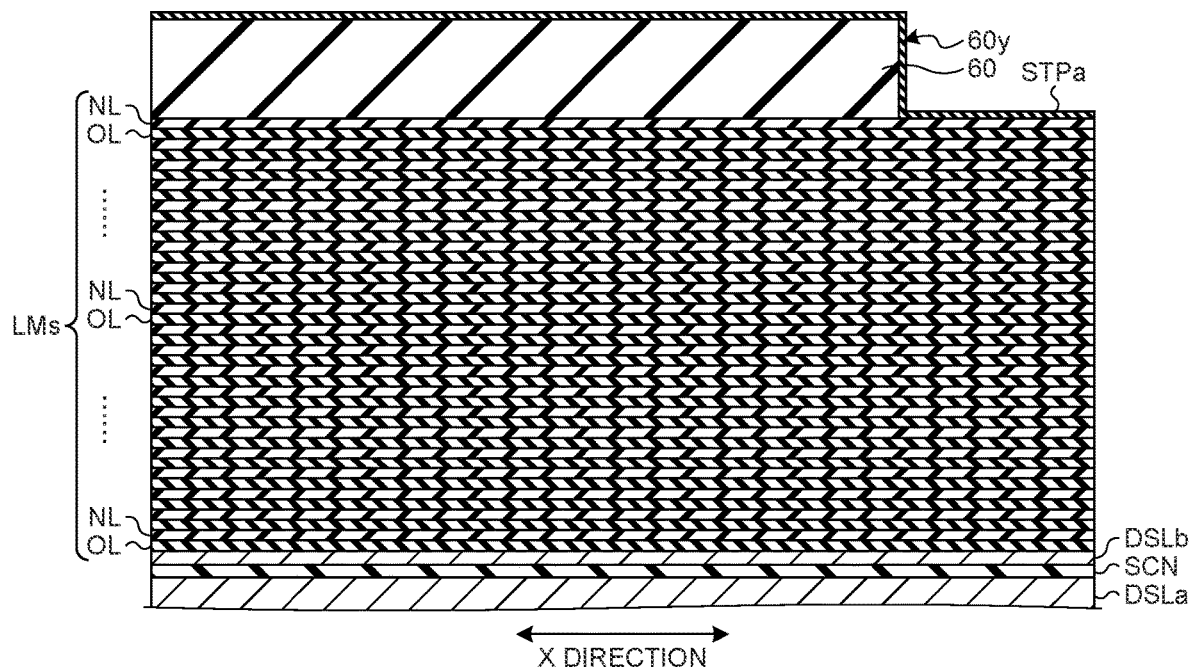
FIGS. 30A and 30B are cross-sectional views illustrating a part of the procedure of the method of forming the step portion included in the semiconductor memory device according to a second modification of the embodiment.
Figure 30B:
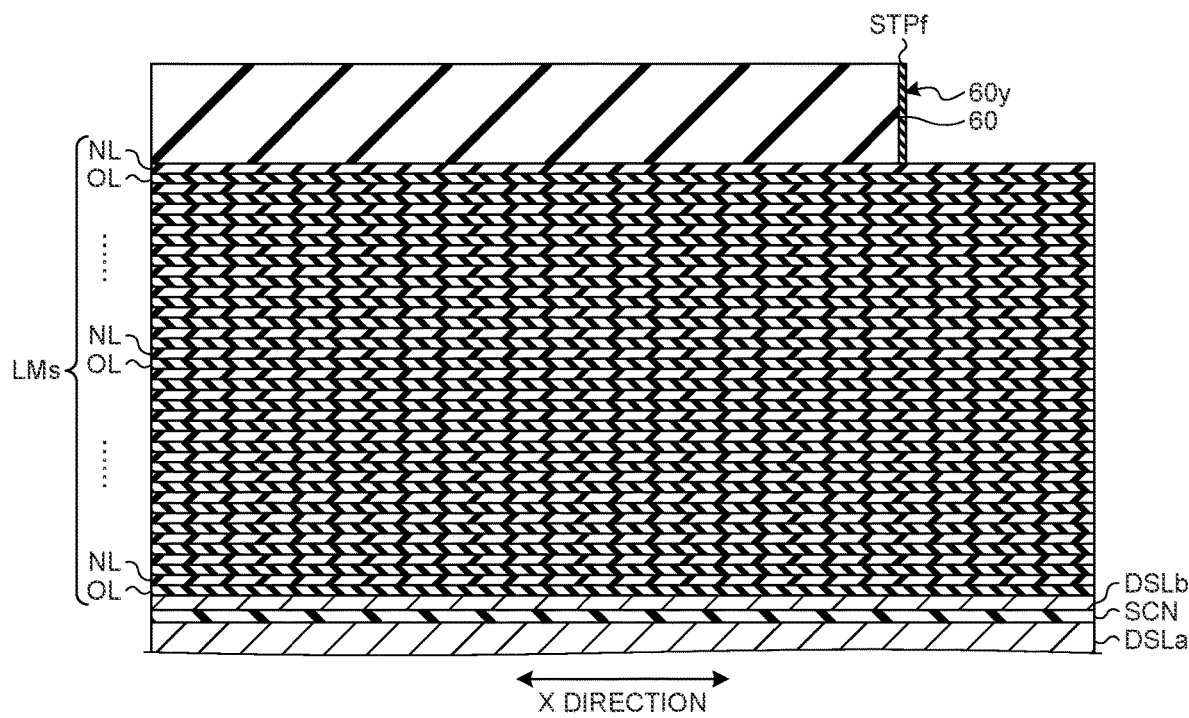

FIGS. 30A and 30B are cross-sectional views illustrating a part of the procedure of the method of forming the step portion included in the semiconductor memory device according to the second modification of the embodiment. The processes illustrated in FIGS. 30A and 30B are processes corresponding to the processes of forming the resist layer 60 and the stopper layer STPa of the above-described embodiment.

As illustrated in FIG. 30A, similarly to the above-described embodiment, a rectangular resist layer 60 that covers the upper surface of a part of the stacked body LMs is formed. Similarly to the above-described embodiment, the resist layer 60 includes: a side surface extending in the Y direction, as the side 60y illustrated in FIG. 30A; and a side surface (not illustrated) extending in the X direction.

Similarly to the above-described embodiment, there is formed a stopper layer STPa that covers: the upper surface, the side surface extending in the Y direction, and the side surface (not illustrated) extending in the X direction of the resist layer 60; and the upper surface of the stacked body LMs exposed from the resist layer 60.

As illustrated in FIG. 30B, the upper surface of the stopper layer STPa is etched back to remove the stopper layer STPa from the upper surface of the resist layer 60 and from the upper surface of the stacked body LMs exposed from the resist layer 60. As a result, a stopper layer STPf that covers the side surface of the resist layer 60 extending in the X direction and in the Y direction is formed.

Thereafter, similarly to the above-described embodiment, a resist layer 70 covering the resist layer 60 with interposing the stopper layer STPf is formed, and these resist layers 60 and 70 are used to form a step portion.

Note that the above-described process of removing an unnecessary portion of the stopper layer STPa can also be applied to the stopper layers STPb and STPc of the above-described embodiment, and also to the stopper layer STPe of the above-described first modification, and the like.

According to the method of manufacturing a semiconductor memory device in the second modification, at the time of forming the stopper layer STPf, the stopper layer STPa is removed from the upper surface of the resist layer 60 and from the upper surface of the stacked body. As a result, unnecessary portions of the stopper layer STPa can be removed all at once. Note that, the removing of the unnecessary portion in advance enables to omit the process of removing the stopper layer STPf at every time when the slimming of the resist layer 70 is repeated.

Therefore, the number of processes can be reduced, and the step portion can be formed in a simpler process.

Furthermore, according to the method of manufacturing a semiconductor memory device in the second modification, an effect similar to that of the method of manufacturing the semiconductor memory device 1 of the above-described embodiment is achieved.

Other Modifications

Note that, in the above-described embodiment and the first and second modifications, when forming the step portions SR and SRd, the formation of the resist layer with interposing the stopper layers STPa to STPc is repeated four times. However, the number of times of formation of the resist layer may be appropriately changed depending on the number of layers of the stacked body LM and the like. The formation of the resist layer may be repeated less than four times, or five times or more, alternatively the entire step portion may be formed by only one time formation of the resist layer.

In the above-described embodiment and the first and second modifications, the stopper layer STP allowed to be interposed in each resist layer is only one layer. However, the number of stopper layers STP allowed to be interposed in the resist layer is freely chosen, and a plurality of stopper layers may be interposed in the resist layer. As an example, FIG. 31 illustrates a state in which two stopper layers STPa and STPg are interposed.

Figure 31:
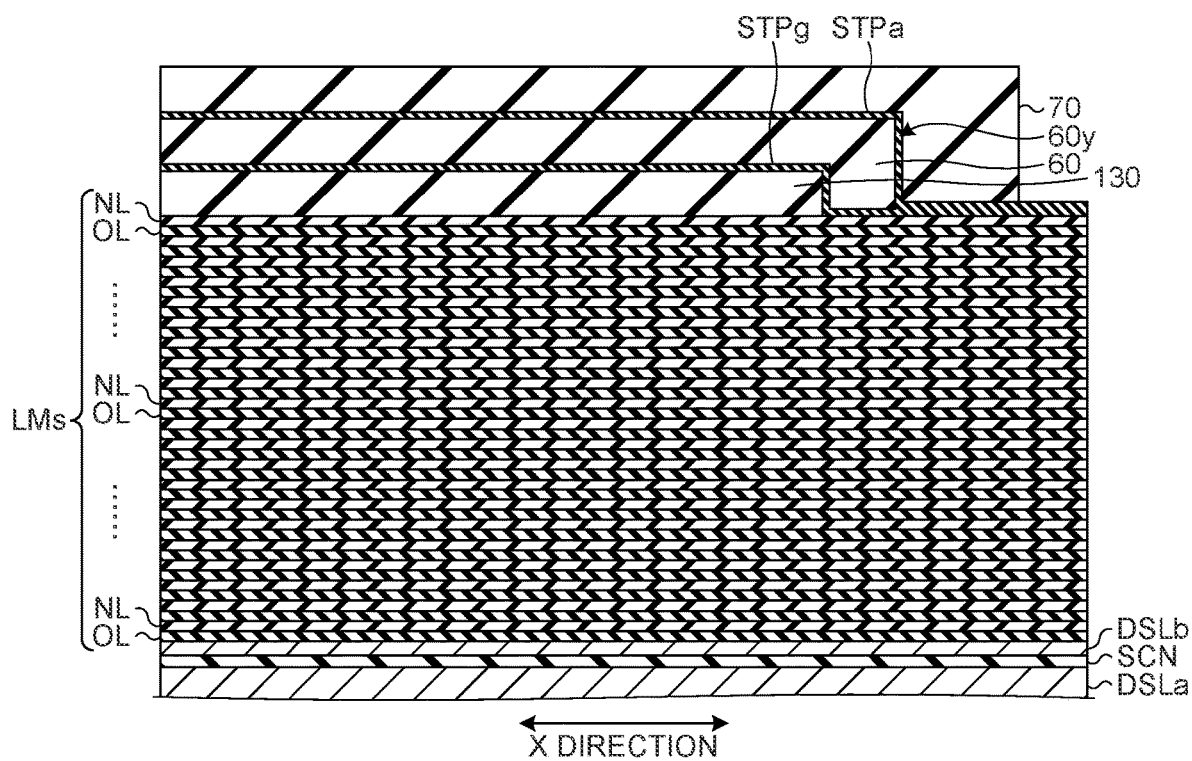
FIG. 31 is a cross-sectional view illustrating a situation in which two stopper layers are formed in a method of manufacturing a semiconductor memory device according to another modification of the embodiment.

FIG. 31 is a cross-sectional view illustrating a state in which two stopper layers STPa and STPg are formed in a method of manufacturing a semiconductor memory device according to another modification of the embodiment. As illustrated in FIG. 31, in the manufacturing method of another modification, for example, a resist layer 130 further covered with the stopper layer STPg is formed in the resist layer 60 of the above-described embodiment.

More specifically, a resist layer 130 is formed on a part of the upper surface of the stacked body LMs, the stopper layer STPg that covers the resist layer 130 and covers the upper surface of the stacked body LMs exposed from the resist layer 130 is formed, and the resist layer 60 covering the resist layer 130 with interposing the stopper layer STPg is formed. The subsequent procedures are similar to those of the above-described embodiment.

In this manner, a plurality of stopper layers STP is formed by one time resist formation, thereby enabling to more frequently reset the arcuate shape of the step surface of the step portion.

Note that, also in the above-stated case, the above-described method of the second modification can also be applied. That is, at each time when the stopper layers STPg and STPa each are formed, unnecessary portions of the stopper layers STPg and STPa may be removed in advance from the resist layers 130 and 60 and from the upper surfaces of the stacked body LMs.

In the above-described embodiment and the first and second modifications, the step portions SR, SRd, and SRda each are disposed at the ends of the stacked body LM in the X direction and the Y direction. However, the step portions SR, SRd, and SRda in which the plurality of word lines WL and the like is processed in a staircase shape may be disposed, for example, in the central part of the stacked body LM. In this case, for example, the central part of the stacked body LM can be processed into a mortar shape, whereby the step portion SR arranged on one side or both sides extending in the Y direction can have a function of leading out. In this case, dummy step portions SRd and SRda are formed on both sides extending in the X direction.

In the above-described embodiment and the first and second modifications, the side surface of the channel layer CN of the pillar PL is connected to the source line SL. However, the bottom surface or the like of the channel layer CN may be connected to the source line SL. In this case, the memory layer ME on the bottom surface of the channel layer CN may be removed.

In the above-described embodiment and the first and second modifications, each insulating layer NL and each insulating layer OL are alternately stacked one on another to form the stacked body LMs. However, the stacked body LMs may be separately formed by a plurality of tiers, and in this case, the pillar PL and the step portions SR, SRd, and SRda may be formed step-by-step at each time when each tier of the stacked body LMs is formed. This enables to further increase the number of stacked layers of word lines WL.

In the above-described embodiment and the first and second modifications, the semiconductor memory device includes a peripheral circuit that contributes to the operation of the memory cell MC. The peripheral circuit can be disposed above, below of a stacked body, or at the same level as that of the stacked body.

For example, in a case where a part of the surface of a semiconductor substrate is a source line SL, the peripheral circuit can be disposed on the semiconductor substrate outside the stacked body LM. In this case, the stacked body and the peripheral circuit are disposed at an identical level. Alternatively, a peripheral circuit is formed on a semiconductor substrate, and is covered with an interlayer insulating layer or the like, and a source line SL and a stacked body LM are formed on the interlayer insulating layer, whereby the peripheral circuit can be disposed below the stacked body LM.

Alternatively, a source line SL and a stacked body LM are formed on a support substrate, and a semiconductor substrate provided with a peripheral circuit is bonded above the stacked body LM, whereby the peripheral circuit can be disposed above the stacked body LM.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor memory device, comprising
    forming a stacked body in which each of a plurality of first insulating layers and each of a plurality of second insulating layers are alternately stacked one on another;
    forming a first mask layer above the stacked body, the first mask layer having a first side;
    forming a first stopper layer, the first stopper layer covering at least the first side;
    forming a second mask layer, the second mask layer covering the first mask layer having the first side;
    repeating multiple times of a process of etching away one pair of first and second insulating layers of the stacked body exposed from the second mask layer, among the plurality of first and second insulating layers, with retracting the second mask layer in a first direction toward the first side by slimming;
    removing the second mask layer undergone multiple times of the slimming, and removing the first stopper layer exposed on the first side; and
    repeating multiple times of a process of etching away one pair of first and second insulating layers of the stacked body exposed from the first mask layer, among the plurality of first and second insulating layers, with retracting the first mask layer in the first direction by slimming.

2. The method of manufacturing a semiconductor memory device according to claim 1, wherein
    when forming the first stopper layer,
    forming the first stopper layer, the first stopper layer covering the first side and an upper surface of the first mask layer and covering an upper surface of the stacked body exposed from the first mask layer; and
    when repeating slimming of the second mask layer and etching of the one pair of first and second insulating layers,
    repeating etching away the one pair of first and second insulating layers with removing the first stopper layer from the upper surface of the stacked body newly exposed by slimming of the second mask layer.

3. The method of manufacturing a semiconductor memory device according to claim 2, wherein
    when removing the first stopper layer exposed on the first side,
    removing the first stopper layer also from the upper surface of the first mask layer.

4. The method of manufacturing a semiconductor memory device according to claim 1, wherein
    when forming the first stopper layer,
    forming the first stopper layer, the first stopper layer covering the first side and an upper surface of the first mask layer and covering an upper surface of the stacked body exposed from the first mask layer; and
    removing the first stopper layer from the upper surface of the first mask layer and from the upper surface of the stacked body.

5. The method of manufacturing a semiconductor memory device according to claim 1, wherein
    when repeating slimming of the second mask layer and etching of the one pair of first and second insulating layers,
    forming a first step portion in the stacked body, the first and second insulating layers being processed in a staircase shape and a height of the first step portion varying toward the first direction, and
    the first step portion includes a plurality of first step surfaces, the first step surface being an end surface of each one pair of first and second insulating layers etched away, and the first step surface transforming from a substantially linearly extending shape to a shape in which a central region protrudes, toward a direction in which the first step portion becomes higher.

6. The method of manufacturing a semiconductor memory device according to claim 5, wherein
    when repeating slimming of the first mask layer and etching of the one pair of first and second insulating layers,
    successively forming the first step portion in the stacked body, and
    the plurality of first step surfaces is successively formed in the first step portion transforming from a substantially linearly extending shape to a shape in which a central region protrudes, toward the direction in which the first step portion becomes higher.

7. The method of manufacturing a semiconductor memory device according to claim 5, comprising
    removing the first mask layer, after repeating slimming of the first mask layer and etching of the one pair of first and second insulating layers;
    forming a third mask layer above the stacked body, the third mask layer facing in the first direction and having a second side at an end of uppermost layer of the first step portion;
    forming a second stopper layer covering at least the second side;
    forming a fourth mask layer covering the third mask layer having the second side;
    repeating multiple times of a process of etching away one pair of first and second insulating layers of the stacked body exposed from the fourth mask layer, among the plurality of first and second insulating layers, with retracting the fourth mask layer in the first direction by slimming;
    removing the fourth mask layer undergone multiple times of the slimming, and removing the second stopper layer exposed on the second side; and
    repeating multiple times of a process of etching away one pair of first and second insulating layers of the stacked body exposed from the third mask layer, among the plurality of first and second insulating layers, with retracting the third mask layer in the first direction by slimming.

8. The method of manufacturing a semiconductor memory device according to claim 7, wherein
    when forming the first stopper layer,
    forming the first stopper layer, the first stopper layer covering the first side and a third side of the first mask layer, the third side extending in a direction intersecting the first side;
    when repeating slimming of the second mask layer and etching of the one pair of first and second insulating layers,
    repeating multiple times of a process of etching away the one pair of first and second insulating layers of the stacked body exposed from the second mask layer with retracting the second mask layer in a second direction toward the third side by slimming;
    when removing the first stopper layer,
    removing also the first stopper layer exposed on the third side, and when repeating slimming of the first mask layer and etching of the one pair of first and second insulating layers, repeating multiple times of a process of etching away the one pair of first and second insulating layers of the stacked body exposed from the first mask layer with retracting the first mask layer also in the second direction by slimming.

9. The method of manufacturing a semiconductor memory device according to claim 8, wherein when repeating slimming of the second mask layer and etching of the one pair of first and second insulating layers, forming a second step portion in the stacked body, the first and second insulating layers being processed in a staircase shape and a height of the second step portion varying toward the second direction, and the second step portion includes a plurality of second step surface, the second step surface being an end surface of the one or more pairs of first and second insulating layers etched away, and the second step surface transforming from a substantially linearly extending shape to a shape in which a central region protrudes, toward a direction in which the second step portion becomes higher.

10. The method of manufacturing a semiconductor memory device according to claim 9, wherein when repeating slimming of the first mask layer and etching of the one pair of first and second insulating layers, successively forming the second step portion in the stacked body, and the plurality of second step surfaces is successively formed in the second step portion transforming from a substantially linearly extending shape to a shape in which a central region protrudes, toward the direction in which the second step portion becomes higher.

11. The method of manufacturing a semiconductor memory device according to claim 10, wherein when forming the second stopper layer, forming the second stopper layer, the second stopper layer covering the second side and a fourth side of the third mask layer, the fourth side extending in a direction intersecting the second side;

when forming the fourth mask layer, forming the fourth mask layer so as to cover the second step portion;

when repeating slimming of the fourth mask layer and etching of the one pair of first and second insulating layers, repeating multiple times of a process of etching away the one pair of first and second insulating layers of the stacked body exposed from the fourth mask layer with retracting the fourth mask layer also in the second direction by slimming;

when removing the second stopper layer, removing also the second stopper layer exposed on the fourth side; and when repeating slimming of the third mask layer and etching of the one pair of first and second insulating layers, repeating multiple times of a process of etching away the one pair of first and second insulating layers of the stacked body exposed from the third mask layer with retreating the third mask layer in the second direction by slimming.

12. The method of manufacturing a semiconductor memory device according to claim 11, wherein when repeating slimming of the fourth mask layer and etching of the one pair of first and second insulating layers, processing a plurality of pairs of first and second insulating layers in a staircase shape to overlap the second step portion; and when repeating slimming of the third mask layer and etching of the one pair of first and second insulating layers, processing a plurality of pairs of first and second insulating layers in a staircase shape to overlap the second step portion successively formed.

13. The method of manufacturing a semiconductor memory device according to claim 12, wherein the plurality of second step surfaces is formed in the second step portion including:

several second step surfaces arranged in a distributed manner in the second step portion and having a shape in which a central part protrudes;

one or several second step surfaces disposed in a vicinity of lowermost stair of the second step portion, the second step surface extending substantially linearly; and one or several second step surfaces disposed between the lowermost stair and an uppermost stair of the second step portion, the second step surface extending substantially linearly.

14. The method of manufacturing a semiconductor memory device according to claim 1, wherein the first stopper layer is a semiconductor layer or a metal layer.

15. The method of manufacturing a semiconductor memory device according to claim 14, wherein the first stopper layer contains at least one of amorphous silicon and polysilicon.

16. The method of manufacturing a semiconductor memory device according to claim 14, wherein the first stopper layer contains at least one of aluminum, tungsten, and platinum.

* * * * *